(12) United States Patent
Vielemeyer

(10) Patent No.: US 9,525,044 B2
(45) Date of Patent: Dec. 20, 2016

(54) METHOD OF MANUFACTURING A SPACER SUPPORTED LATERAL CHANNEL FET

(71) Applicant: Infineon Technologies Austria AG, Villach (AT)

(72) Inventor: Martin Vielemeyer, Villach (AT)

(73) Assignee: Infineon Technologies Austin AG, Villach (AT)

( * ) Notice: Subject to any disclaimer, the term of this patent is extended or adjusted under 35 U.S.C. 154(b) by 0 days.

(21) Appl. No.: 15/131,795

(22) Filed: Apr. 18, 2016

(65) Prior Publication Data
US 2016/0233316 A1    Aug. 11, 2016

Related U.S. Application Data

(62) Division of application No. 14/068,494, filed on Oct. 31, 2013, now Pat. No. 9,324,802.

(51) Int. Cl.
| | |
|---|---|
| *H01L 21/336* | (2006.01) |
| *H01L 21/82* | (2006.01) |
| *H01L 21/332* | (2006.01) |
| *H01L 29/66* | (2006.01) |
| *H01L 29/20* | (2006.01) |
| *H01L 29/10* | (2006.01) |
| *H01L 29/40* | (2006.01) |

(52) U.S. Cl.
CPC ..... *H01L 29/66727* (2013.01); *H01L 29/1095* (2013.01); *H01L 29/2003* (2013.01); *H01L 29/404* (2013.01); *H01L 29/407* (2013.01); *H01L 29/66522* (2013.01)

(58) Field of Classification Search
CPC ........ H01L 29/778; H01L 29/10; H01L 29/40; H01L 29/78; H01L 29/66; H01L 21/336; H01L 21/82

USPC ........... 257/194, 328–334, E21.21, E21.41,257/E21.345, E29.267; 438/237, 268–270, 329, 438/133–135

See application file for complete search history.

(56) References Cited

U.S. PATENT DOCUMENTS

| | | | |
|---|---|---|---|
| 2007/0138544 A1* | 6/2007 | Hirler ................... | H01L 29/404 257/330 |
| 2008/0073707 A1* | 3/2008 | Darwish ............... | H01L 29/407 257/330 |
| 2008/0099837 A1* | 5/2008 | Akiyama ............ | H01L 29/0623 257/341 |

(Continued)

*Primary Examiner* — Yuanda Zhang
*Assistant Examiner* — Sheikh Maruf
(74) *Attorney, Agent, or Firm* — Murphy, Bilak & Homiller, PLLC

(57) ABSTRACT

A semiconductor device is manufactured by forming a plurality of trenches extending into a semiconductor material from a first main surface of the semiconductor material to form mesas of semiconductor material between the trenches. A trench fill material is disposed in the trenches, the trench fill material extending above the first main surface of the semiconductor material. Sacrificial spacers are formed on the semiconductor material adjacent opposing sides of the trench fill material, and gate electrodes are formed on the first main surface of the semiconductor material adjacent the sacrificial spacers. The gate electrodes have the same alignment with respect to the trenches and define lateral channel regions in the mesas under the gate electrodes. The sacrificial spacers are removed after formation of the gate electrodes. Source regions are formed in a region of the mesas, and a drain region is formed spaced apart from the source regions.

14 Claims, 48 Drawing Sheets

(56) References Cited

U.S. PATENT DOCUMENTS

| | | | |
|---|---|---|---|
| 2008/0230833 A1* | 9/2008 | Zundel | H01L 29/0878 257/330 |
| 2009/0152624 A1* | 6/2009 | Hiller | H01L 29/0615 257/330 |
| 2010/0078707 A1* | 4/2010 | Haeberlen | H01L 29/7813 257/328 |
| 2010/0084706 A1 | 4/2010 | Kocon | |
| 2010/0301410 A1* | 12/2010 | Hirler | H01L 29/7813 257/334 |
| 2012/0007176 A1 | 1/2012 | Kadow et al. | |
| 2012/0018798 A1* | 1/2012 | Mauder | H01L 29/063 257/328 |
| 2012/0037922 A1* | 2/2012 | Kono | H01L 21/0465 257/77 |
| 2012/0286355 A1* | 11/2012 | Mauder | H01L 21/0228 257/330 |
| 2014/0042535 A1* | 2/2014 | Darwish | H01L 29/4236 257/334 |
| 2014/0252463 A1* | 9/2014 | Darwish | H01L 29/7806 257/330 |
| 2014/0374824 A1* | 12/2014 | Calafut | H01L 27/0629 257/334 |

\* cited by examiner

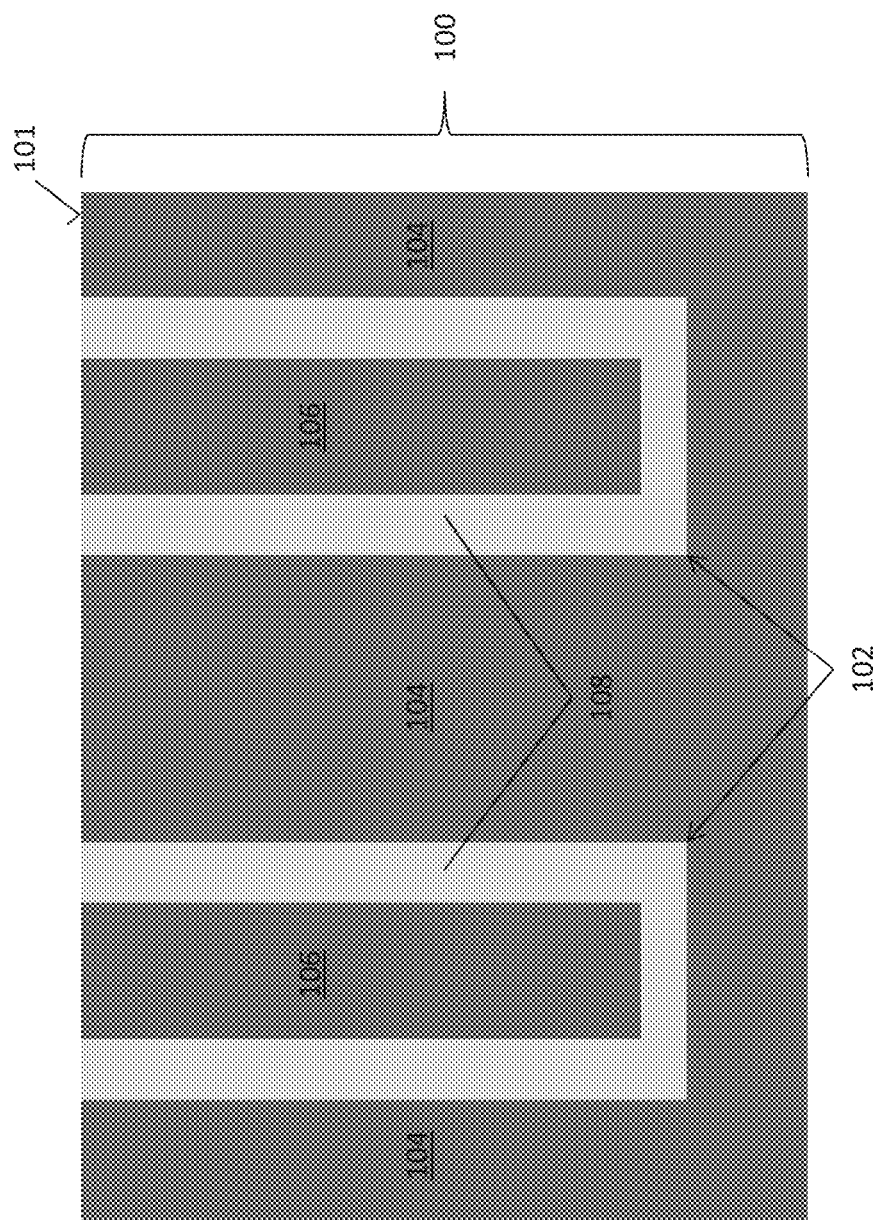

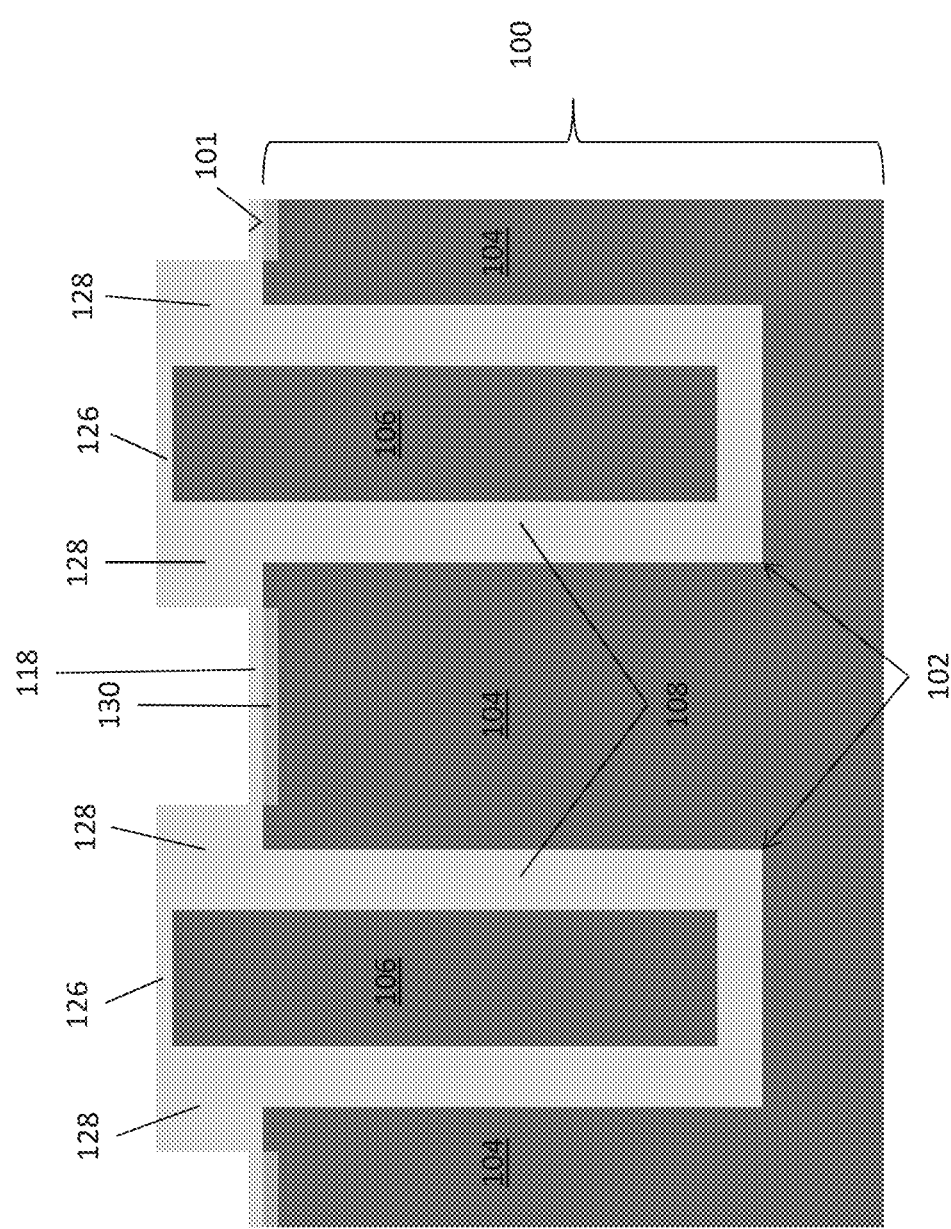

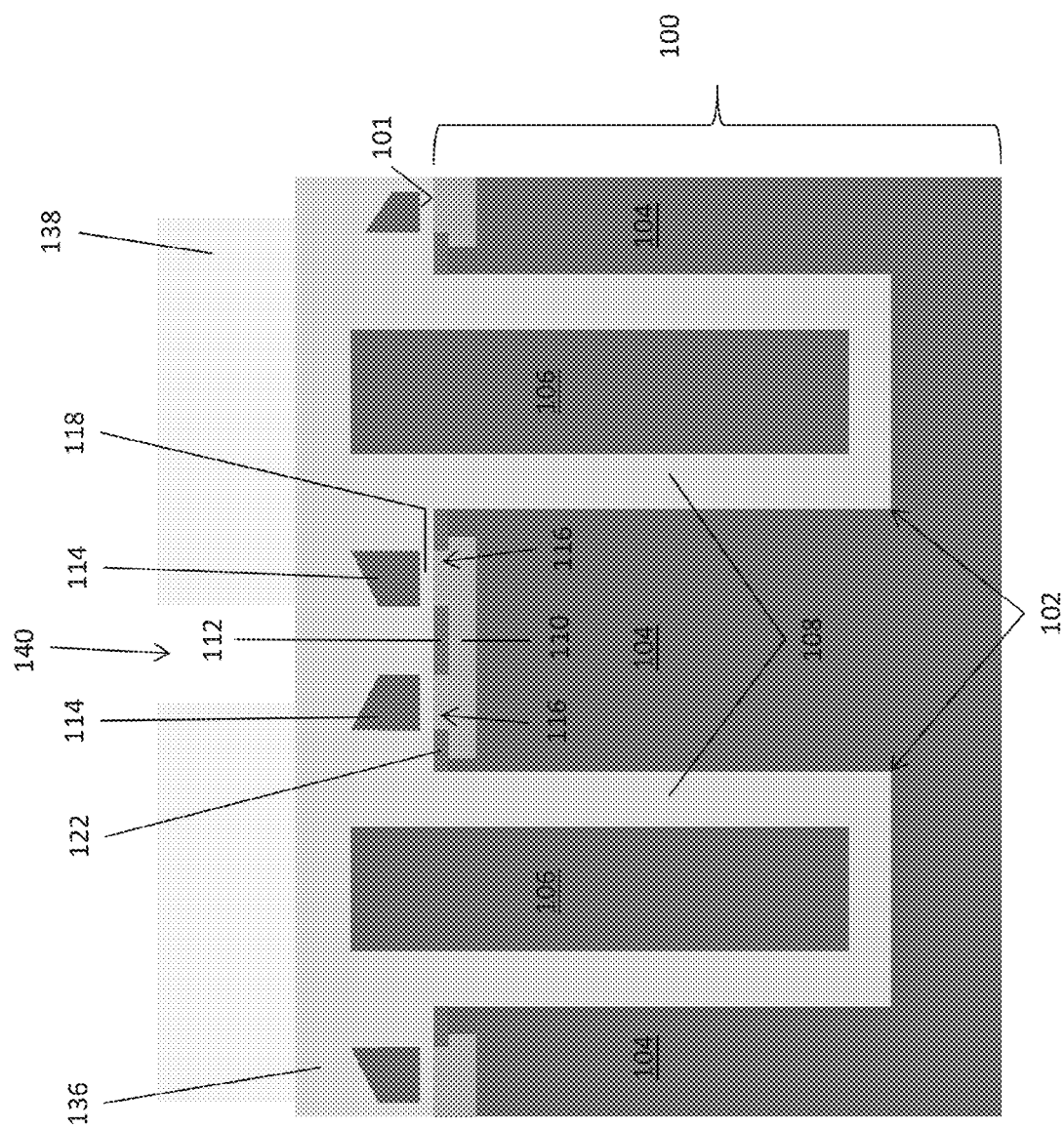

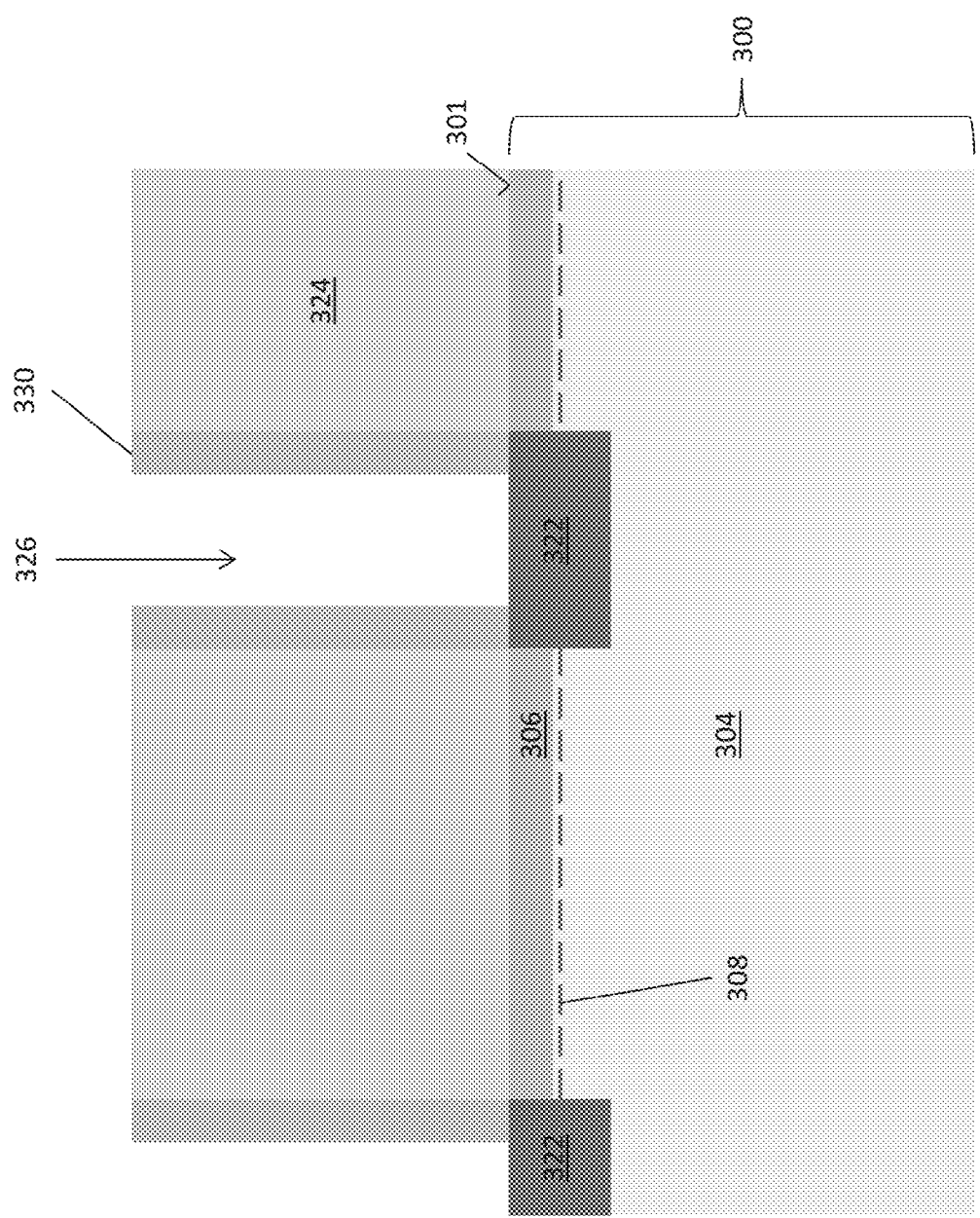

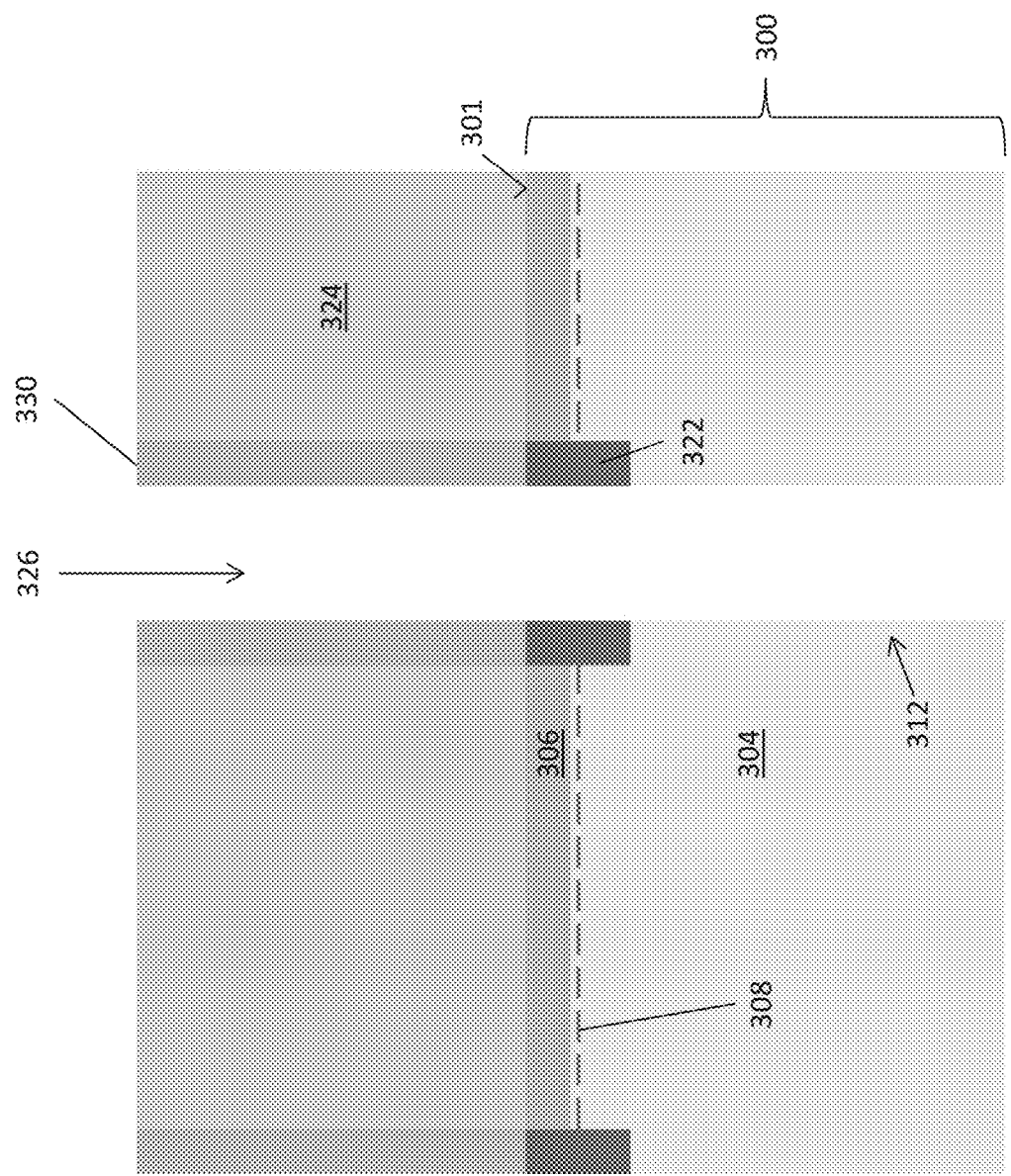

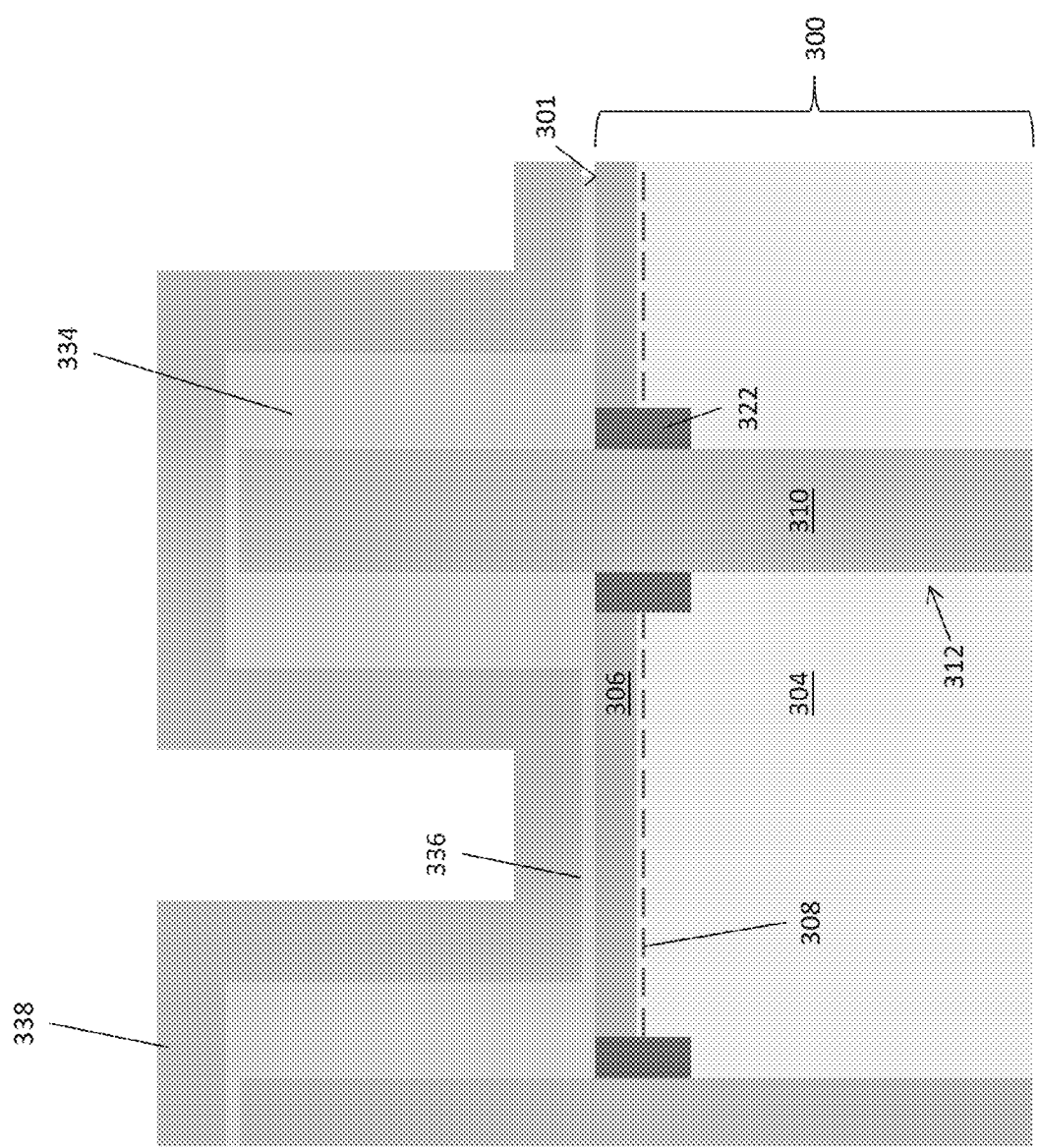

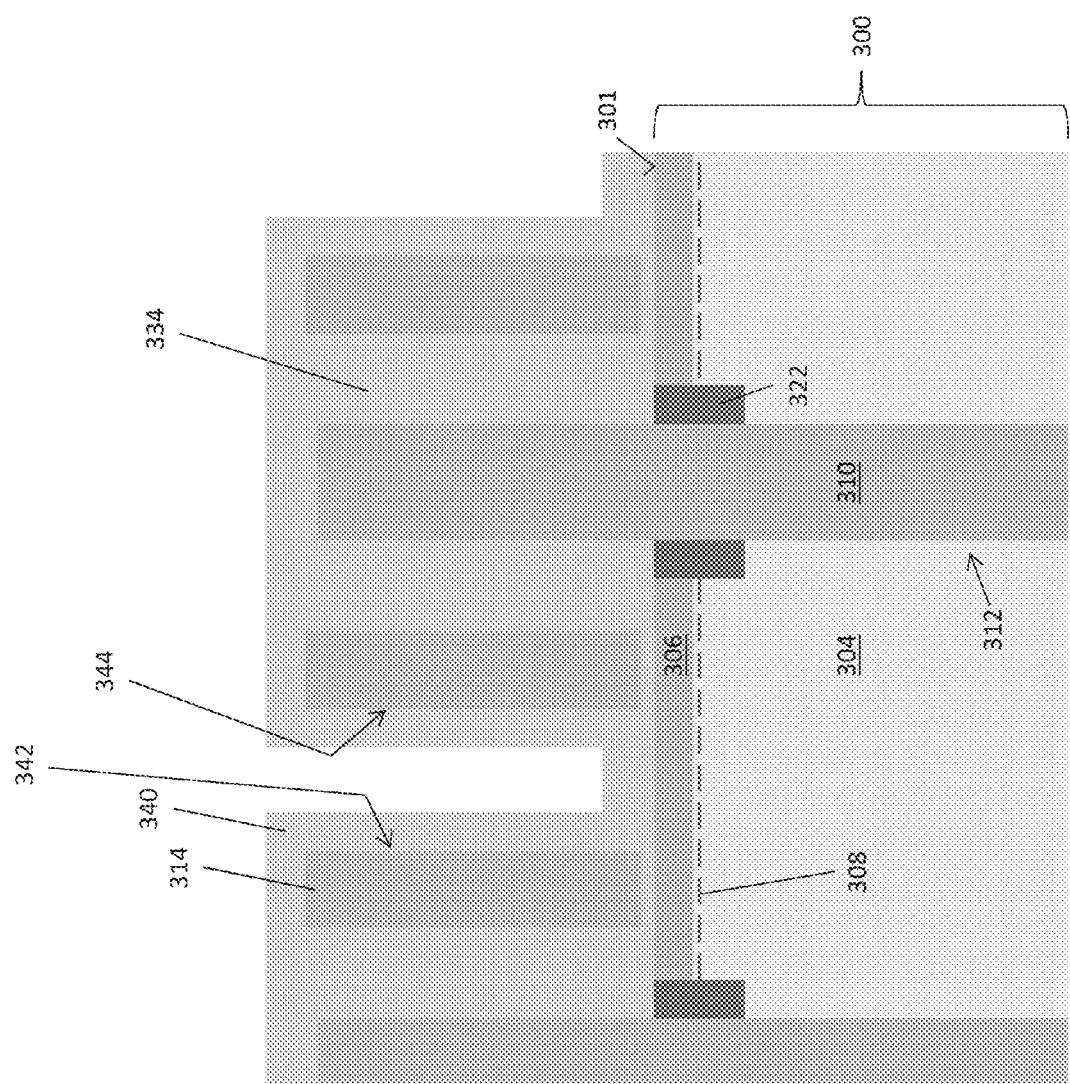

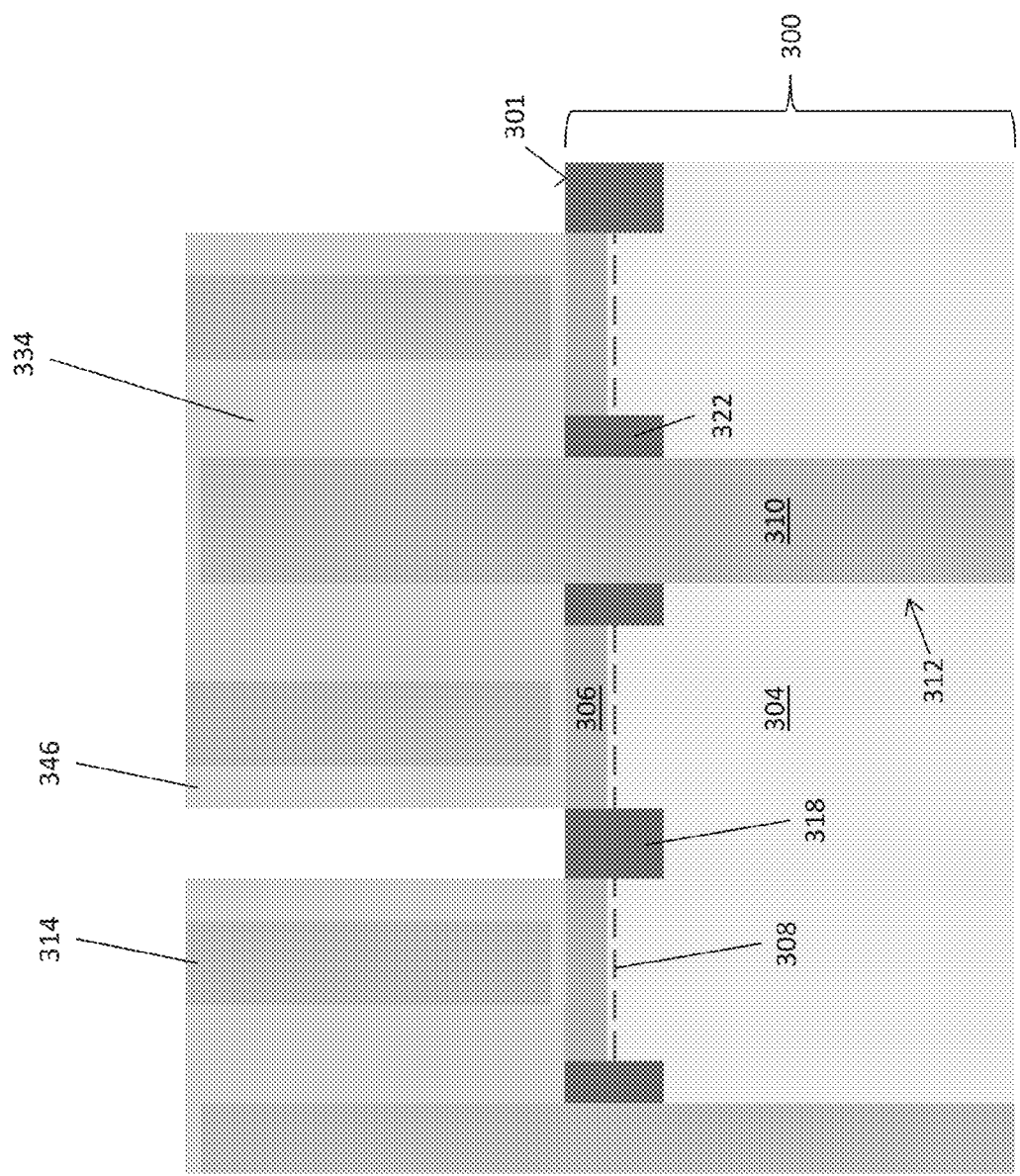

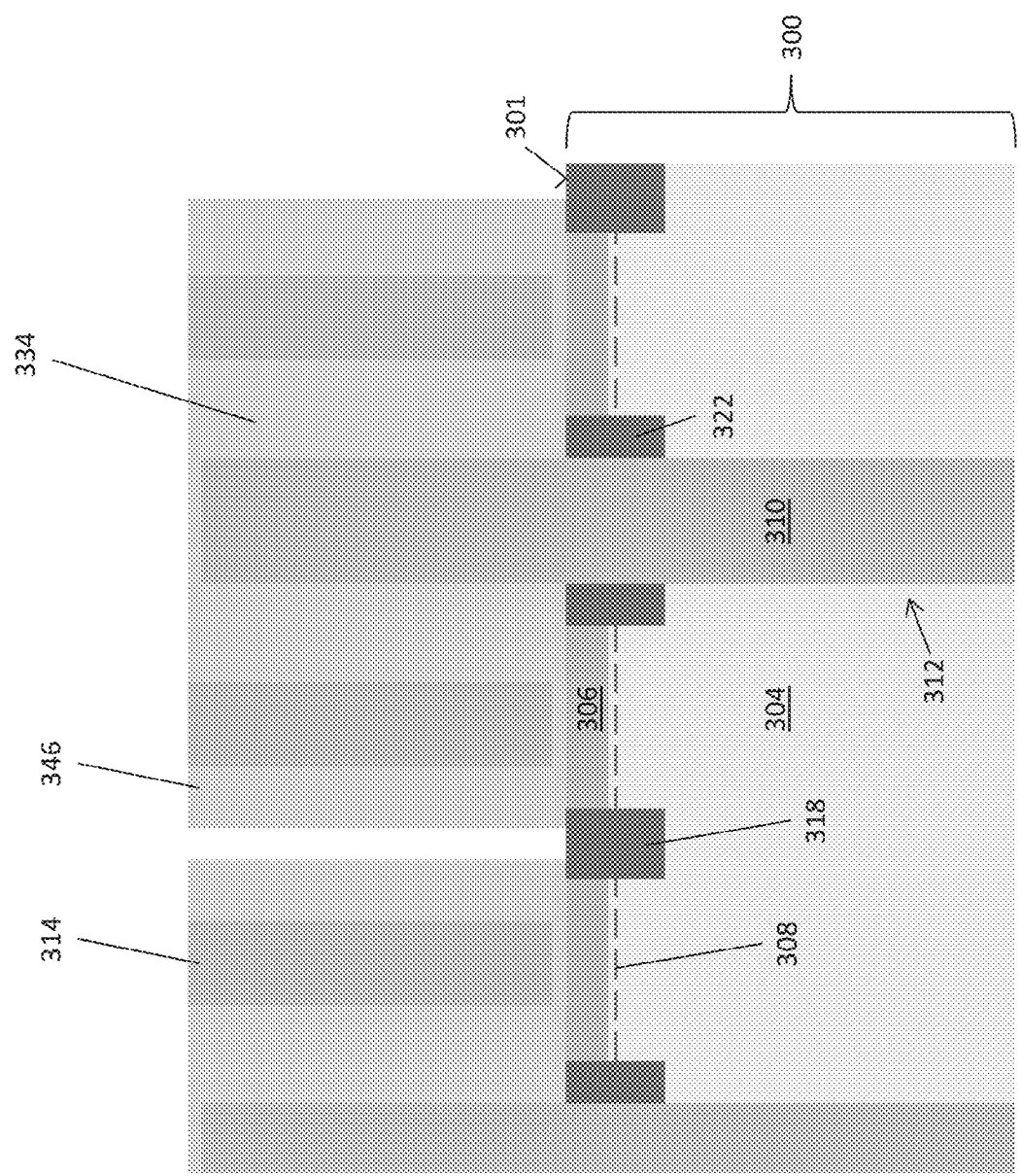

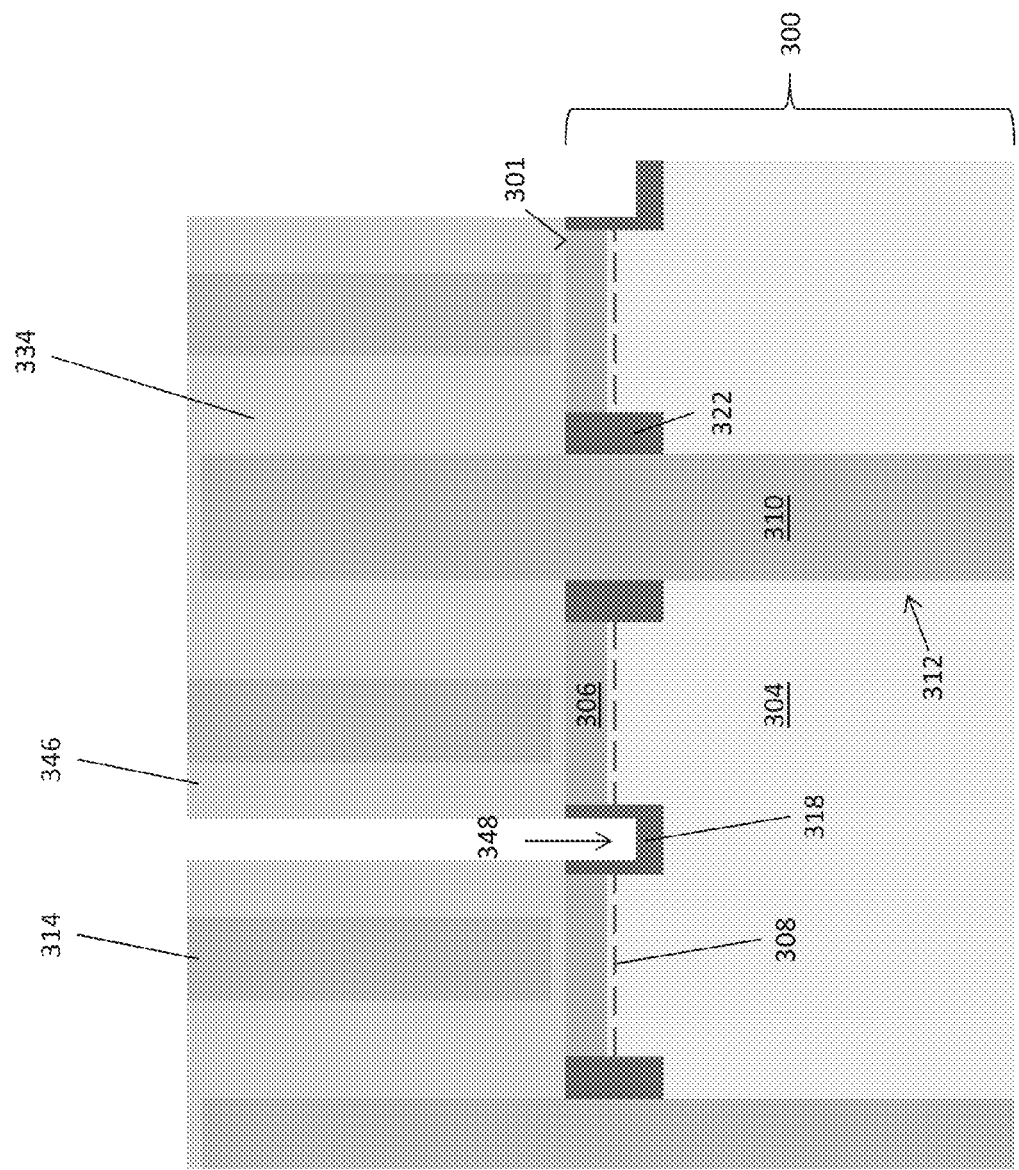

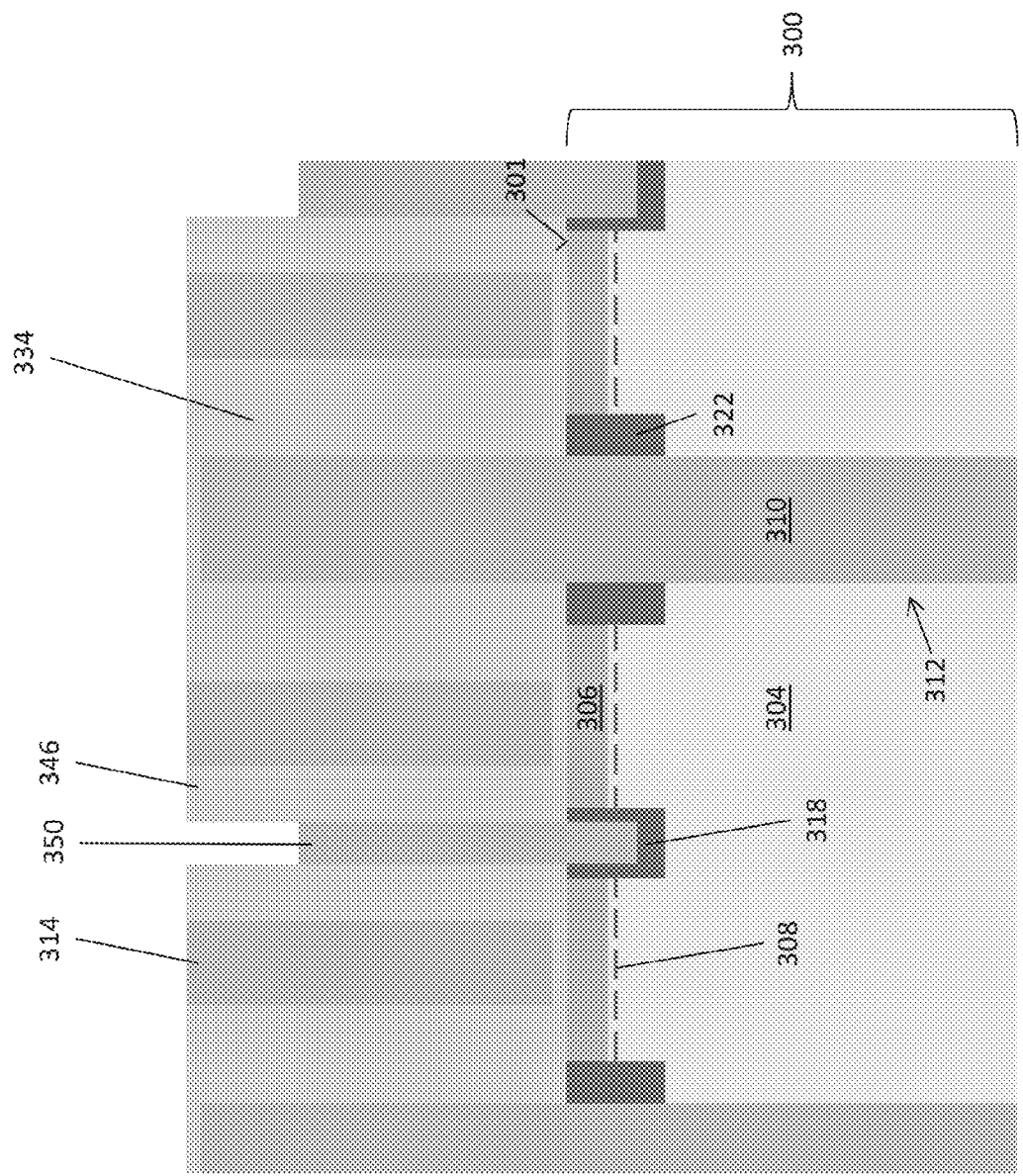

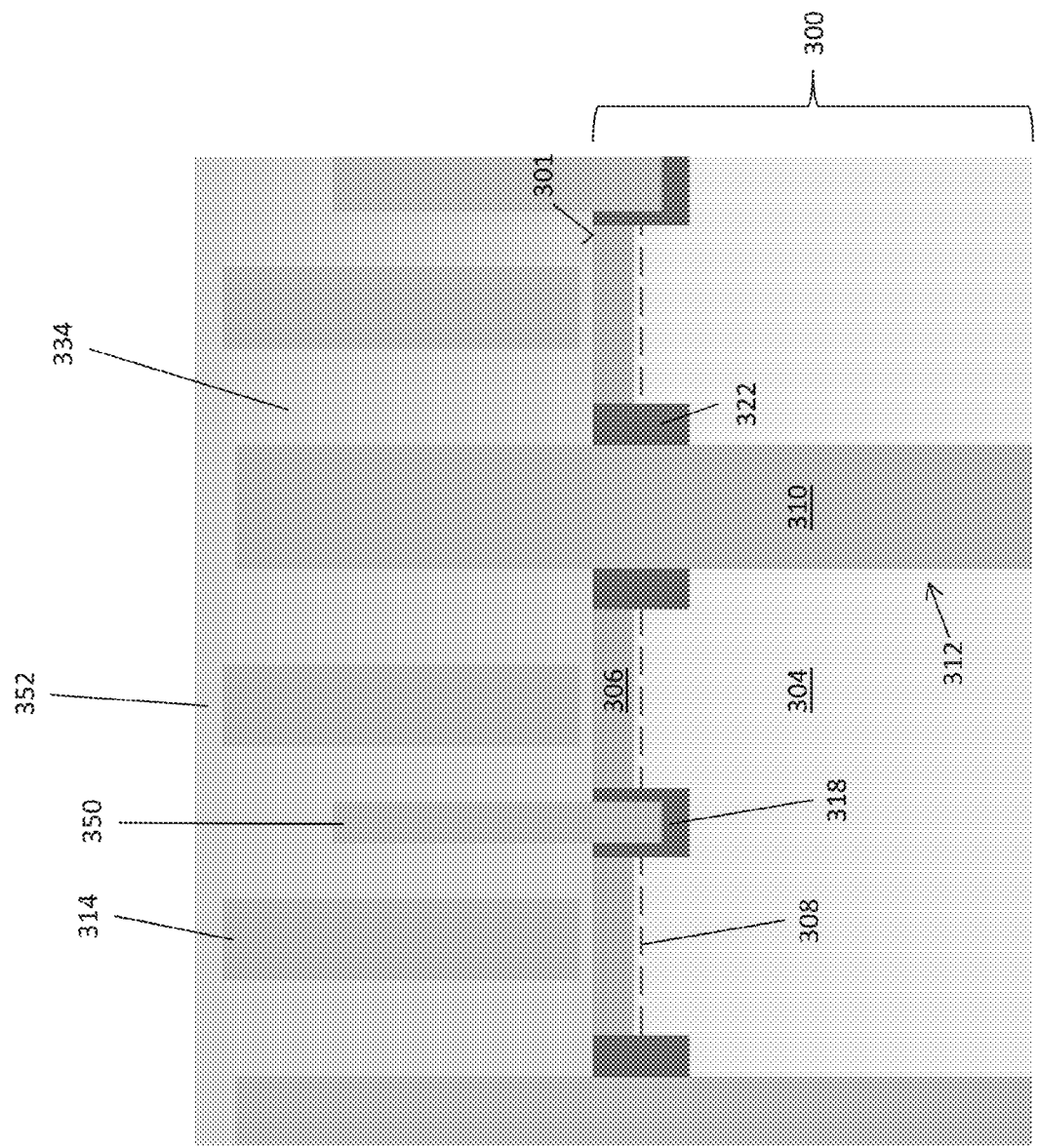

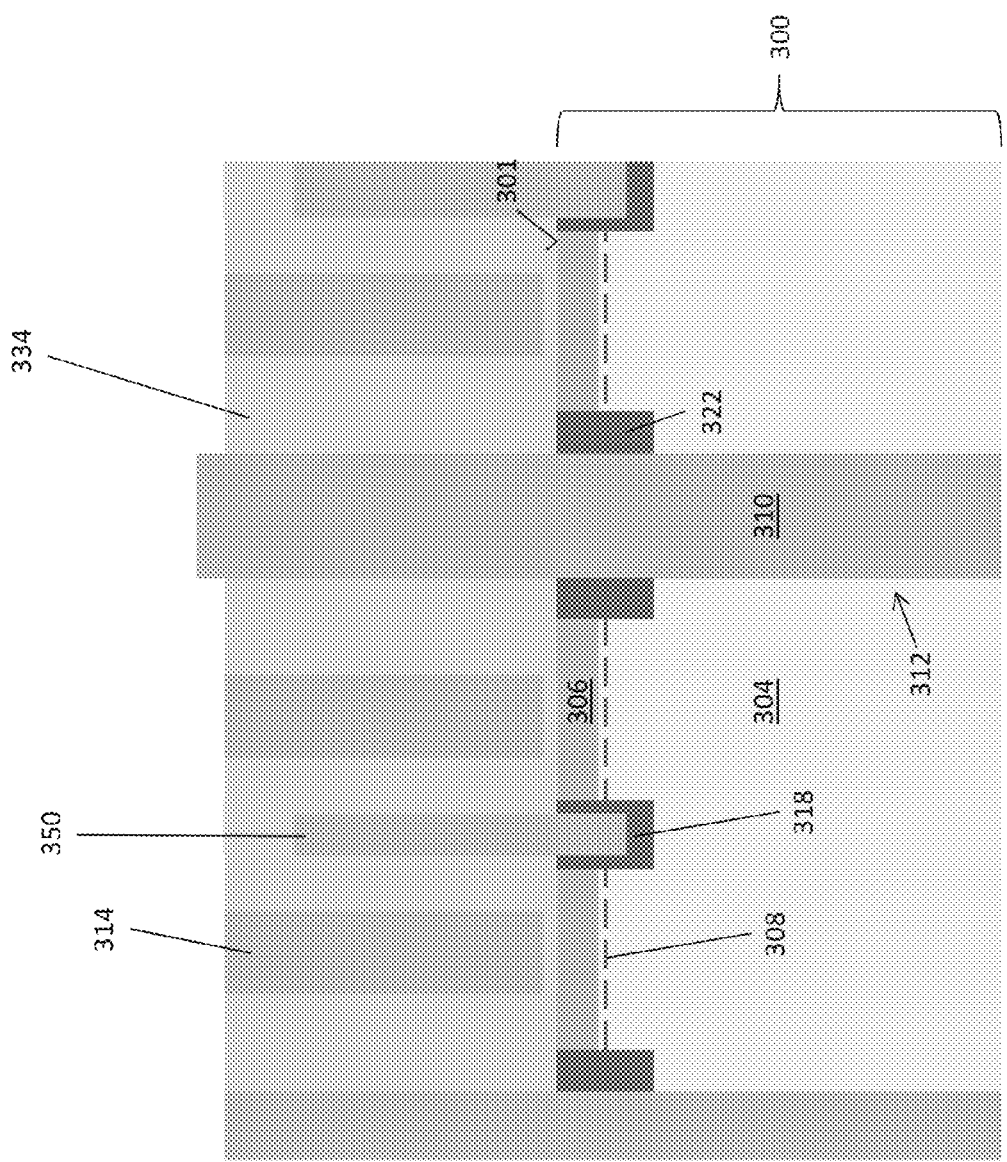

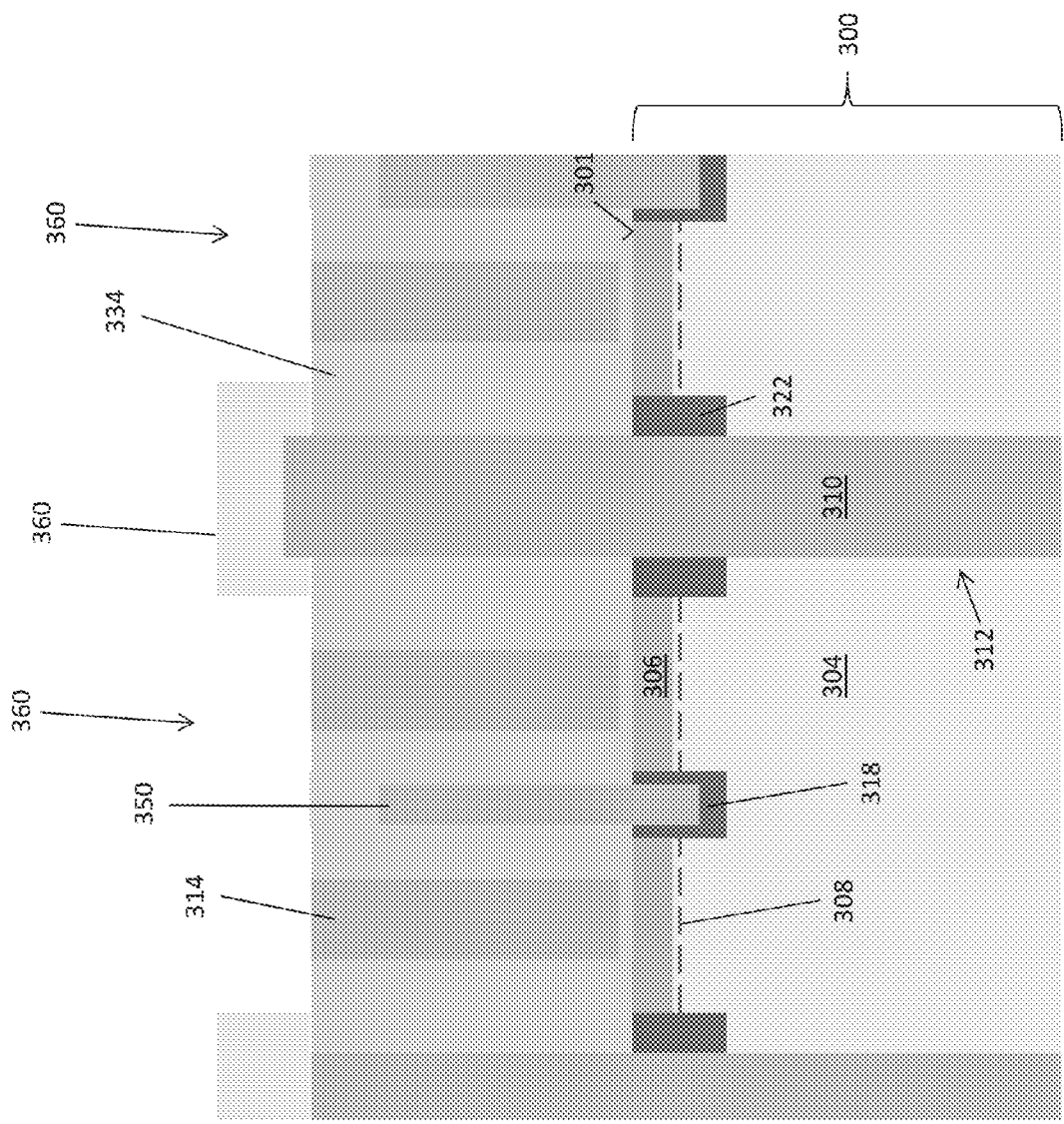

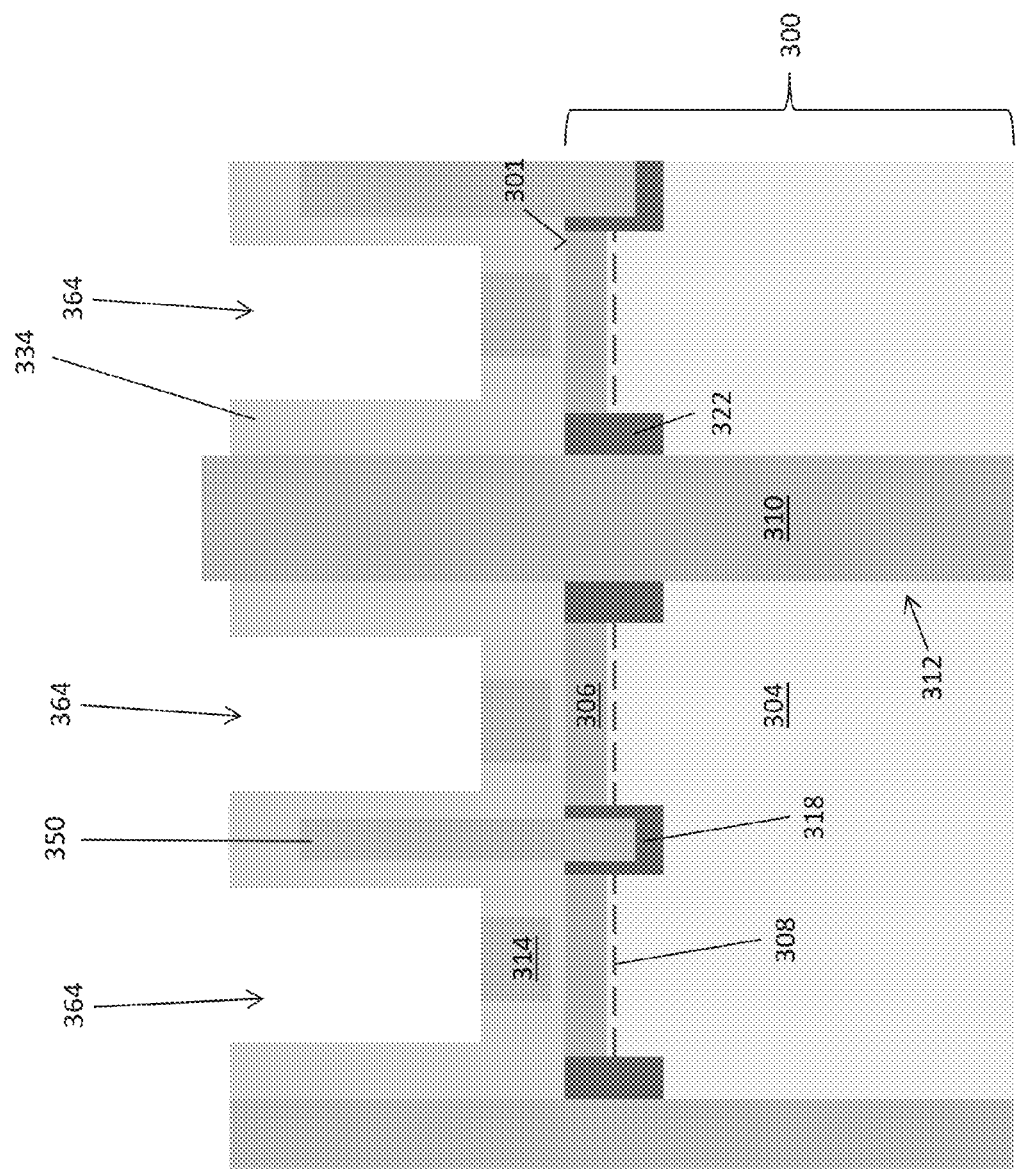

METHOD OF MANUFACTURING A SPACER SUPPORTED LATERAL CHANNEL FET

TECHNICAL FIELD

The instant application relates to semiconductor transistors, and more particularly to semiconductor transistors with a lateral channel.

BACKGROUND

Higher voltage class MOSFETs (metal oxide semiconductor field effect transistors) e.g. 25V MOSFETs require a drift region of significant length. To save area, the drift region can also be buried in the substrate in a vertical type arrangement rather than only on the surface. If the rest of the device is still lateral i.e. the device has a lateral channel region, the lateral features of the device such as body, source and also the alignment determine the minimum pitch of the device. With III-nitride devices such as GaN-based transistors, a higher specific breakdown voltage is provided than Si, allowing a shrink of the devices. Most mainstream GaN-based devices are so-called High Electron Mobility Transistors (HEMTs). For lower breakdown voltage FETs e.g. in the double digit voltage range, the material system theoretically allows for pitches smaller than the ones feasible in production. Because of this a better process is needed.

SUMMARY

According to an embodiment of a semiconductor device, the semiconductor device comprises a semiconductor material and a plurality of trenches extending into the semiconductor material from a first main surface of the semiconductor material to form mesas of semiconductor material between the trenches. The semiconductor device further comprises a field plate in the trenches, a body region in the mesas, a source region in contact with the body region in the mesas, and a gate electrode on the first main surface of the semiconductor material and defining a lateral channel region in each of the body regions under the gate electrodes. A drain region is at a second main surface of the semiconductor material opposing the first main surface. The gate electrodes adjacent opposing sides of the same field plate have the same alignment with respect to that field plate.

According to an embodiment of a method of manufacturing a semiconductor device, the method comprises: forming a plurality of trenches extending into a semiconductor material from a first main surface of the semiconductor material to form mesas of semiconductor material between the trenches; disposing a trench fill material in the trenches, the trench fill material extending above the first main surface of the semiconductor material; forming sacrificial spacers on the semiconductor material adjacent opposing sides of the trench fill material; forming gate electrodes on the first main surface of the semiconductor material adjacent the sacrificial spacers, the gate electrodes having the same alignment with respect to the trenches, the gate electrodes defining lateral channel regions in the mesas under the gate electrodes; removing the sacrificial spacers after formation of the gate electrodes; forming source regions in a region of the mesas; and forming a drain region at a second main surface of the semiconductor material opposing the first main surface.

According to another embodiment of a semiconductor device, the semiconductor device comprises a III-nitride semiconductor material and a plurality of trenches extending into the III-nitride semiconductor material from a first main surface of the semiconductor material to form mesas of III-nitride semiconductor material between the trenches. The semiconductor device further comprises a source region in each of the mesas, a lateral two-dimensional charge carrier gas channel region adjacent the source region in the mesas, a gate electrode on the first main surface of the semiconductor material over the lateral channel region in the mesas, and a drain region. The gate electrodes adjacent opposing sides of the same field plate have the same alignment with respect to that field plate.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 2A through 2L illustrate respective partial cross-sectional views during different stages of a method of manufacturing the semiconductor device of FIG. 1.

DETAILED DESCRIPTION

According to embodiments described herein, self-aligned processes are used instead of lithography processes in one or more instances to manufacture a transistor having a lateral channel region and self-aligned gate electrodes and device regions. A geometry feasible for using spacer techniques is generated and utilized to achieve a pitch far below those achievable via means of lithography. A smaller pitch yields a lower resistance per area and allows for MOSFETs a denser field plate structure, resulting in better compensation by the field plate. For low voltage HEMTs, a smaller channel length per cell can be realized so that more channels are provided, each of them having a smaller resistance. The embodiments described herein apply to both silicon and compound semiconductors.

Figure 1:
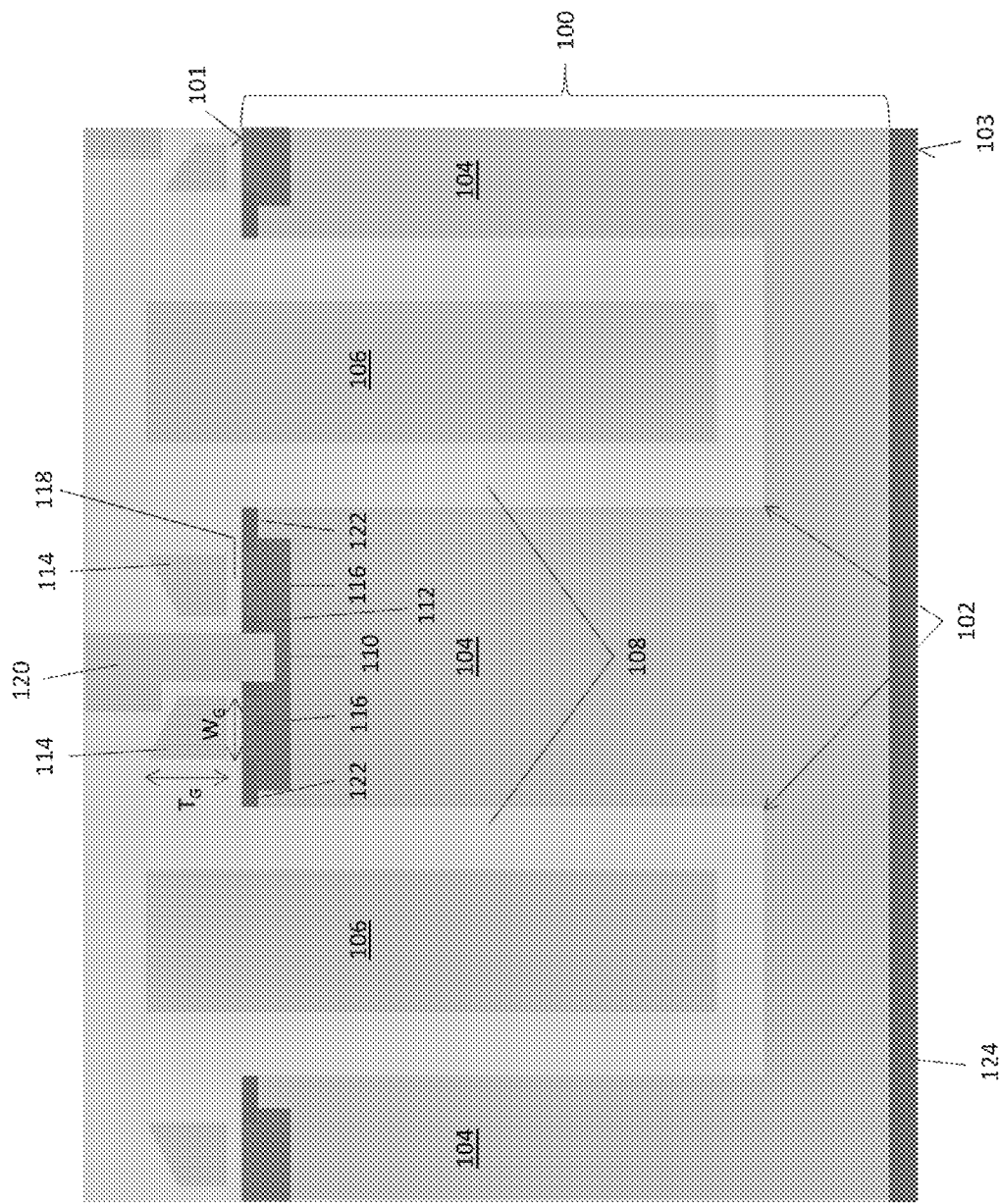
FIG. 1 illustrates a partial cross-sectional view of an embodiment of a semiconductor device having self-aligned electrodes and device regions.

FIG. 1 illustrates a cross-sectional view of an embodiment of a semiconductor device including a semiconductor material 100. The semiconductor material 100 can be a semiconductor substrate such as a silicon wafer, and can include one or more epitaxial layers. The semiconductor device is a MOSFET (metal oxide semiconductor field effect transistor) according to the embodiment shown in FIG. 1. The MOSFET has a low resistance per area and a dense field plate structure.

More particularly, trenches 102 extend into the semiconductor material 100 from a first main surface 101 of the semiconductor material 100 to form mesas 104 of semiconductor material between the trenches 102. A field plate 106 is disposed in each of the trenches 102. The field plates 106 are insulated from the surrounding semiconductor material 100 by a dielectric 108 such as silicon oxide. The field plates 106 extend above the first main surface 101 of the semiconductor material 100 according to this embodiment. In other embodiments, the field plates 106 can be etched back to below the main surface 101.

A body region 110 is formed in the mesas 104 and a source region 112 is in contact with the body region 110 in the mesas 104. A gate electrode 114 is disposed on the first main surface 101 of the semiconductor material 100 and defines a lateral channel region 116 in each of the body regions 110 under the gate electrodes 114. The gate electrodes 114 are insulated from the underlying semiconductor material 100 by a gate dielectric 118. The source regions 112 are spaced apart from the trenches 102 in the center of the mesas 104 and the body region 110 is continuous between adjacent gate electrodes 114 on the same mesa 104 according to this embodiment. Further according to this embodiment, a source electrode 120 extends between adjacent ones of the gate electrodes 114 into the mesas 104 and a doped region 122 of the same conductivity type as the source region 112 can be formed adjacent the trenches 102 in each of the mesas 104 and spaced apart from the source region 112 by the body region 110 in the same mesa 104. The epitaxial layer 104 has the conductivity type, so layer 122 is optional. The source electrode 120 extends into the semiconductor material 100 in contact with the body region 110 (usually over an implanted contact region, which is not shown here for ease of illustration) and the source region 112 of the mesas 104.

When a sufficient voltage is applied to the gate electrodes 114 to turn the transistor device on, current flows laterally from the center source region 112 in each mesa 104, through the lateral channel region 116 and into the doped region 122 of the same conductivity type as the source region 112 disposed adjacent the trenches 102. The current then flows vertically downward along the trenches 102, eventually spreading out over the width of a drift region of the semiconductor material 100 and entering the drain region 124 which is disposed at a second main surface 103 of the semiconductor material 100 opposing the first main surface 101.

Each of the gate electrodes 114 has a maximum thickness ($T_G$) measured in a direction normal to the first main surface 101 of the semiconductor material 100 and a width ($W_G$) measured along the channel region 116. In one embodiment, the maximum thickness $T_G$ of the gate electrodes 114 is greater than the width $W_G$. The gate electrodes 114 adjacent opposing sides of the same field plate 106 have the same alignment with respect to that field plate 106. Such gate dimensions and uniform gate alignment are realized by using certain self-aligned processes instead of lithography processes to manufacture the transistor device.

FIGS. 2A through 2L illustrate an embodiment of manufacturing the semiconductor device of FIG. 1. Standard semiconductor processing such as etching, depositing, implanting, masking, etc. can be used to perform the steps described next.

FIG. 2A shows the semiconductor material 100 after a plurality of trenches 102 are etched into the semiconductor material 100 from the first main surface 101, a dielectric material 108 is formed along the sidewalls of the trenches 102 and the first main surface 101 of the semiconductor material 100, the trenches 102 are filled with an electrically conductive material 106, and the dielectric material 108 is removed from the first main surface 101 of the semiconductor material 100. Any standard dielectric such as silicon oxide and any standard electrically conductive material such as highly doped polysilicon can be used.

Figure 2B:
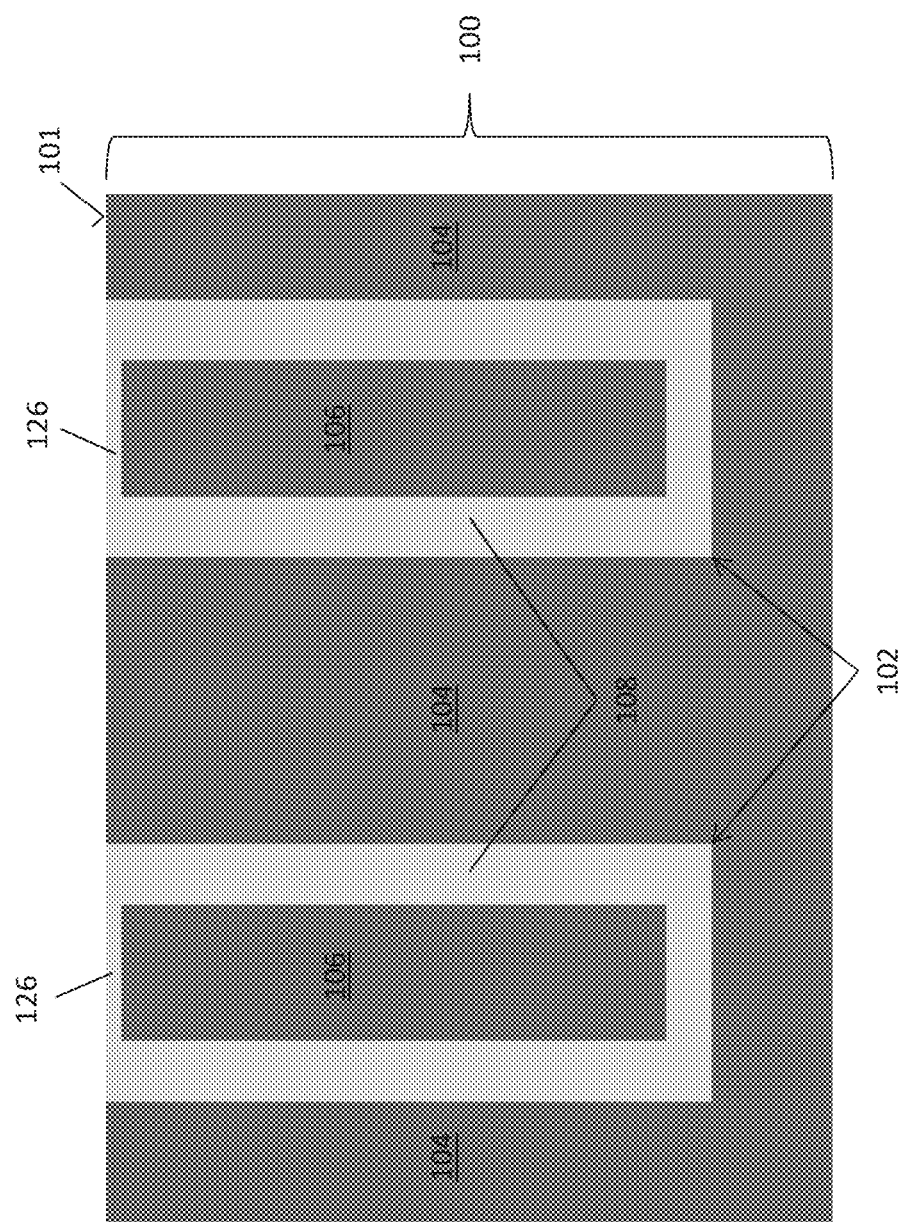

FIG. 2B shows the semiconductor material 100 after an optional trench cover process in which the top of the trenches 102 is covered with a dielectric material 126. This dielectric 126 can be formed by thermal oxidation in the case of highly doped polysilicon filling the trenches 102. Thinner or no dielectric may be on the mesas 104. For example, a wet etch e.g. by HF-etching of the dielectric 126 in the case of oxide can remove some or all of the dielectric 126 from the mesas 104 so that the optional dielectric 126 only remains on the material 106 filling the trenches 102. The trench fill material 106 can also optionally be recessed e.g. by reactive ion etch at a state where the mesa 104 is still protected by an oxide, in the case of polysilicon filling the trenches 102. Afterwards this oxide on the mesa 104 can be removed as described above and a new oxide deposited and etched back e.g. by means of chemical mechanical polishing until it is removed from the mesa 104 but still present on the trenches 102.

Figure 2C:
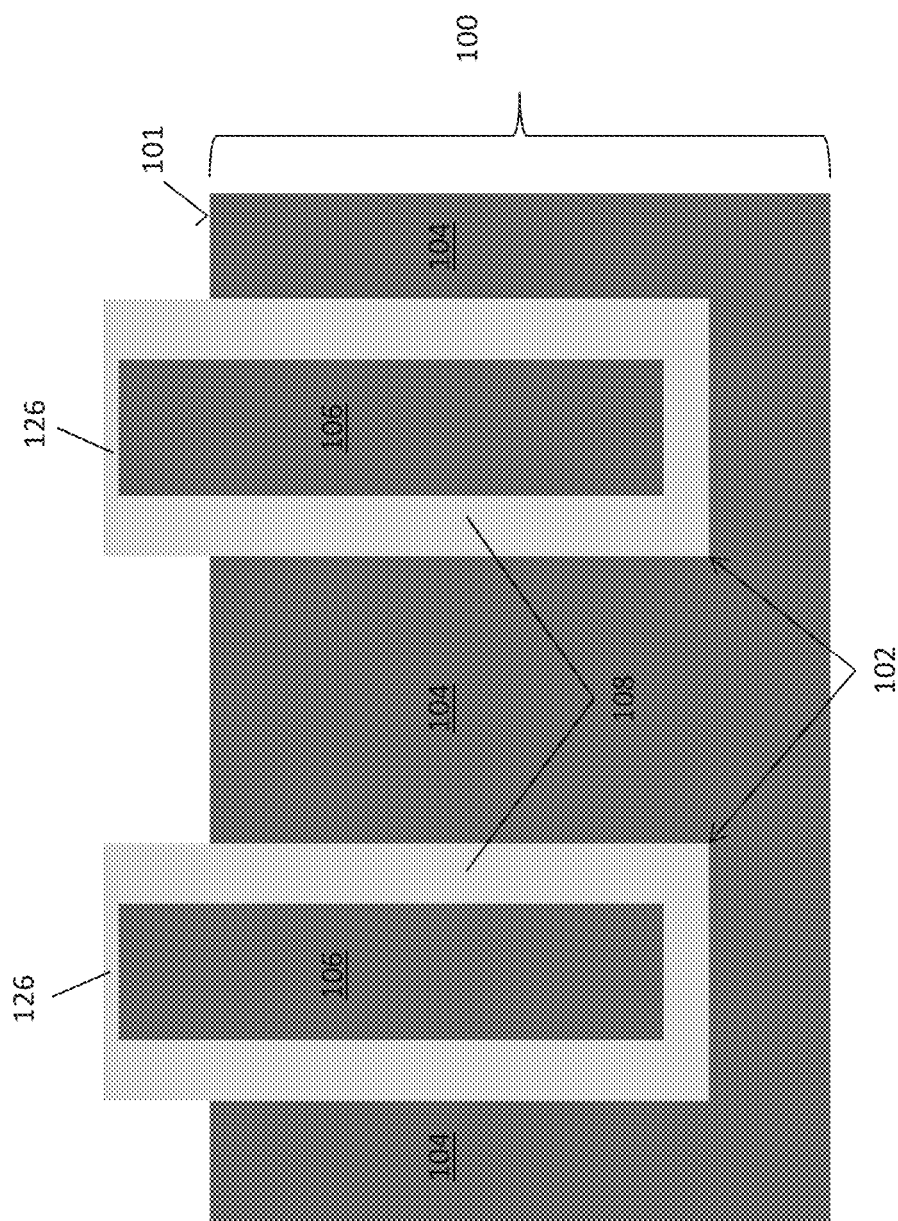

FIG. 2C shows the semiconductor material 100 after the mesas 104 are recessed. The mesas 104 can be etched highly selectively with respective to oxide in the case of the trench fill material 106 being covered with oxide 108, 126 as shown in FIG. 2B. Standard etch chemistry or RIE (reactive ion etching) can be employed. Broadly, the mesas 104 are recessed during this step so that the trench fill material 106 extends above the recessed first main surface 101 of the semiconductor material 100. Such a configuration of the trench fill material 106 allows for the formation of sacrificial spacers which can be used to form self-aligned gate electrodes and device regions of the MOSFET as described next.

Figure 2D:
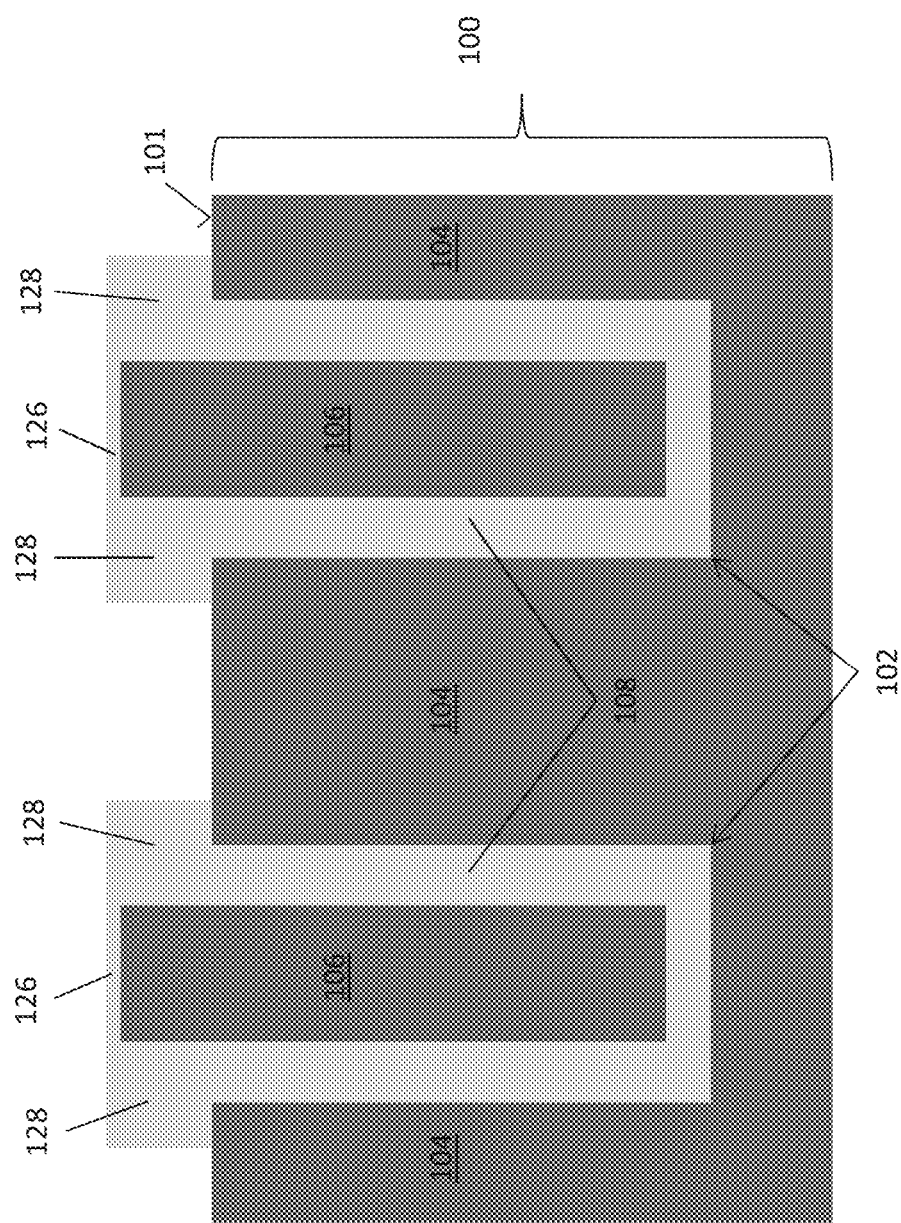

FIG. 2D shows the semiconductor material 100 after sacrificial spacers 128 are formed on the semiconductor material 100 adjacent opposing sides of the trench fill material 106. According to one embodiment, the sacrificial spacers 128 are formed by homogenously depositing a material such as tetraethyl orthosilicate (TEOS) or carbon on the structure and anisotropically etching the material to expose the mesas 104. For example, the material can be anisotropically etched by a RIE process which stops on the mesas 104. The part of the material that remains along the opposing sides of the trench fill material 106 after anisotropic etching forms the sacrificial spacers 128. A thin layer 126 of the material can remain on top side of the trench fill material 106 as shown in FIG. 2D. The sacrificial spacers 128 define the area of the body implant and one edge of the gate electrodes to be formed after gate oxidation.

Figure 2E:
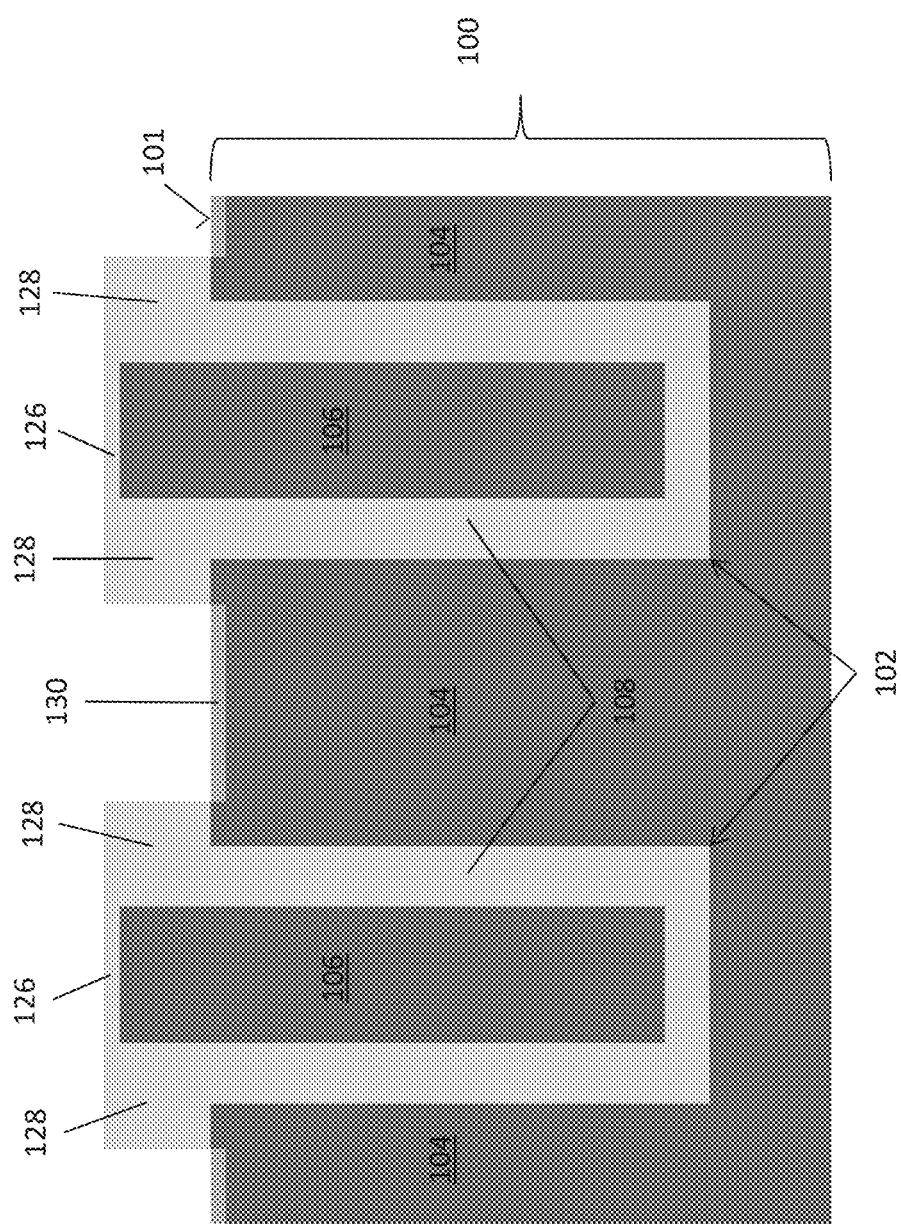

FIG. 2E shows the semiconductor material 100 after the body implant. In the case of an n-channel MOSFET, the implanted body region 130 comprises p-type dopants. In the case of a p-channel MOSFET, the implanted body region 130 comprises n-type dopants.

FIG. 2F shows the semiconductor material 100 after the gate dielectric 118 is formed on the mesas 104. The gate dielectric 118 can be formed by thermal oxidation or deposition. In some cases, thermal oxidation can be problematic in that the high temperatures needed to form a thermal oxide will drive in the body implant. If the drive in is accounted for, a standard thermal gate oxidation process can be used. Otherwise, the gate dielectric 118 can be deposited or formed prior to the body implantation.

Figure 2G:
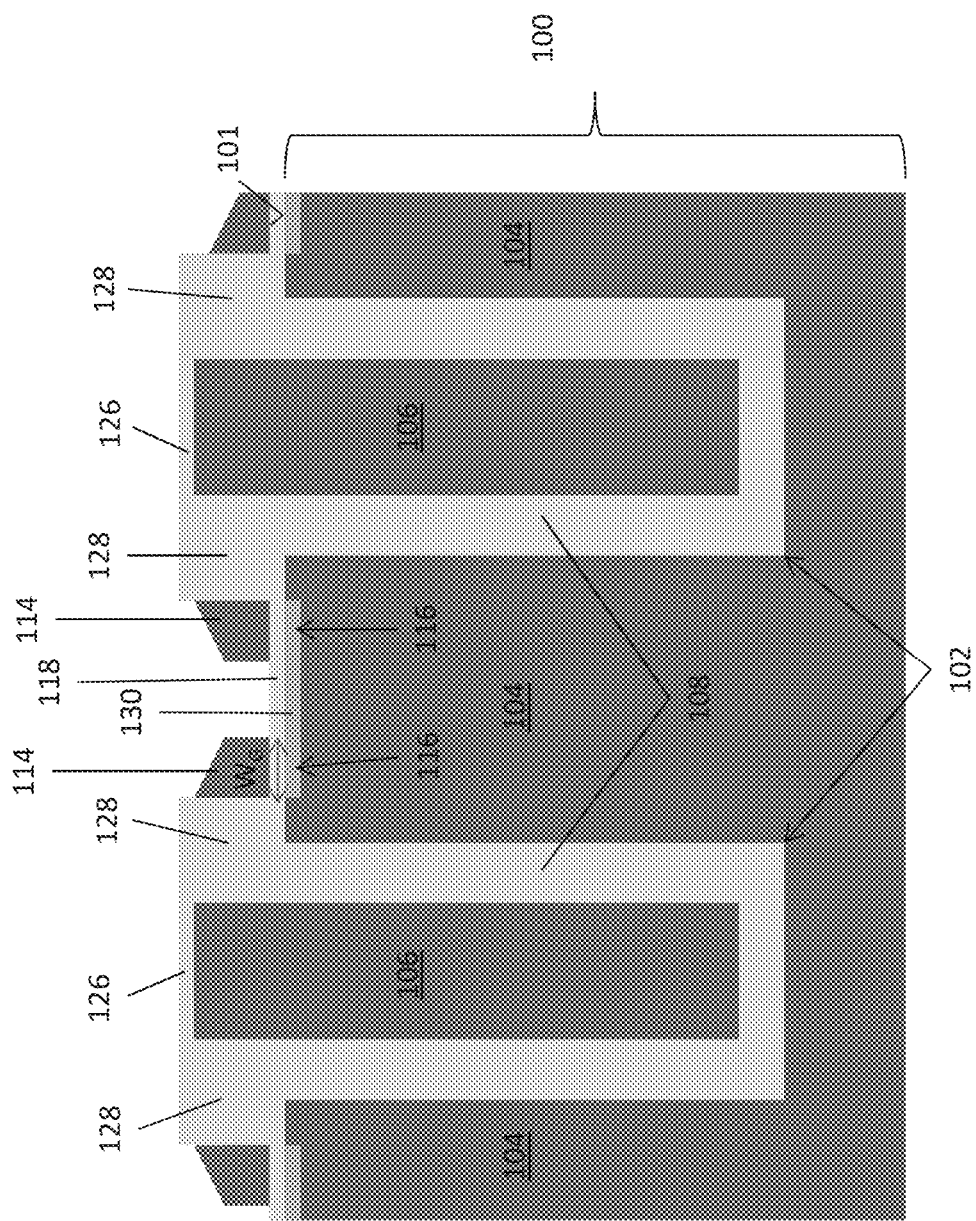

FIG. 2G shows the semiconductor material 100 after the gate electrodes 114 are formed on the recessed first main surface 101 of the semiconductor material 100 adjacent the sacrificial spacers 128. The gate electrodes 114 have the same alignment with respect to the trenches 102, and define the position of the lateral channel regions 116 in the mesas 104 under the gate electrodes 114. According to one embodiment, the gate electrodes 114 are formed by depositing an electrically conductive material such as highly doped polysilicon with a top layer of TiSi on the recessed first main surface 101 of the semiconductor material 100 after formation of the sacrificial spacers 128. The electrically conductive material is then anisotropically etched e.g. by RIE to form the gate electrodes 114. The width ($W_G$) of the gate electrodes 114 as measured in a direction along the lateral channel regions 116 corresponds to a maximum thickness of the electrically conductive material prior to anisotropic etching. For example, a 150 nm thick layer of the electrically conductive material yields gate electrodes 114 having a width of approximately 150 nm. Since anisotropic etching is not perfectly anisotropic, the gate electrodes 114 will be somewhat thinner than the thickness of the deposited electrically conductive material. The gate electrode process is self-aligned due to the use of the sacrificial spacers 128 instead of lithography, and therefore very narrow gate electrodes 114 can be formed. To save additional area, the gate electrodes 114 can be used as spacers for subsequent processing such as source implantation. The gate electrodes 114 can be made thick enough to accommodate the gate voltages applied during operation of the transistor device to offer a gate resistivity which is low enough. The edge regions (not shown) of the device can be masked to form standard edge termination structures.

Figure 2H:
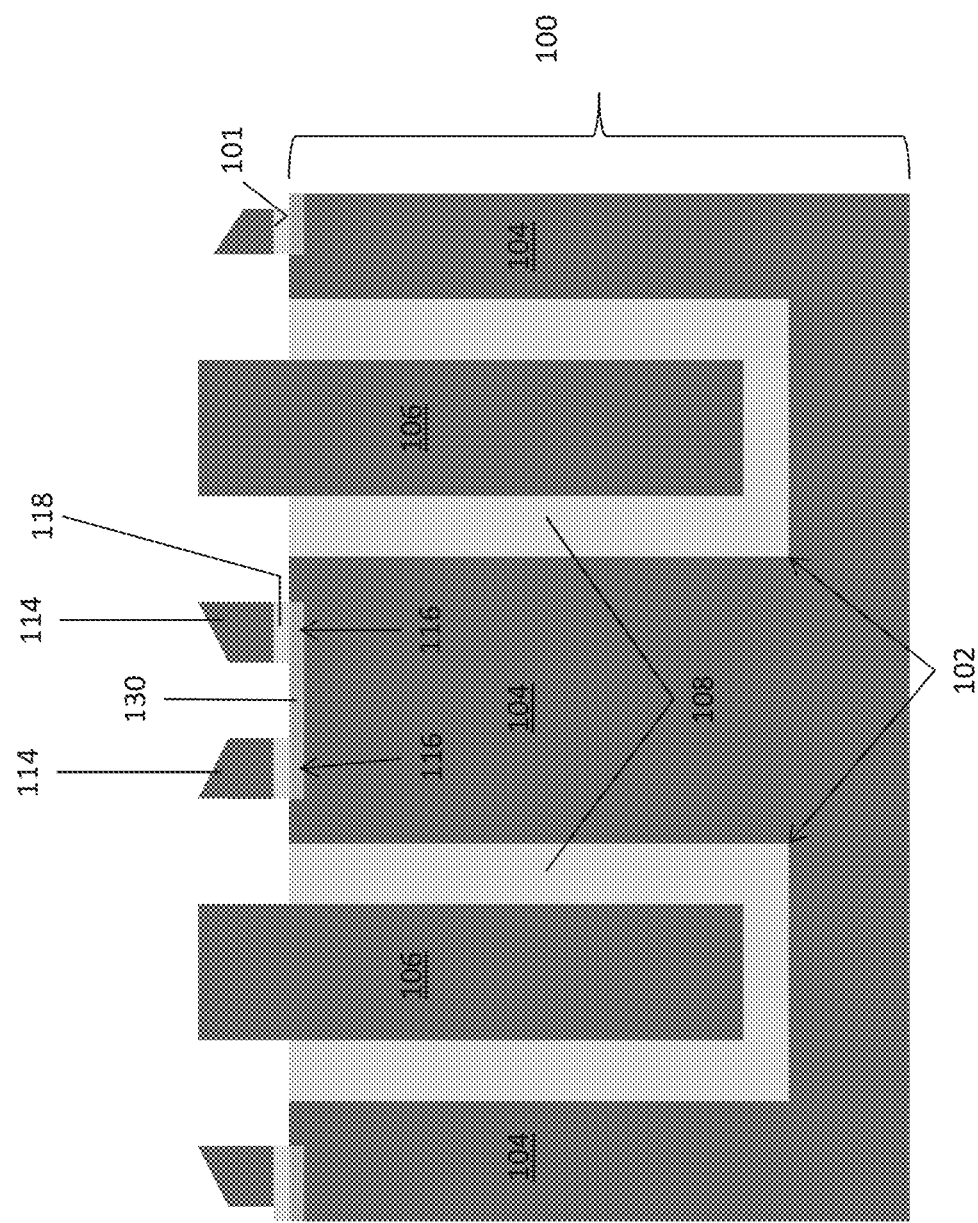

FIG. 2H shows the semiconductor material 100 after the sacrificial spacers 128 are removed and the gate dielectric material 118 unprotected by the gate electrodes 114 is removed over the mesas 104 to allow for source implantation. The gate electrodes 114 align the selective etch of the gate dielectric 118 to expose the implant regions of the mesa 104. Any standard etch process can be employed, and depends on the type of spacer material (e.g. TEOS) used.

Figure 2I:
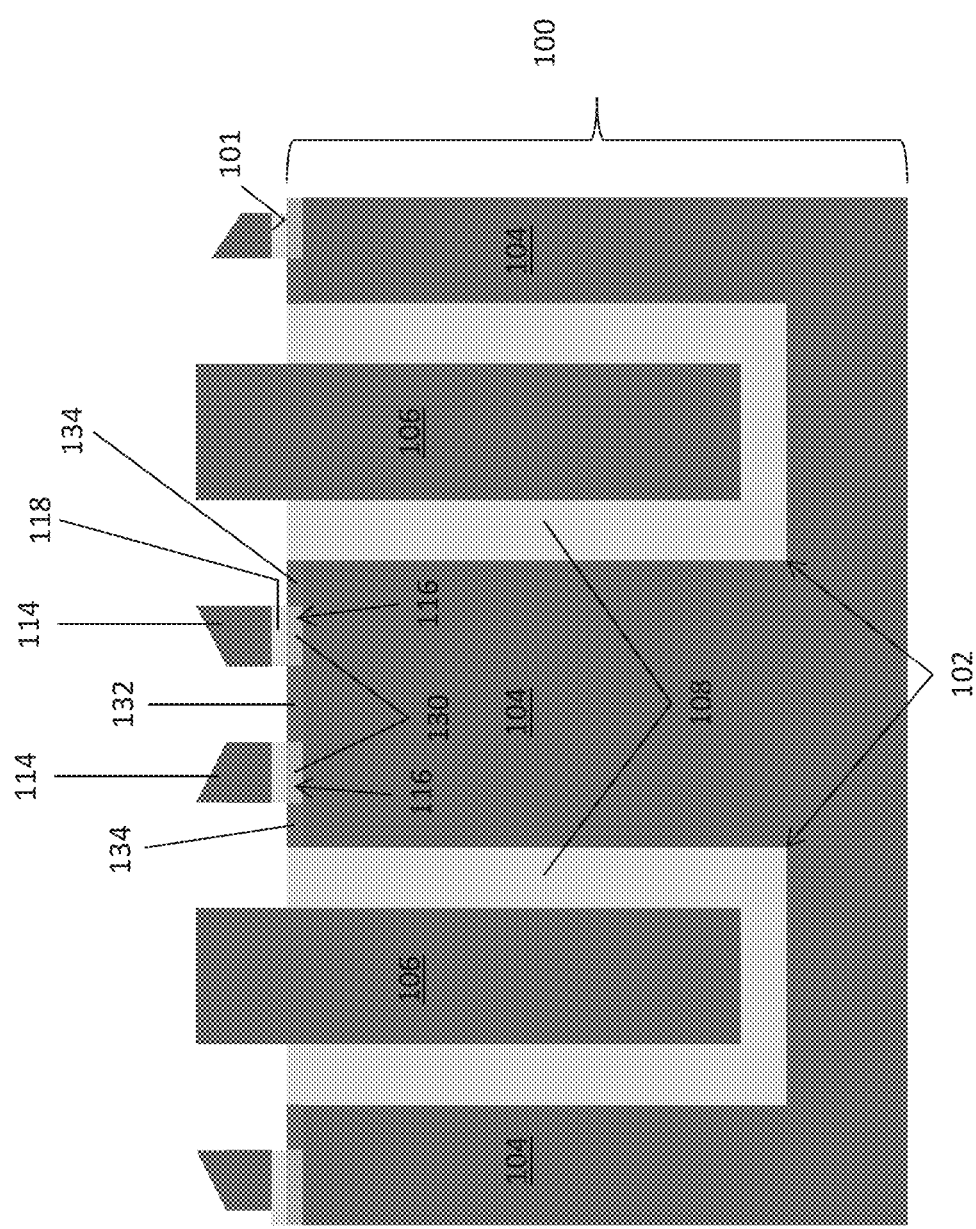

FIG. 2I shows the semiconductor material 100 after formation of implanted source regions 132 in the center part of the exposed mesas 104. The exposed parts of the mesas 104 adjacent the trenches 102 are also implanted according to this embodiment to form implanted regions 134 of the same conductivity type as the implanted source regions 132. If the implant 134 at the trench side is not desired, the source implant can be performed prior to the removal of the sacrificial spacers 128 (e.g. at FIG. 2G.)

Figure 2J:
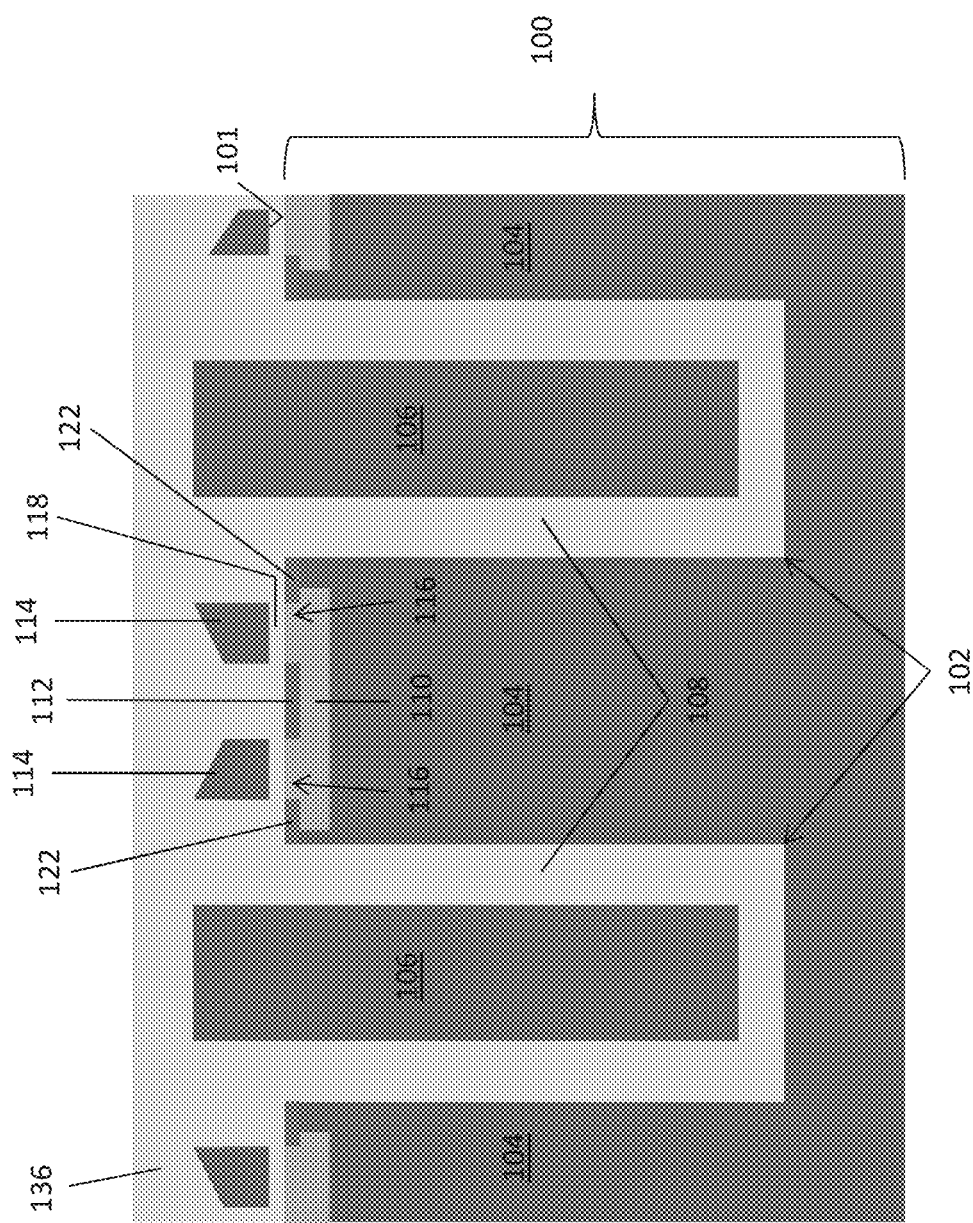

FIG. 2J shows the semiconductor material 100 after the structure is covered by a dielectric 136 and the body and source implants are activated (driven in) to form the body and source regions 110, 112, respectively, in the mesas 104. The drive in process also forms a doped region 122 of the same conductivity type as the source region 112 adjacent the trenches 102 in each of the mesas 104 and spaced apart from the source region 112 by the body region 110 in the same mesa 104. The dielectric 136 can be formed by thermal oxidation. The temperatures associated with thermal oxidation are high enough to drive in (activate) the body and source implants. Alternatively, the dielectric 136 can be deposited at a lower temperature and the structure annealed at a higher temperature to drive in the body and source implants. In either case, the dielectric 136 can include BPSG (borophosphosilicate glass) which reflows during the drive process, compensating all steps in the topology Lighter ions can be used for the body implant and heavier ions for the source implant so that the body region 110 outdiffuses further than the source region 112 during the drive in process. Highly doped (p+/n+) contact regions can be formed in the body region 110 of the mesas 104 for providing a low ohmic contact for the source electrode, but are not shown for ease of illustration. The process can be modified so that the body implant is driven in first (before the other implantations are performed), followed by activation of the source implant. The drain region can be formed at any desired part of the process (e.g. at the end), and is not shown in FIGS. 2A through 2L for ease of illustration.

The lateral channel regions 116 defined by the gate electrodes 114 are disposed in the body regions 110. The source regions 112 are spaced apart from the trenches 102 and the body region 110 is continuous between adjacent gate electrodes 114 on the same mesa 104. Also, a doped region 122 of the same conductivity type as the source region 112 is disposed adjacent the trenches 102 in each of the mesas 104 and spaced apart from the source region 112 by the body region 110 in the same mesa 104 to enhance the lateral current flow path.

FIG. 2K shows the semiconductor material 100 after a lithographic mask 138 with openings 140 is formed on the dielectric material 136. The openings 140 in the lithographic mask 138 may be aligned or misaligned with the gate electrodes 114.

Figure 2L:
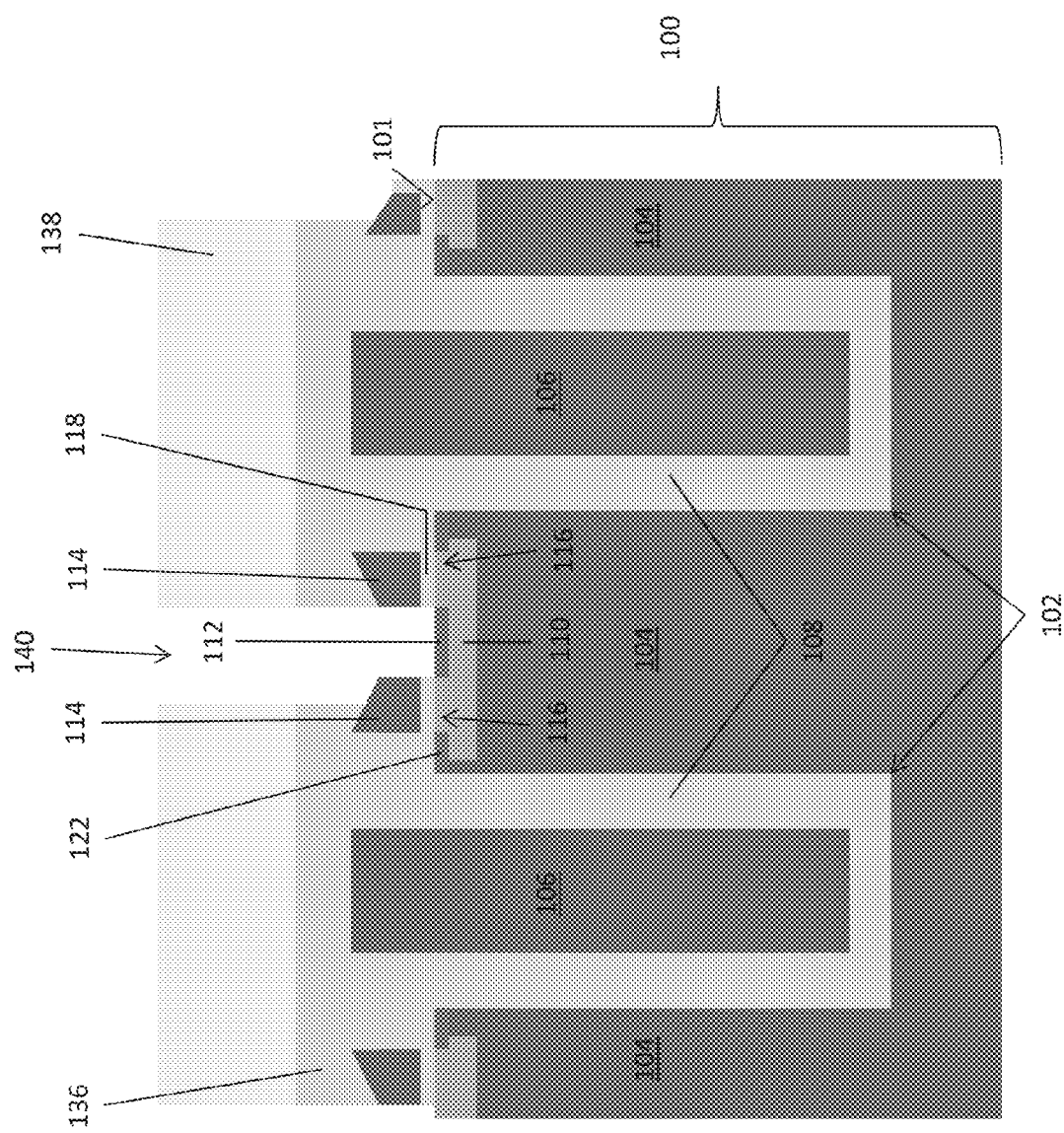

FIG. 2L shows the semiconductor material 100 after etching through the dielectric material 136 and into the mesas 104 through the openings 140 in the lithographic mask 138. For example, the dielectric material 136 can be etched by a plasma oxide etch and the mesas 104 etched by HF. The mesa 104 can instead be etched by a plasma etch. A source electrode material is then deposited after removal of the mask 138, the source electrode material filling the openings in the dielectric material 136 and contacting the body regions 110 and the source regions 112 to form the transistor structure shown in FIG. 1.

A further dielectric material can be formed on the gate electrodes 114 before deposition of the source electrode material in case the openings 140 in the lithographic mask 138 are misaligned, to ensure proper isolation between the gate and source electrodes 114, 120. In either case, the source electrodes 120 extend between adjacent ones of the gate electrodes 114 into the center of the mesas 104 according to this embodiment. A planarization or etch can be performed to open all electrodes which are to be connected to the source potential, while the gate electrodes 114 are covered, to allow for easy contacting.

Figure 3:
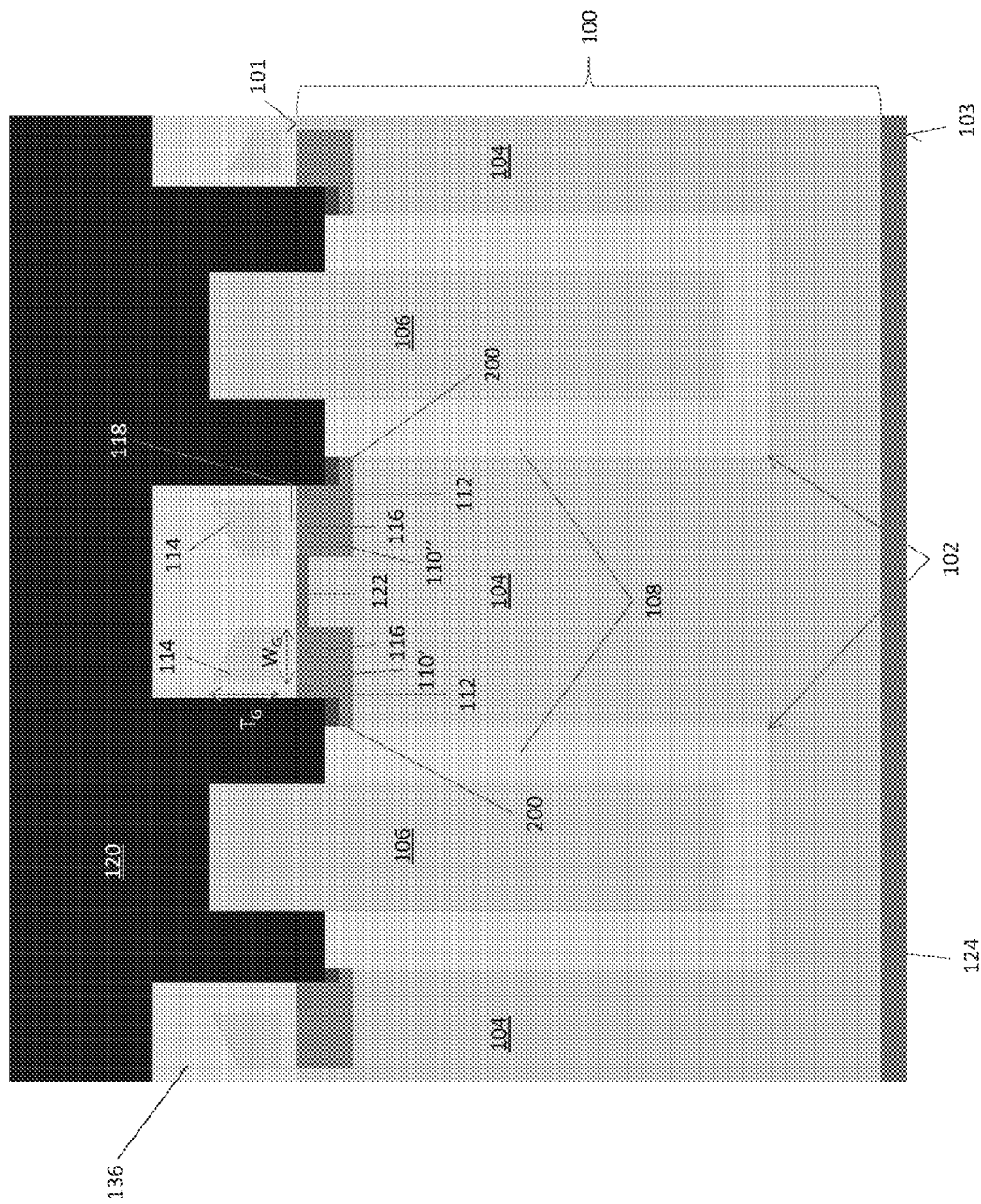
FIG. 3 illustrates a partial cross-sectional view of another embodiment of a semiconductor device having self-aligned electrodes and device regions.

FIG. 3 illustrates a cross-sectional view of another embodiment of a semiconductor device having self-aligned electrodes and device regions. The embodiment shown in FIG. 3 is similar to the one shown in FIG. 1, however, the regions 122 are optionally disposed in the section of the semiconductor material 100 that separates the adjacent gate electrodes 114 disposed on the same mesa 104 to improve resistivity, but not necessary for the device concept, and the of the same conductivity type as the source regions 112. Also shown in FIG. 3 are highly doped contact regions 200 which provide low ohmic contacts to the body 110', 110" for the source electrode 120. Further according to this embodiment, the source electrode 120 extends between each field electrode 106 and the adjacent gate electrodes 114 into the mesas 104. Also, the body region 110 is separated by a section of the semiconductor material 100 between adjacent ones of the gate electrodes 114 disposed on the same mesa 104. As such, the body region 110 is separated into spaced apart body regions 110', 110" to avoid a pn-junction between the body region 110 and the oppositely doped region 122 and/or the mesa 104 in the center of the mesas 104.

When a sufficient voltage is applied to the gate electrodes 114 to turn the transistor device on, current flows laterally from the outer source region 112 in each mesa 104, through the lateral channel region 116 and into the doped region 122 of the same conductivity type as the source region 112 disposed in the center of the mesas 104. The current then flows vertically downward through the drift region, eventually spreading out over the width of the drift region and entering the drain region 124 which is disposed at the second main surface 103 of the semiconductor material 100.

Each of the gate electrodes 114 has a maximum thickness ($T_G$) measured in a direction normal to the first main surface 101 of the semiconductor material 100 and a width ($W_G$) measured along the corresponding lateral channel region 116. The maximum thickness $T_G$ of the gate electrodes 114 can be greater than the width $W_G$. The gate electrodes 114 adjacent opposing sides of the same field plate 106 have the same alignment with respect to that field plate 106. Such gate dimensions and uniform gate alignment are realized by using certain self-aligned processes instead of lithography processes to manufacture the transistor device.

FIGS. 4A through 4G illustrate an embodiment of manufacturing the semiconductor device of FIG. 3. Standard semiconductor processing such as etching, depositing, implanting, masking, etc. can be used to perform the steps described next.

Figure 4A:
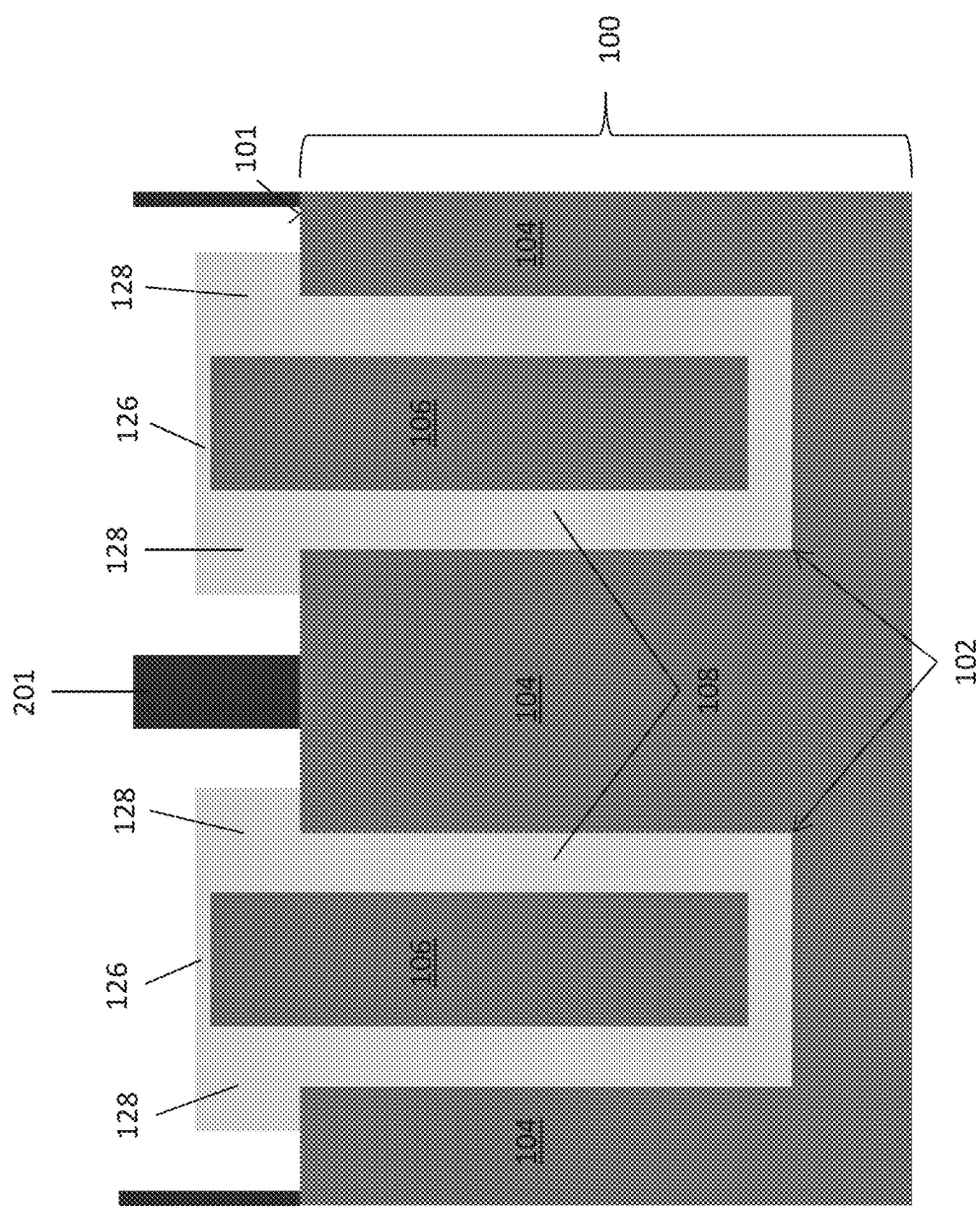
FIGS. 4A through 4G illustrate respective partial cross-sectional views during different stages of a method of manufacturing the semiconductor device of FIG. 3.

FIG. 4A shows the semiconductor material 100 after sacrificial spacers 128 are formed on the semiconductor material 100 adjacent opposing sides of the trench fill material 106, and a body implant mask 201 is formed on the semiconductor material 100. If a self-alignment between body and gate electrode is needed, the mask 201 can be a structured thick dielectric which is not removed before the gate electrode is deposited. The material used for the spacer 128 could be used for the mask 201, e.g. by applying a lithography step before the spacer etch between FIGS. 2C and 2D. Up to this point, the structure can be processed the same or similar as shown in FIGS. 2A through 2D to form the sacrificial spacers 128. According to one embodiment, the sacrificial spacers 128 are formed by depositing a material such as tetraethyl orthosilicate (TEOS) or carbon on the semiconductor material 100 and anisotropically etching the material to expose the mesas 104. For example, the material can be anisotropically etched by a RIE process which stops on the mesas 104. The part of the material that remains along the opposing sides of the trench fill material 106 after anisotropic etching forms the sacrificial spacers 128. A thin layer 126 of the material can remain on top side of the trench fill material 106 as shown in FIG. 4A. The sacrificial spacers 128 define the area of the body implant and one edge of the gate electrodes to be formed after gate oxidation.

Figure 4B:
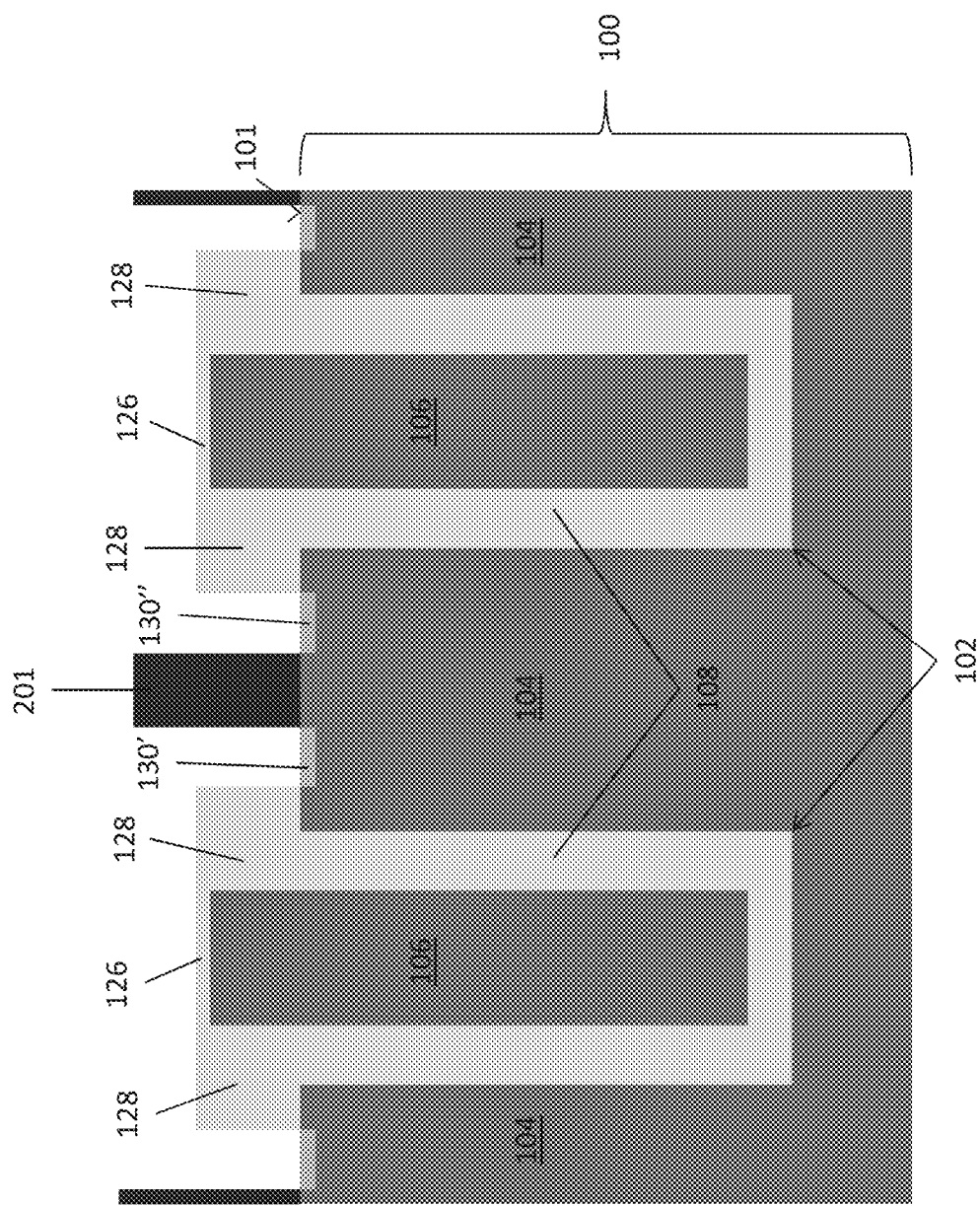

FIG. 4B shows the semiconductor material 100 after the body implant. The mask 201 segments the implanted body region 130 into spaced apart implanted body regions 130', 130". In the case of an n-channel MOSFET, the spaced apart implanted body regions 130', 130" comprise p-type dopants. In the case of a p-channel MOSFET, the spaced apart implanted body regions 130', 130" comprise n-type dopants.

Figure 4C:
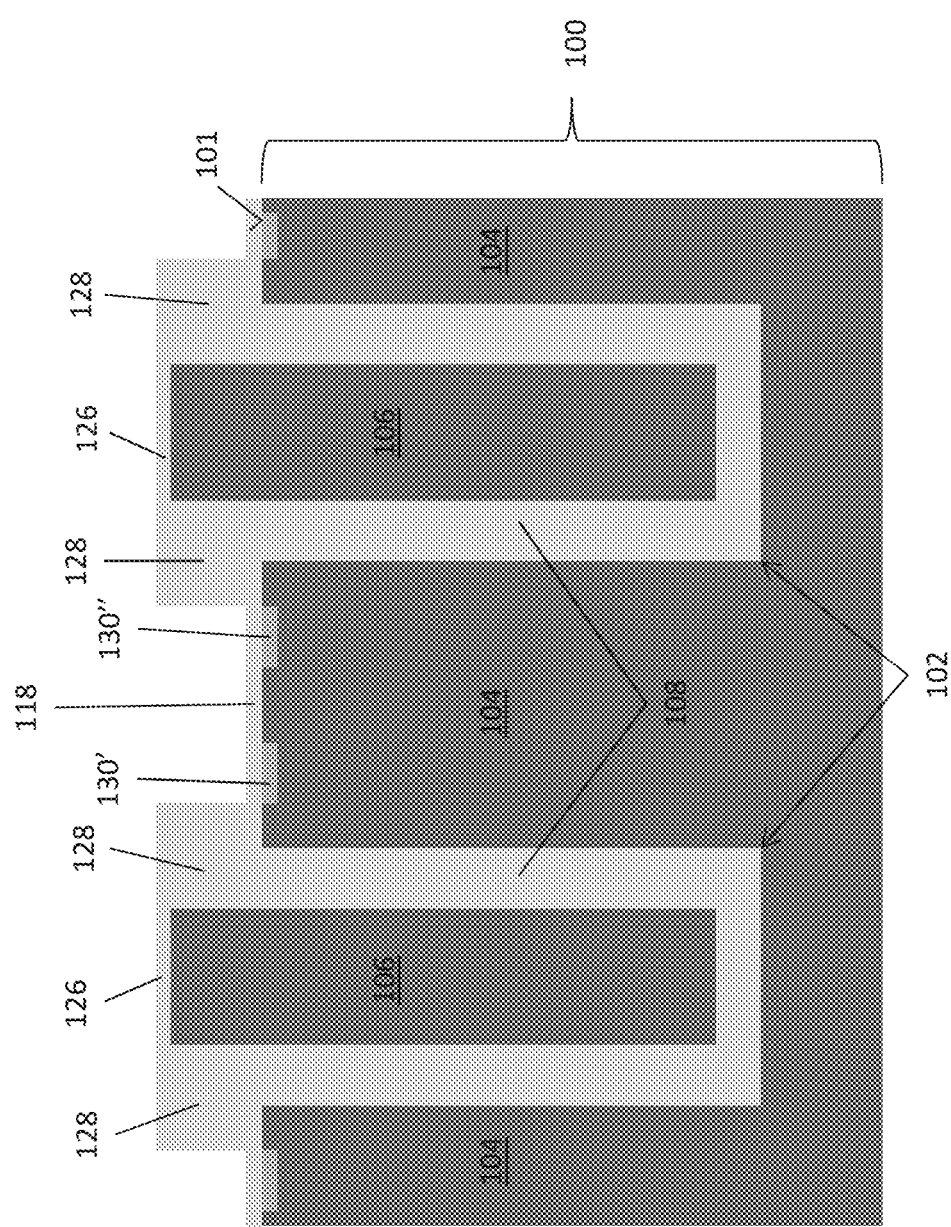

FIG. 4C shows the semiconductor material 100 after the mask 201 is removed and the gate dielectric 118 is formed on the mesas 104. The gate dielectric 118 can be formed by thermal oxidation or deposition as previously described herein. The body implant can be performed after gate oxidation as previously described herein. The body implant can also be performed before the spacers 128 are formed to ensure the body reaches to the trench.

Figure 4D:
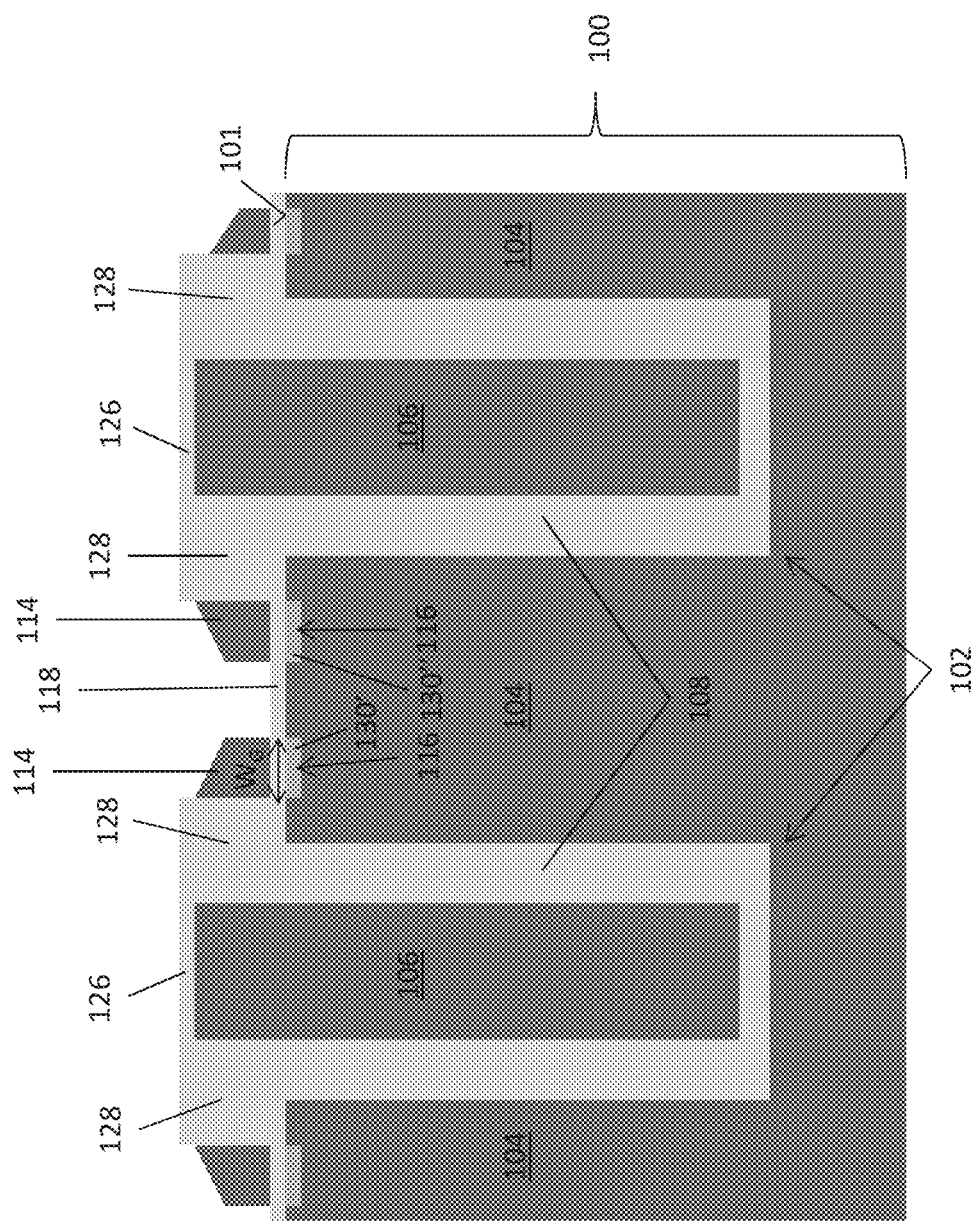

FIG. 4D shows the semiconductor material 100 after the gate electrodes 114 are formed on the recessed first main surface 101 of the semiconductor material 100 adjacent the sacrificial spacers 128. The gate electrodes 114 have the same alignment with respect to the trenches 102, and define the position of the lateral channel regions 126 in the mesas 104 under the gate electrodes 114. According to one embodiment, the gate electrodes 114 are formed by depositing an electrically conductive material such as highly doped polysilicon with an optional top layer of TiSi on the recessed first main surface 101 of the semiconductor material 100 after formation of the sacrificial spacers 128. The electrically conductive material is then anisotropically etched e.g. by RIE to form the gate electrodes 114. The width ($W_G$) of the gate electrodes 114 as measured in a direction along the lateral channel regions 126 corresponds to a maximum thickness of the electrically conductive material prior to etching. For example, a 150 nm thick layer of the electrically conductive material yields gate electrodes 114 having a width of approximately 150 nm after anisotropic etching as previously described herein. The gate electrode process is self-aligned due to the use of the sacrificial spacers 128 instead of lithography, and therefore very narrow gate electrodes 114 can be formed. To save additional area, the gate electrodes 114 can be used as spacers for subsequent processing such as source implantation. The electrodes 114 can be made thicker to accommodate the gate voltages applied during operation of the transistor device to achieve a better gate resistance. The edge regions of the device (not shown) can be masked to form standard edge termination structures.

Figure 4E:
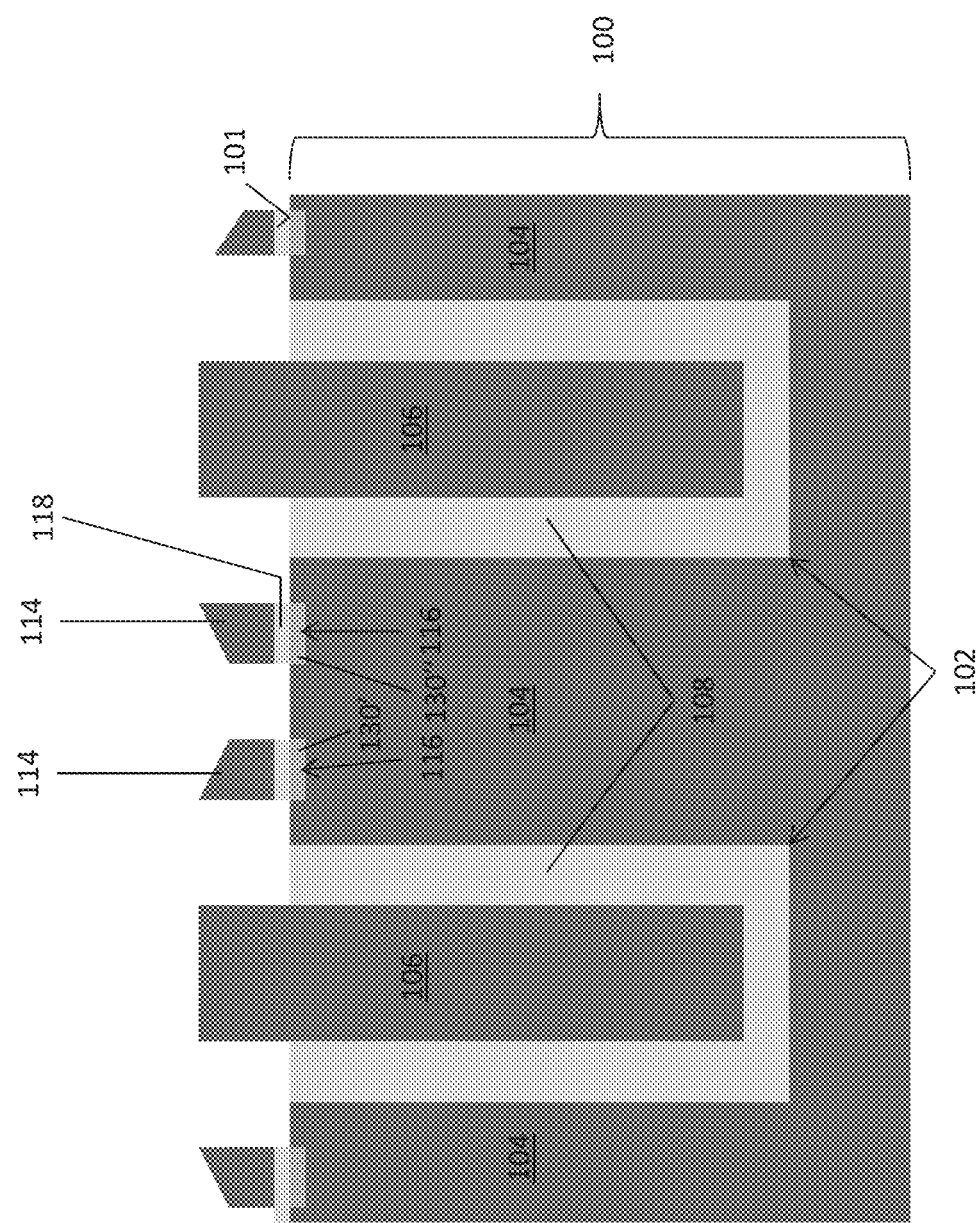

FIG. 4E shows the semiconductor material 100 after the sacrificial spacers 128 are removed and the gate dielectric material 118 unprotected by the gate electrodes 114 is removed from the mesas 104 to allow for source implantation. The gate electrodes 114 align the selective etch of the gate dielectric 118 to expose the implant regions of the mesas 104. Any standard etch process can be employed, and depends on the type of spacer material (e.g. TEOS) used.

Figure 4F:
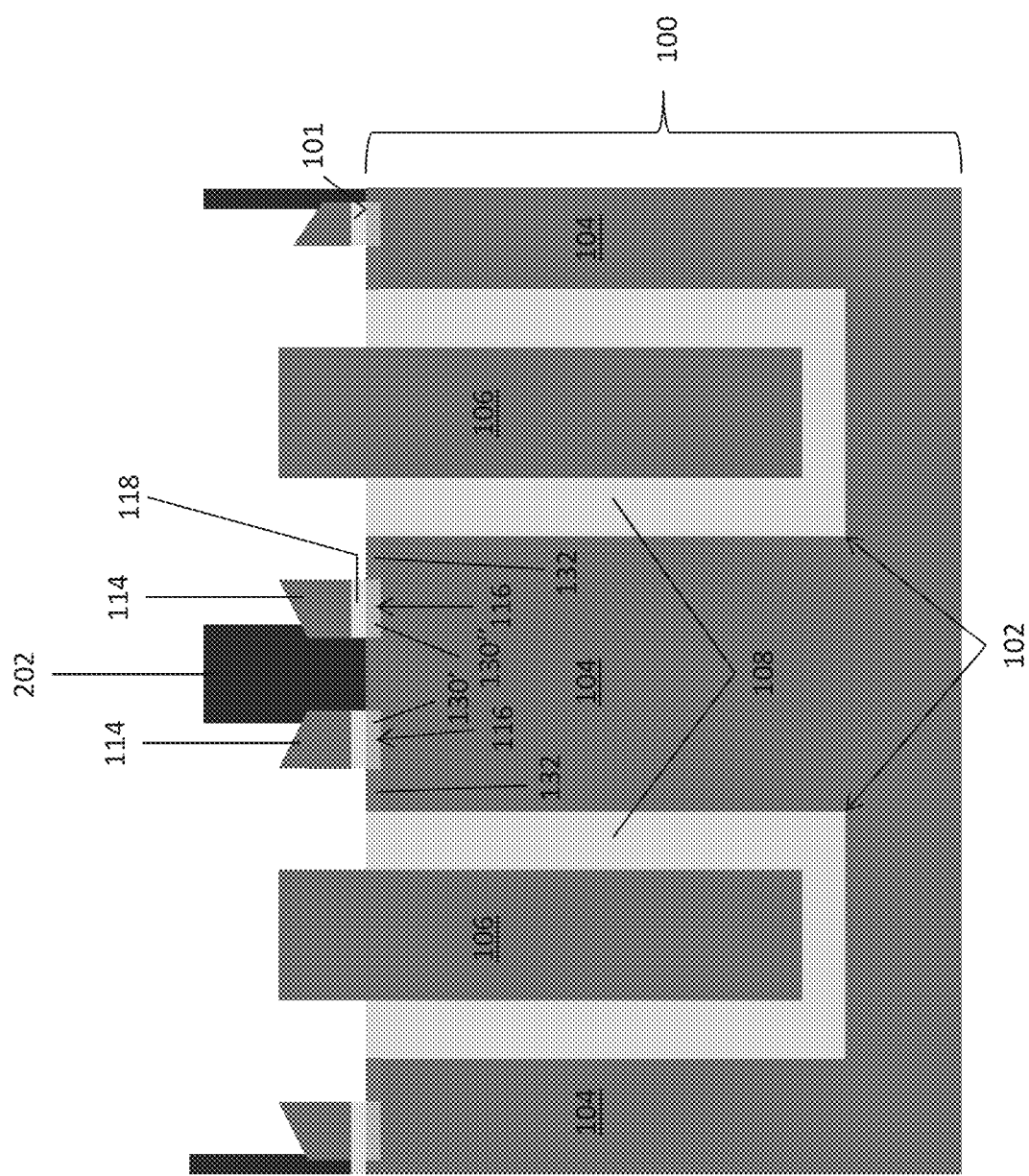

FIG. 4F shows the semiconductor material 100 after another mask 202 is formed on the mesas 104 between adjacent gate electrodes 114, and the mask 202 and the gate electrodes 114 are used as a mask to implant dopants of the opposite conductivity type as the body implant dopants into the unmasked part of the mesas 104 to form implanted source regions 132. The implanted source regions 132 are disposed adjacent the trenches 102.

Figure 4G:
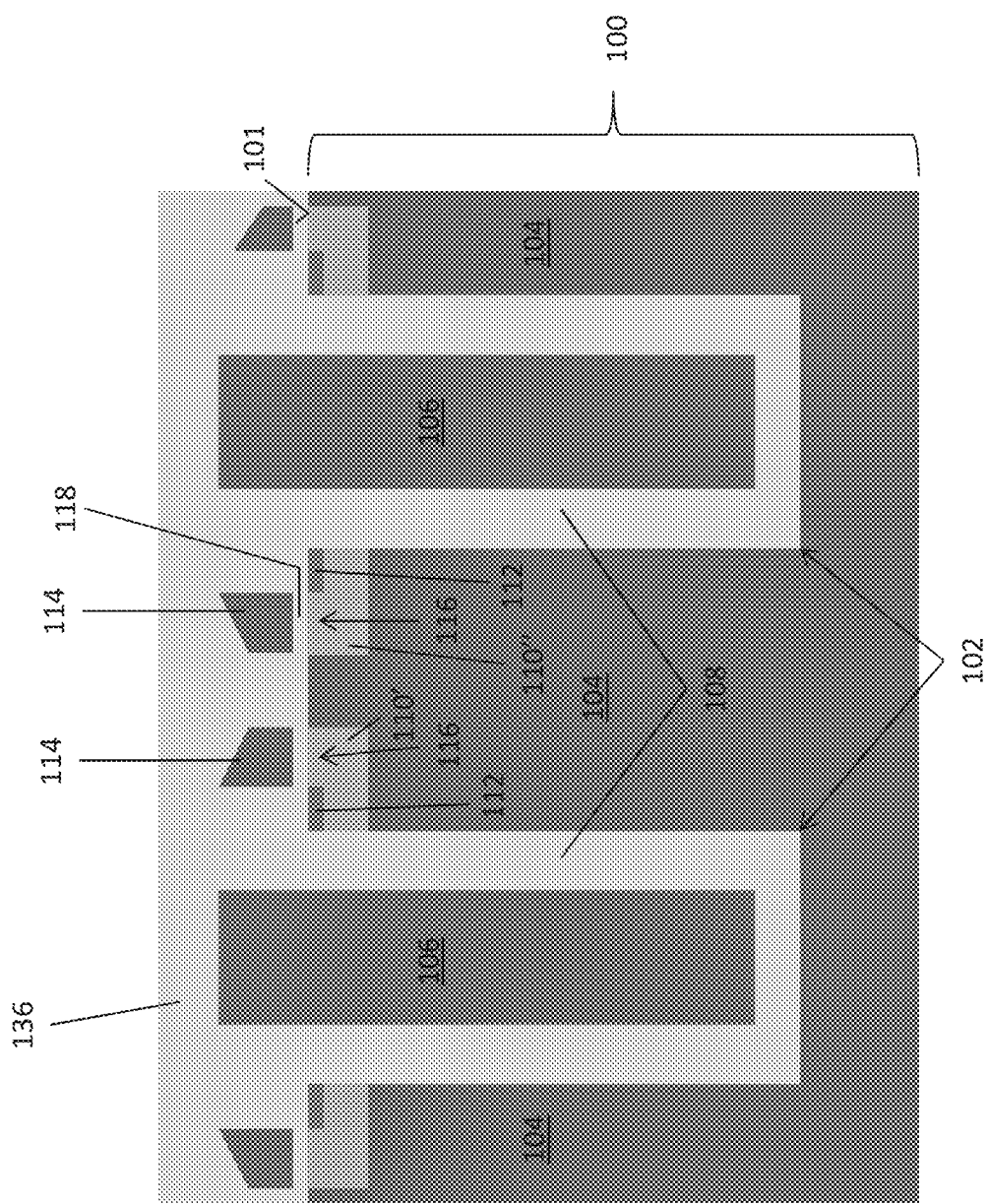

FIG. 4G shows the semiconductor material 100 after the structure is covered by a dielectric material 136 and the body and source implants are activated (driven in) to form the body and source regions 110', 110", 112, respectively, in the mesas 104. The dielectric 136 can be formed by thermal oxidation. The temperatures associated with thermal oxidation are high enough to drive in (activate) the body and source implants. Alternatively, the dielectric 136 can be deposited at a lower temperature and the structure annealed at a higher temperature to drive in the body and source implants. In either case, lighter ions can be used for the body implant and heavier ions for the source implant so that the body region 110', 110" outdiffuses further than the source region 112. The process can be modified so that the body implant is driven in first, followed by activation of the source implant as previously described herein.

The lateral channel regions 116 defined by the gate electrodes 114 are disposed in the body regions 110', 110" and the source regions 112 are adjacent the trenches 102. Standard lithographic, etch and deposition processing can then be employed e.g. similar to the kind illustrated in FIGS. 2K and 2L to form the source electrodes 120 in contact with the field plates 106 in the trenches 102, the source regions 112 being adjacent the trenches 102 and the body regions 130', 130". Also, a doped region 122 (not shown in FIG. 4) of the same conductivity type as the source regions 112 can be disposed in the section of the semiconductor material 100 that separates adjacent gate electrodes 114 disposed on the same mesa 104 e.g. as shown in FIG. 3. Such a doped region 122 can be formed by a deep implant between adjacent ones of the gate electrodes 114 and subsequent anneal.

Figure 5A:
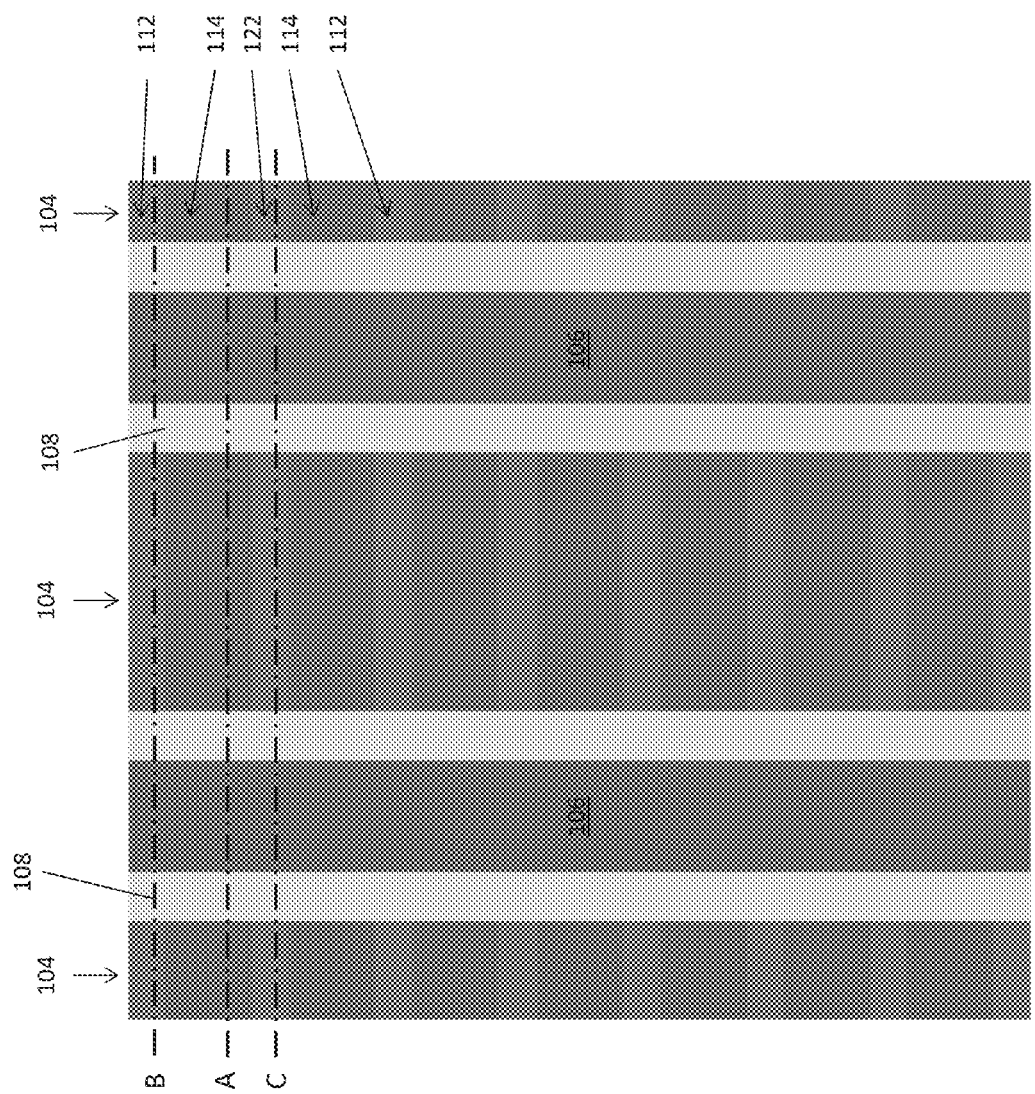
FIGS. 5A through 5D illustrate different partial views of yet another embodiment of a semiconductor device having self-aligned electrodes and device regions.
Figure 5B:
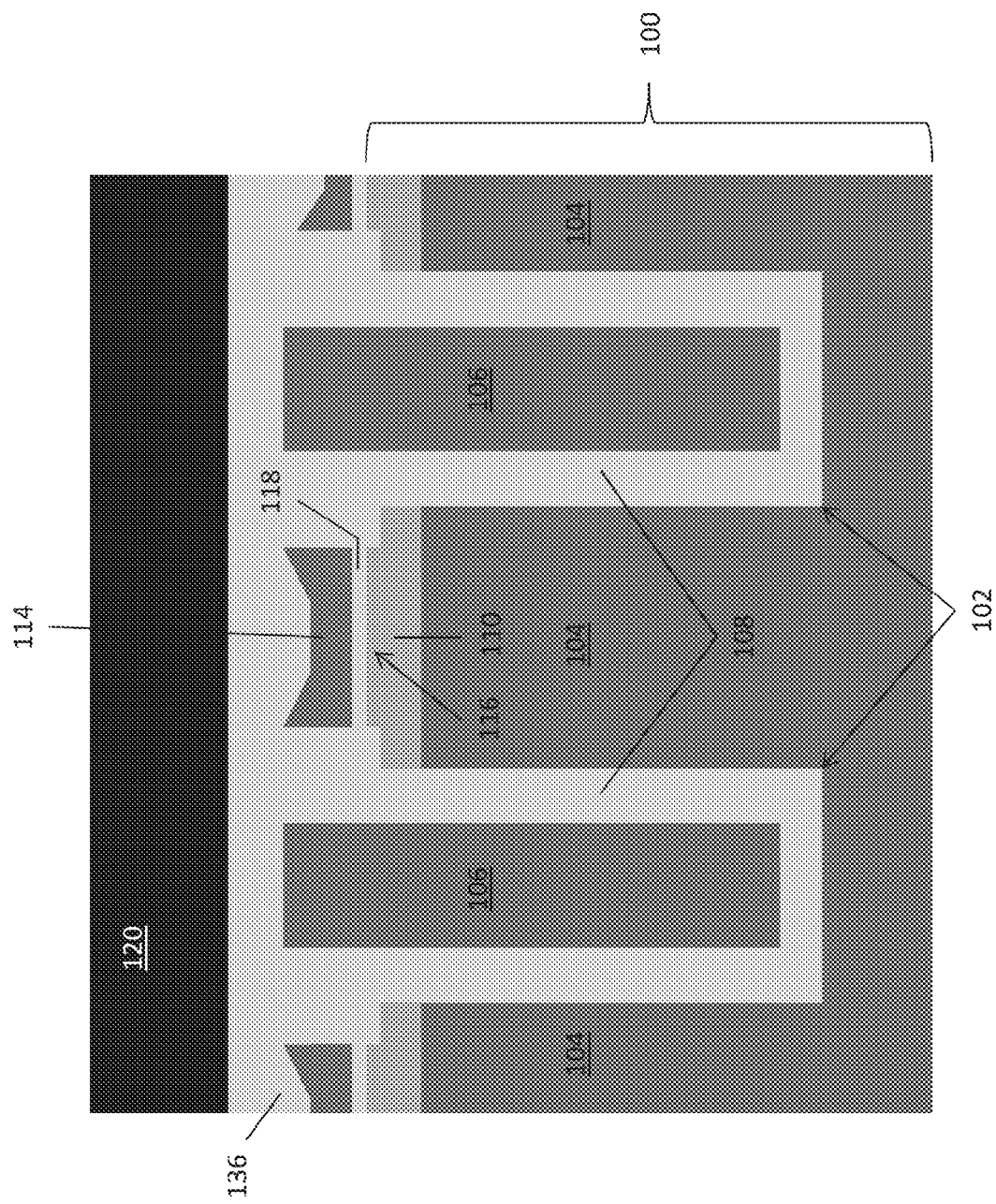
Figure 5C:
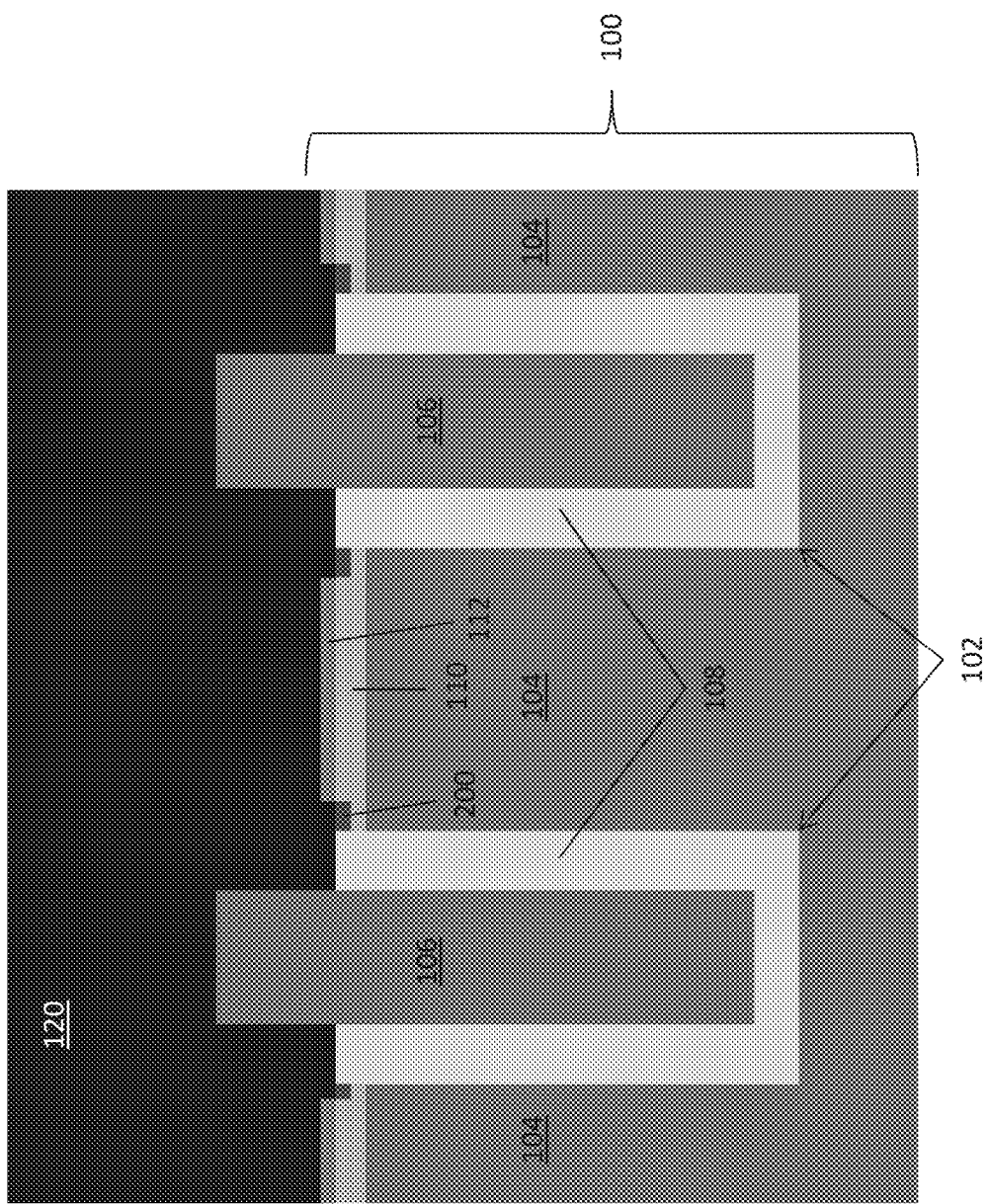
Figure 5D:
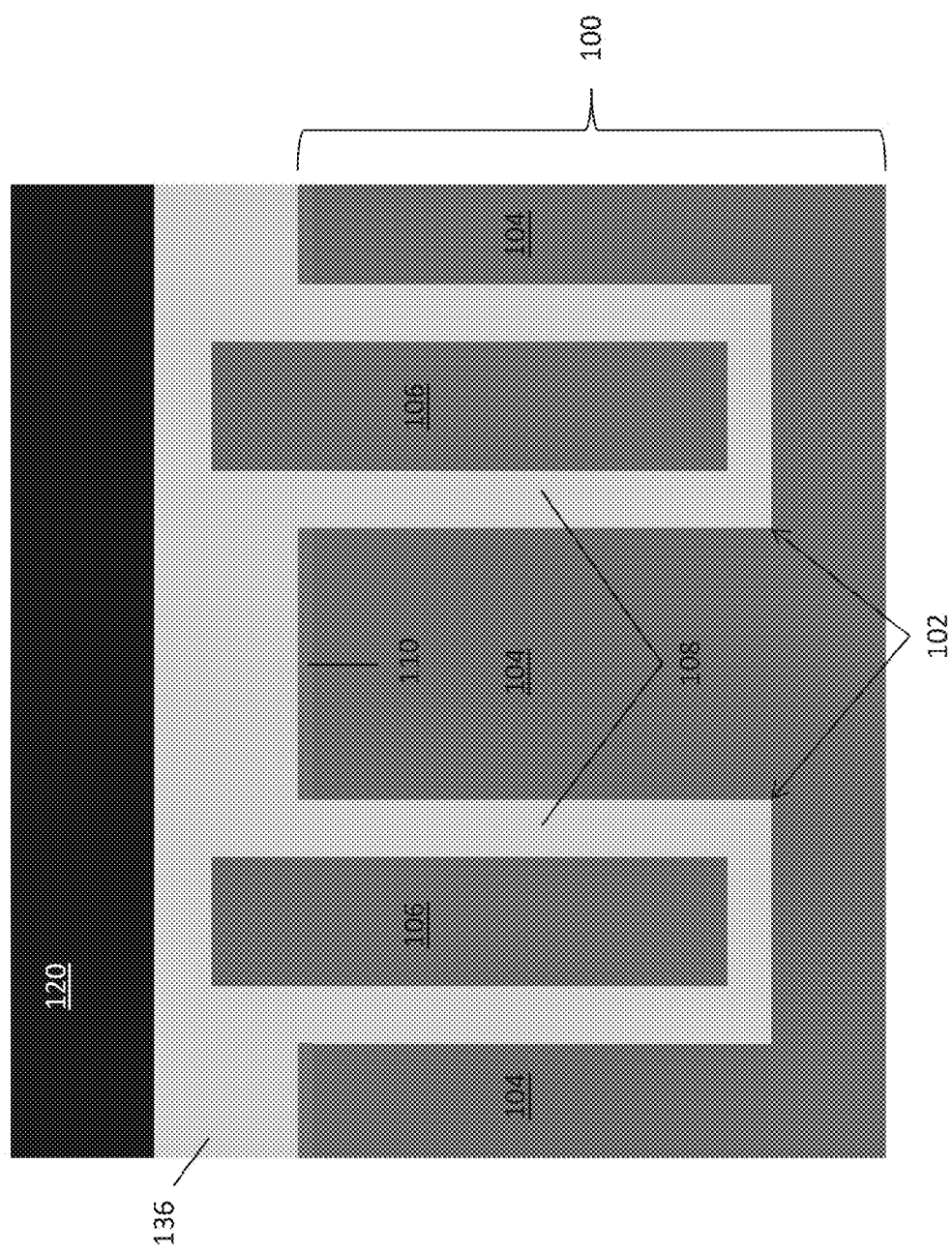

FIGS. 5A through 5D illustrate different views of yet another embodiment of a semiconductor device having self-aligned electrodes and device regions. FIG. 5A shows a top-down plan view of the semiconductor device. FIG. 5B shows a cross-sectional view of the semiconductor device along the line labeled 'A' in FIG. 5A, FIG. 5C shows a cross-sectional view of the semiconductor device along the line labeled 'B' in FIG. 5A, and FIG. 5D shows a cross-sectional view of the semiconductor device along the line labeled 'C' in FIG. 5A. Different from the semiconductor devices described with reference to FIGS. 1 through 4, the source regions 112, the lateral channel regions 116, the body regions 130 and the gate electrodes 114 of the semiconductor device shown in FIG. 5 extend perpendicular to the trenches 102. This also allows for the pitch of the gate electrodes 114 to be selected or determined independently of the pitches of the field plates.

Figure 6:
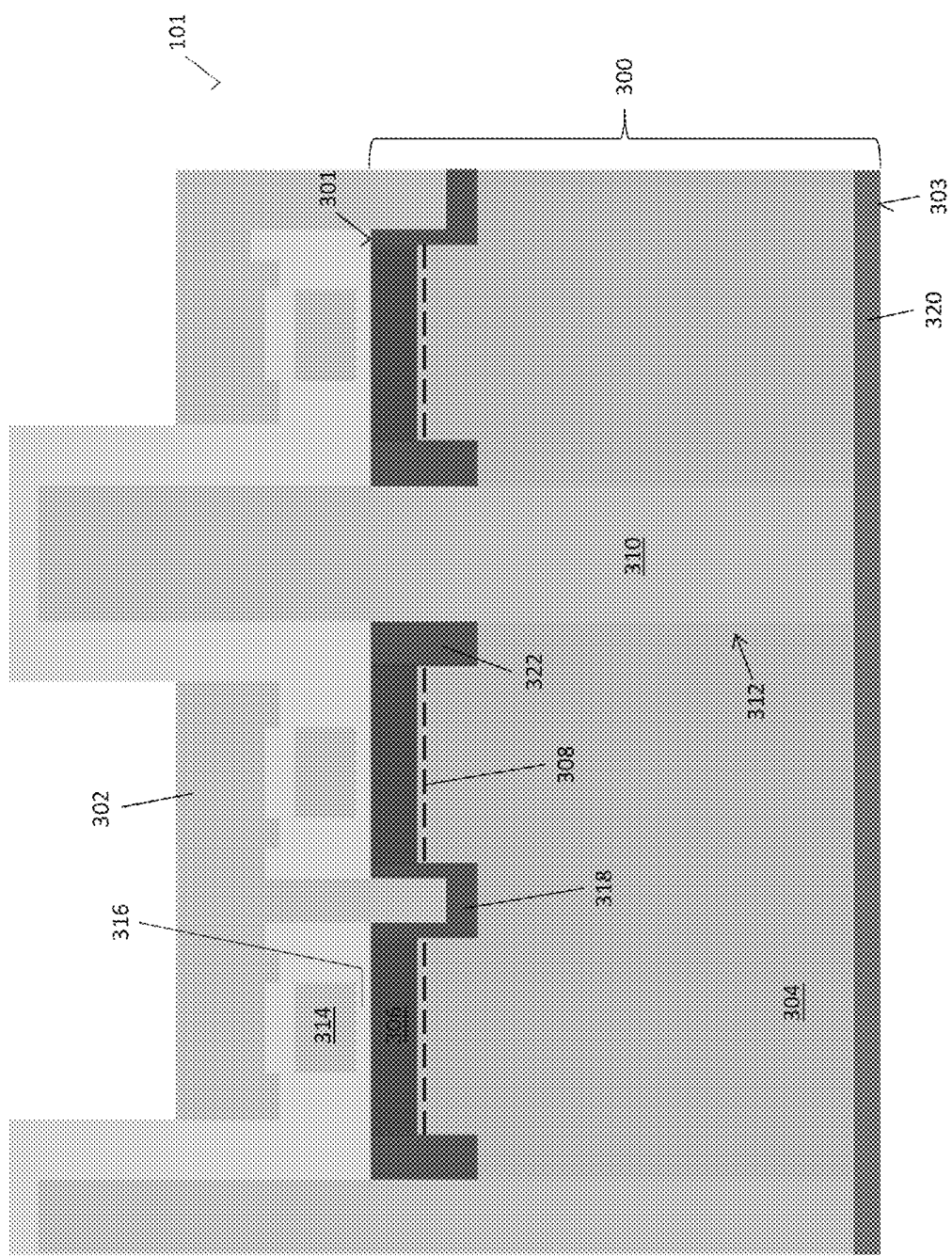
FIG. 6 illustrates a partial cross-sectional view of an embodiment of a compound semiconductor device having self-aligned electrodes and device regions.

FIG. 6 illustrates a cross-sectional view of an embodiment of a compound semiconductor device having self-aligned electrodes and device regions. The embodiment shown in FIG. 6 is different than the ones previously described herein with reference to FIGS. 1 through 5 in that the device is a compound semiconductor device such as a GaN HEMT (high electron mobility transistor) and the semiconductor material is a III-nitride material 300. The device can be provided with a field plate 302, which is optional.

The term HEMT is also commonly referred to as HFET (heterostructure field effect transistor), MODFET (modulation-doped FET) and MESFET (metal semiconductor field effect transistor). The terms HEMT, HFET, MESFET and MODFET are used interchangeably herein to refer to any III-nitride based compound semiconductor transistor incorporating a junction between two materials 304, 306 with different band gaps (i.e., a heterojunction) as the channel region 308. For example, GaN 304 may be combined with AlGaN or InGaN 306 to form an electron gas inversion region as the channel 308. The compound semiconductor device may have AlInN/AlN/GaN barrier/spacer/buffer layer structures. In general, the normally-off compound semiconductor transistor can be realized using any suitable III-nitride technology such as GaN that permits the formation of opposite polarity inversion regions due to piezoelectric effects.

Specifically with regard to GaN technology, the presence of polarization charges and strain effects in a GaN-based heterostructure body due to piezoelectric effects yield a two-dimensional charge carrier gas 308 in the heterostructure body characterized by very high carrier density and carrier mobility. Such a two-dimensional charge carrier gas 308, such as a 2DEG (two-dimensional electron gas) or 2DHG (two-dimensional hole gas), forms the conductive channel of the HEMT near the interface between, e.g., a GaN alloy barrier region 306 and a GaN buffer region 304. A thin, e.g. 1-2 nm, AlN layer can be provided between the GaN buffer region 304 and the GaN alloy barrier region 306 to minimize alloy scattering and enhance 2DEG mobility. In a broad sense, the compound semiconductor transistor described herein can be formed from any binary, ternary or quaternary III-nitride compound semiconductor material where piezoelectric effects are responsible for the device concept.

During formation of the compound semiconductor device, an electrically conductive plug 310 is formed extending over the substrate surface in a trench 312 which can be used to bring one of the source or drain electrode to the backside of the device. From this plug structure, at least a dielectric (optional), a conductive material and another dielectric spacer are formed. The conductive material will become the gate electrode. After the last dielectric plug, another contact implantation might be needed. If the subsequent etch for the electrode removes all the implanted area, another spacer is first provided. Then the last conductive plug of the device can be generated.

The compound semiconductor device also has gate electrodes 314 which may or may not be insulated from the III-nitride material 300 by a gate dielectric 316. The source and drain regions 318, 320 can be disposed at different main surfaces 101, 103 of the III-nitride material 300 as shown in FIG. 6. According to this embodiment, a contact region 322 connects the channel region 308 to the conductive plug 310, and the conductive plug is vertically connected to the drain region 320. The position of the source and drain regions 318, 320 can be switched. In yet another embodiment, the compound semiconductor device can be a lateral device in that the source and drain regions 318, 320 are disposed at the same side 101 of the III-nitride material 300.

Figure 7A:
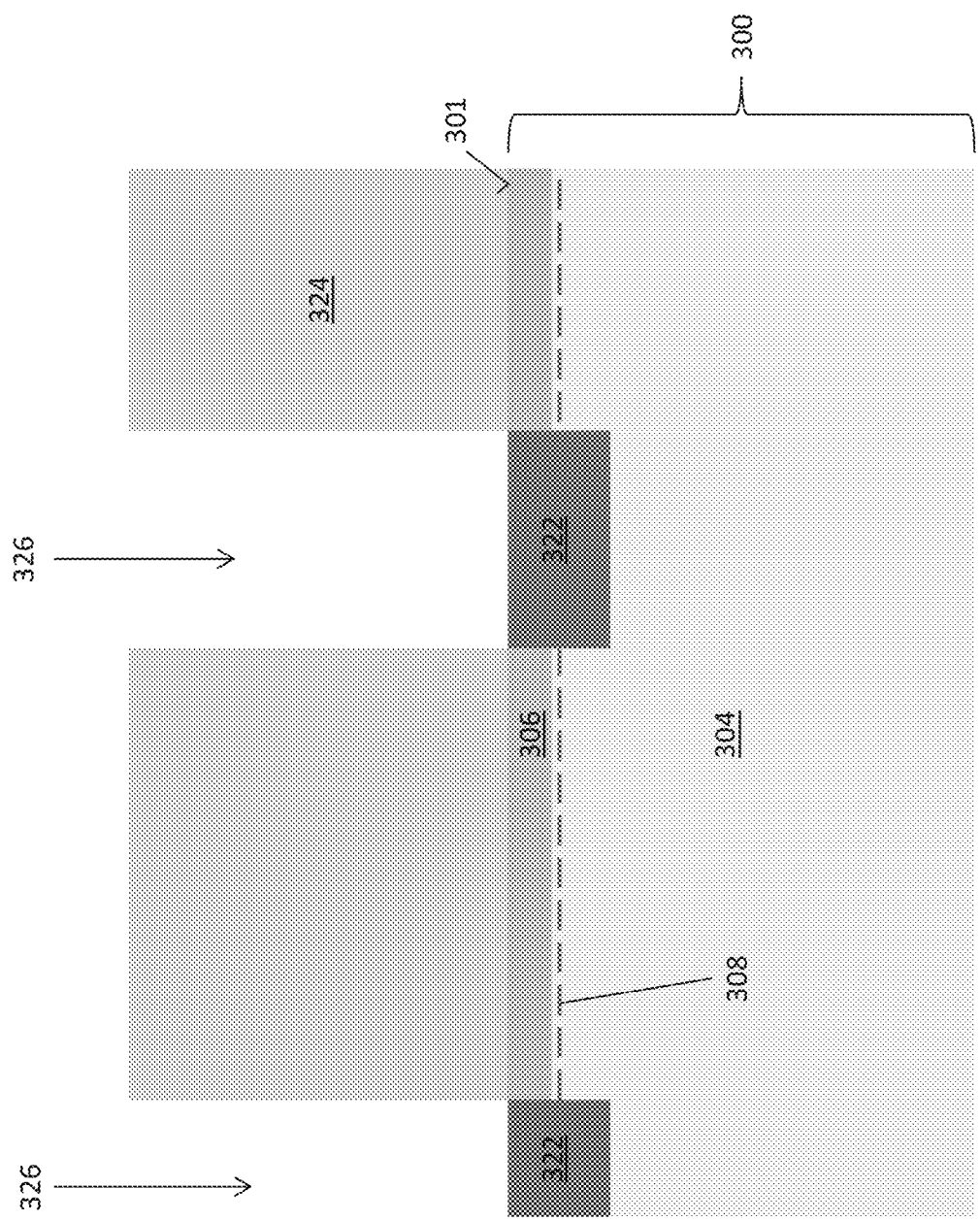
FIGS. 7A through 7V illustrate respective partial cross-sectional views during different stages of a method of manufacturing the compound semiconductor device of FIG. 1.
Figure 7B:
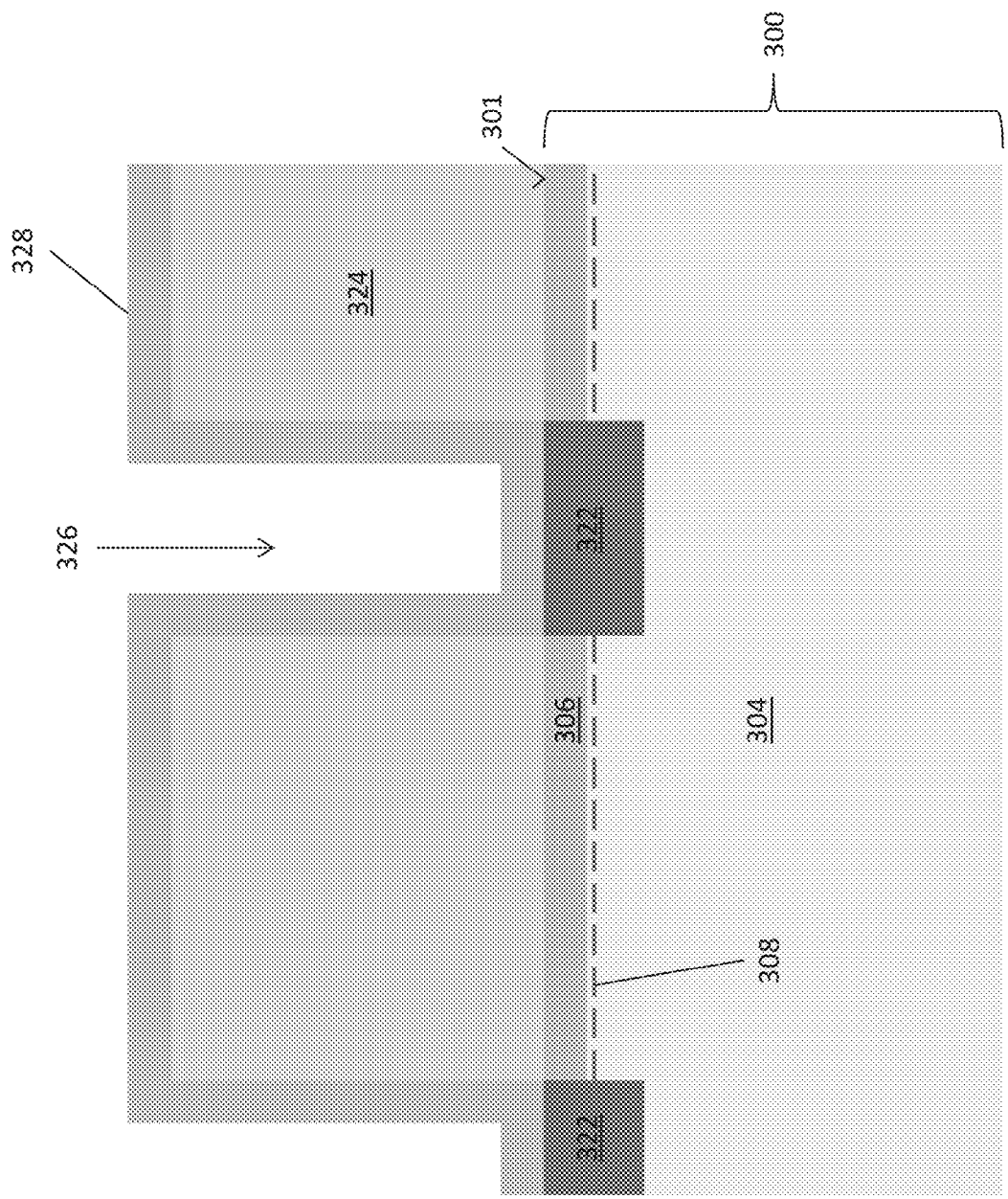
Figure 7E:
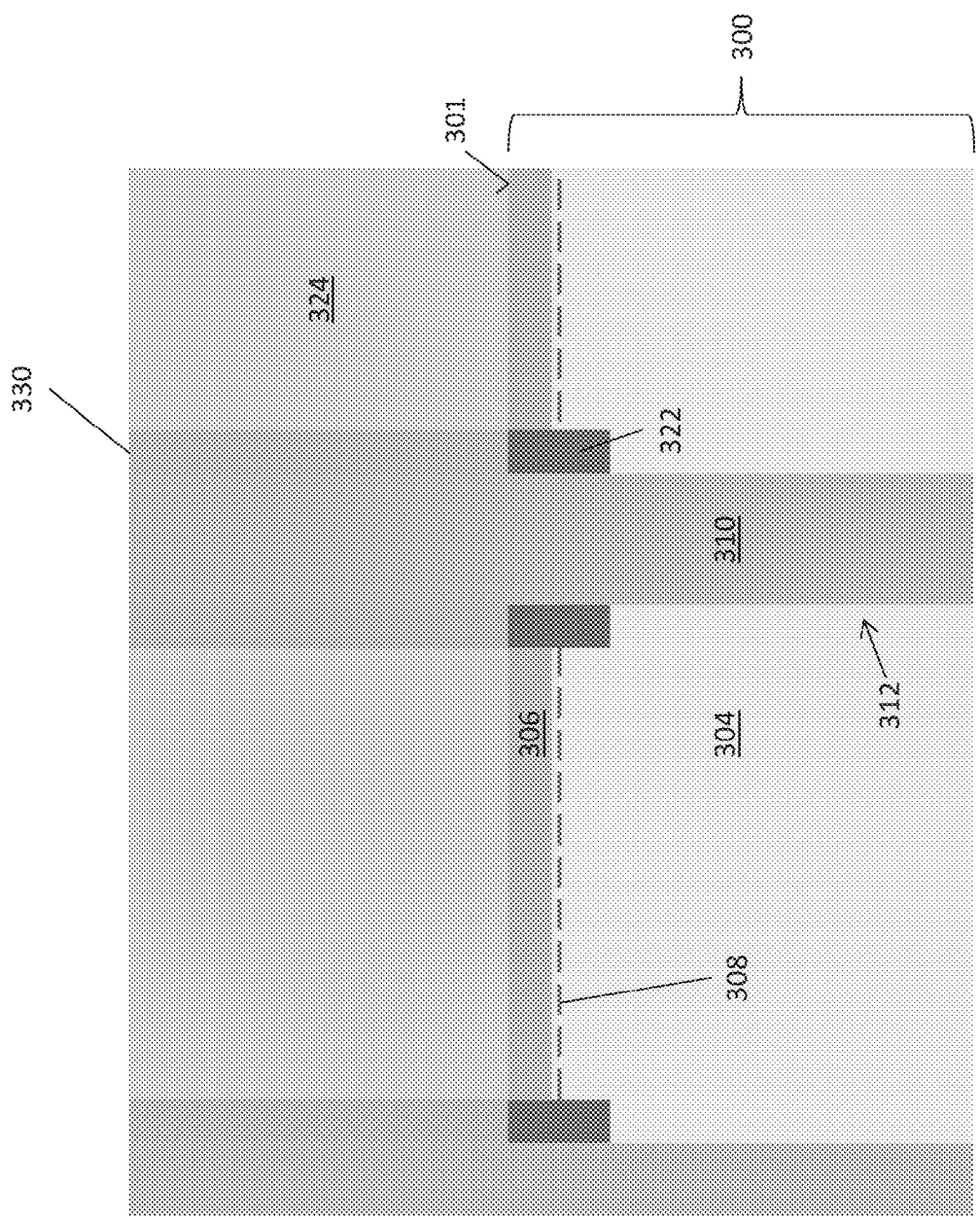
Figure 7F:
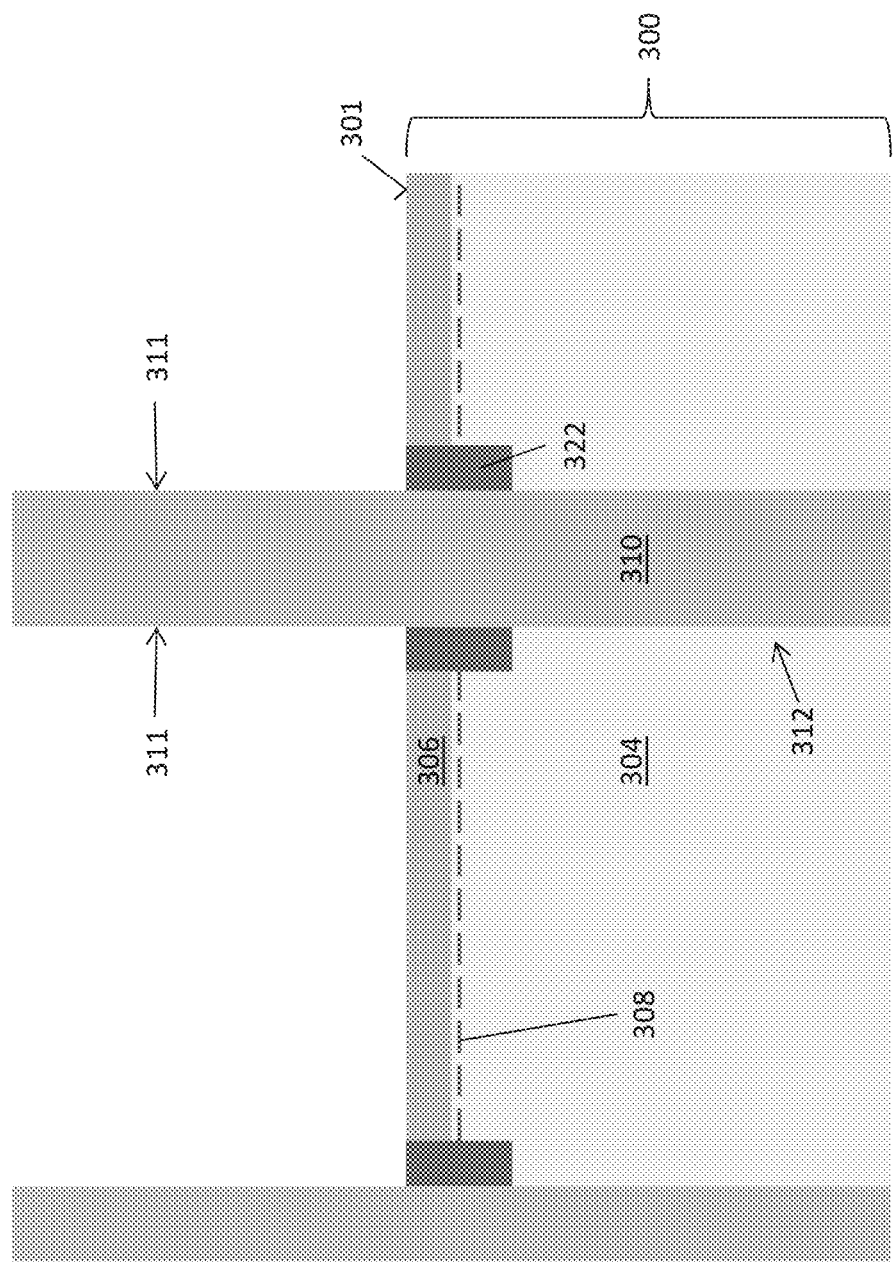
Figure 7G:
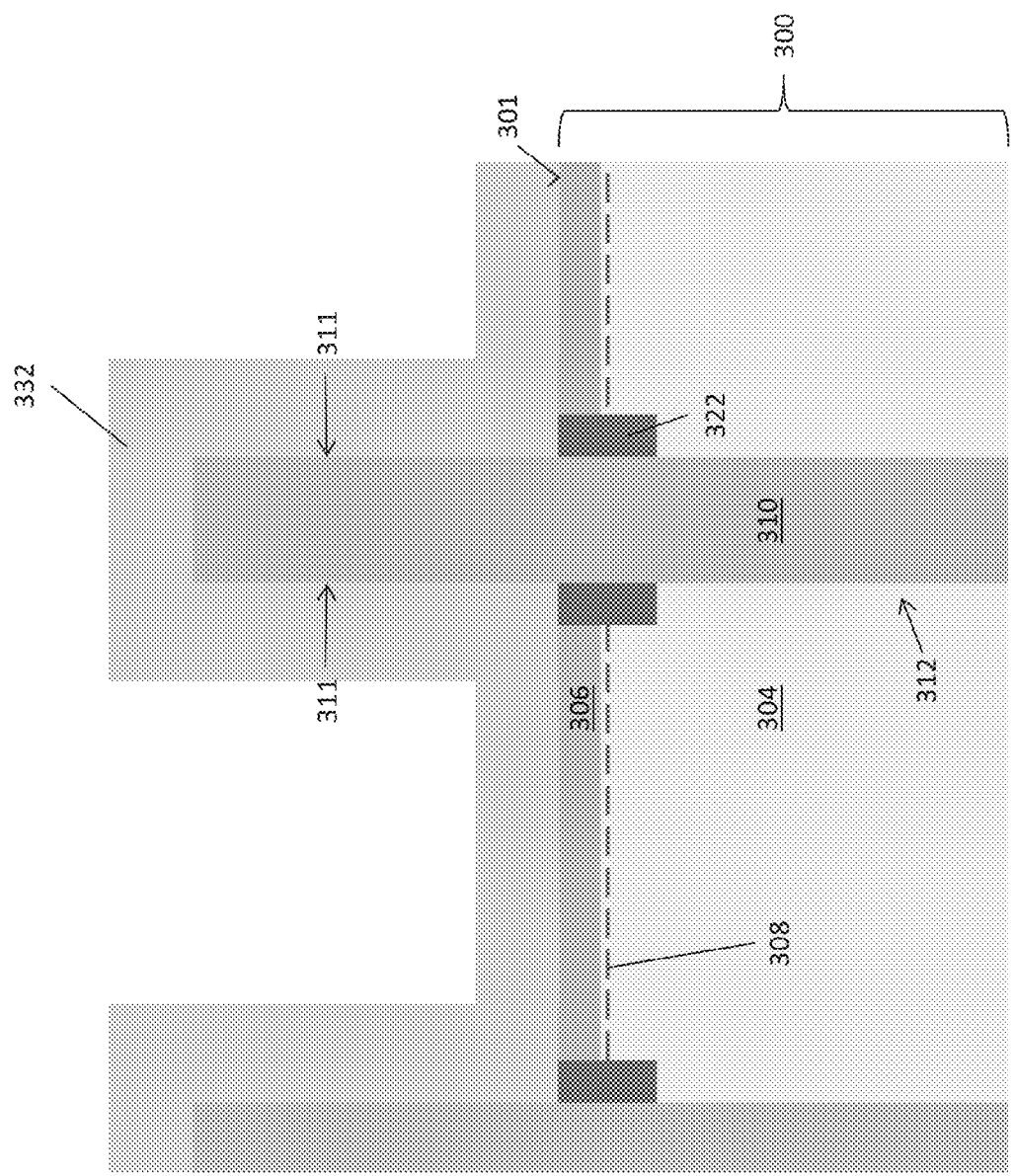
Figure 7H:
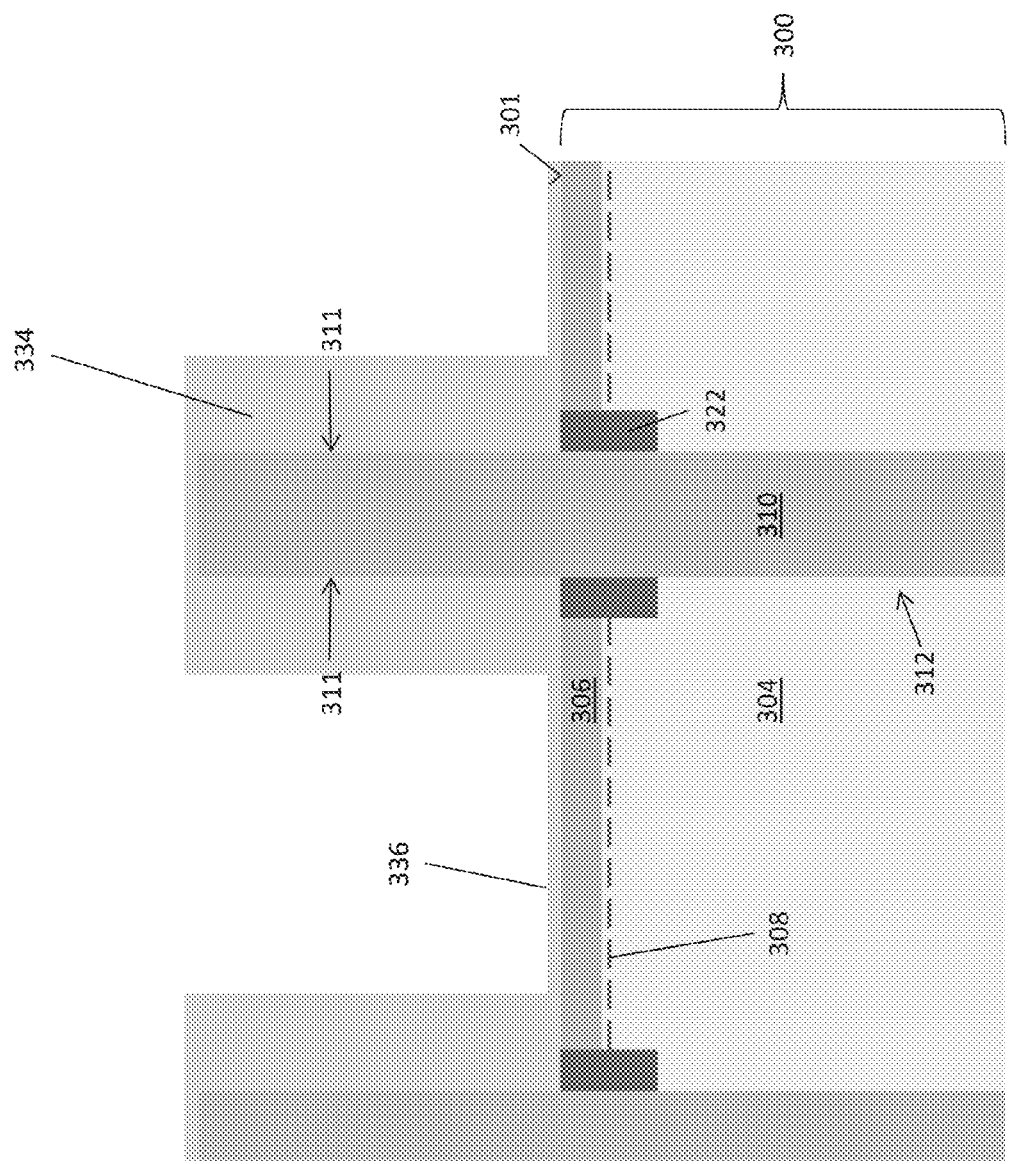
Figure 7J:
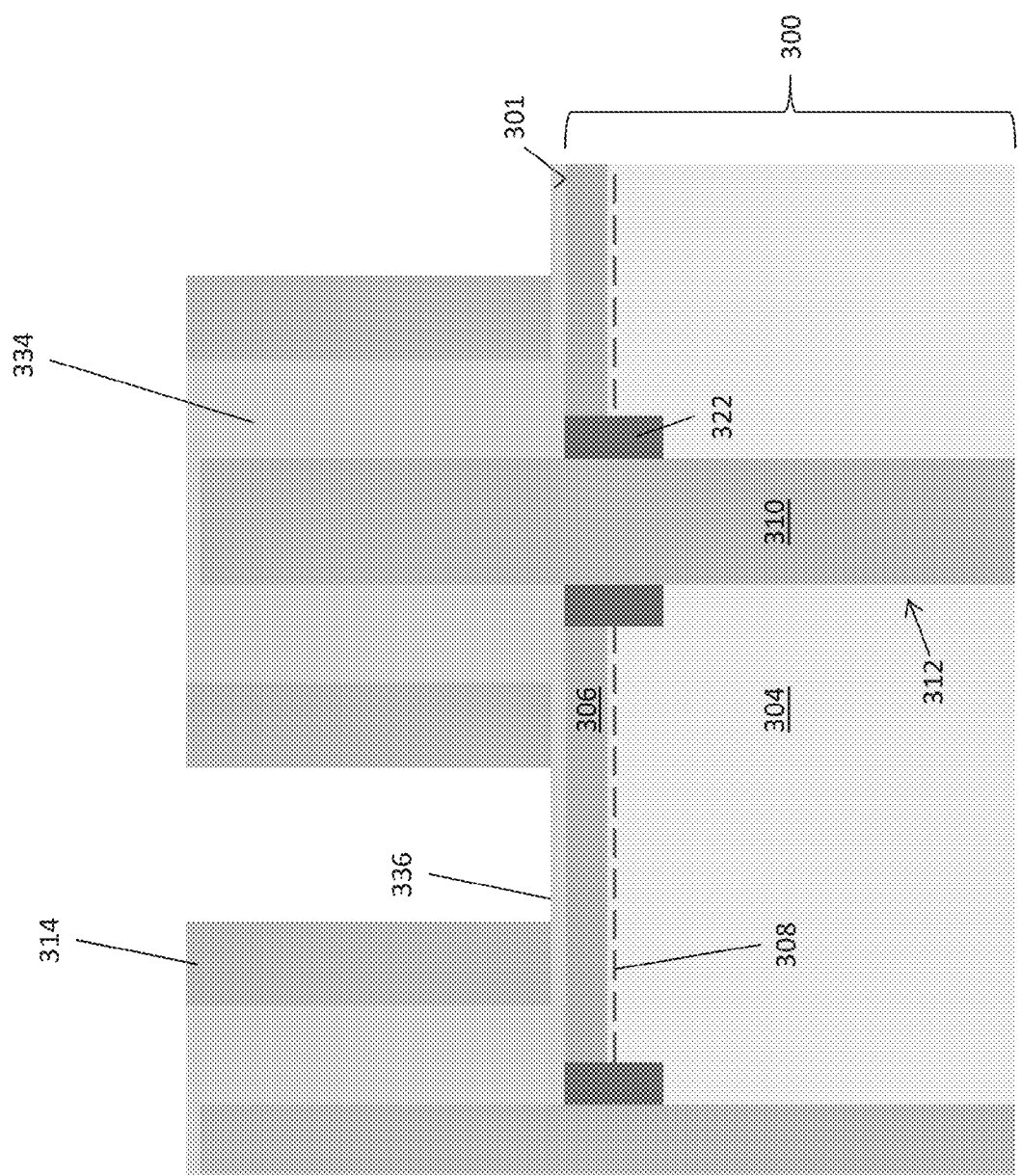
Figure 7S:
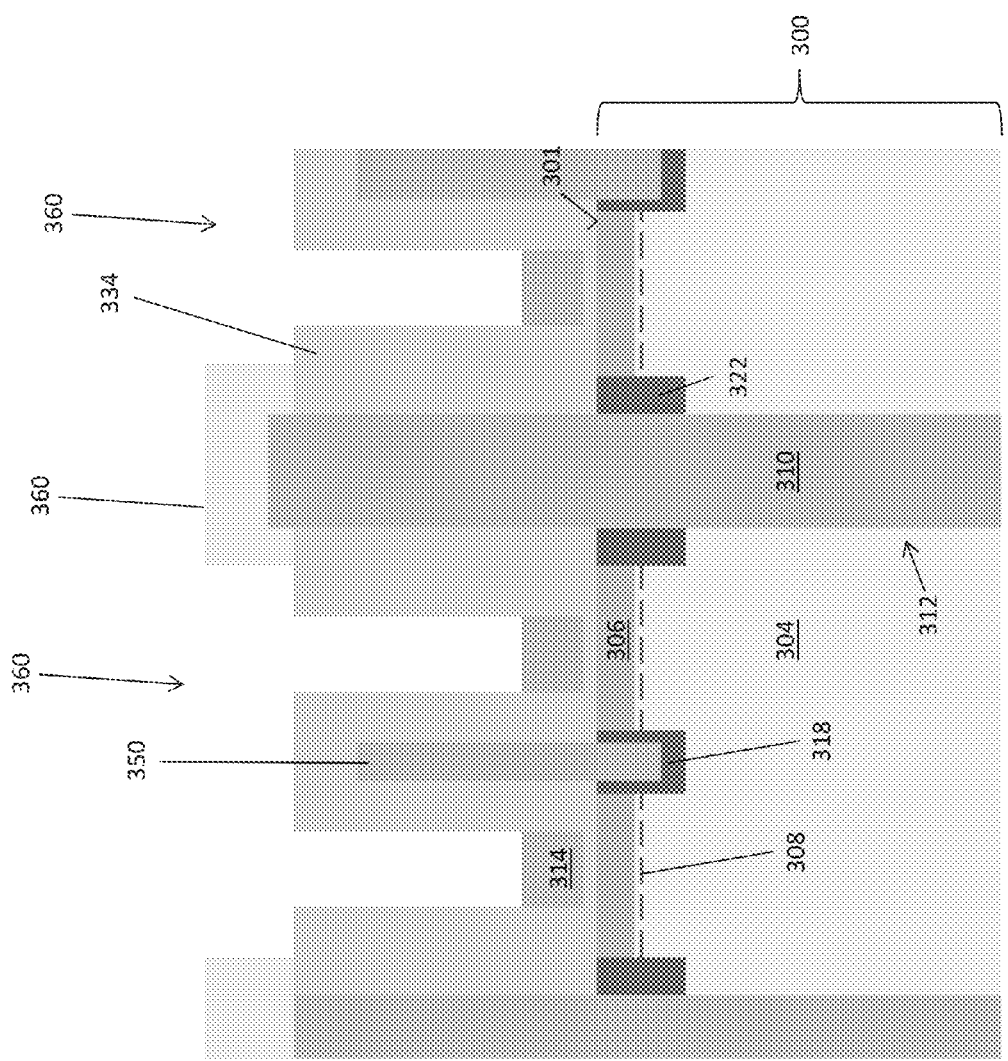
Figure 7U:
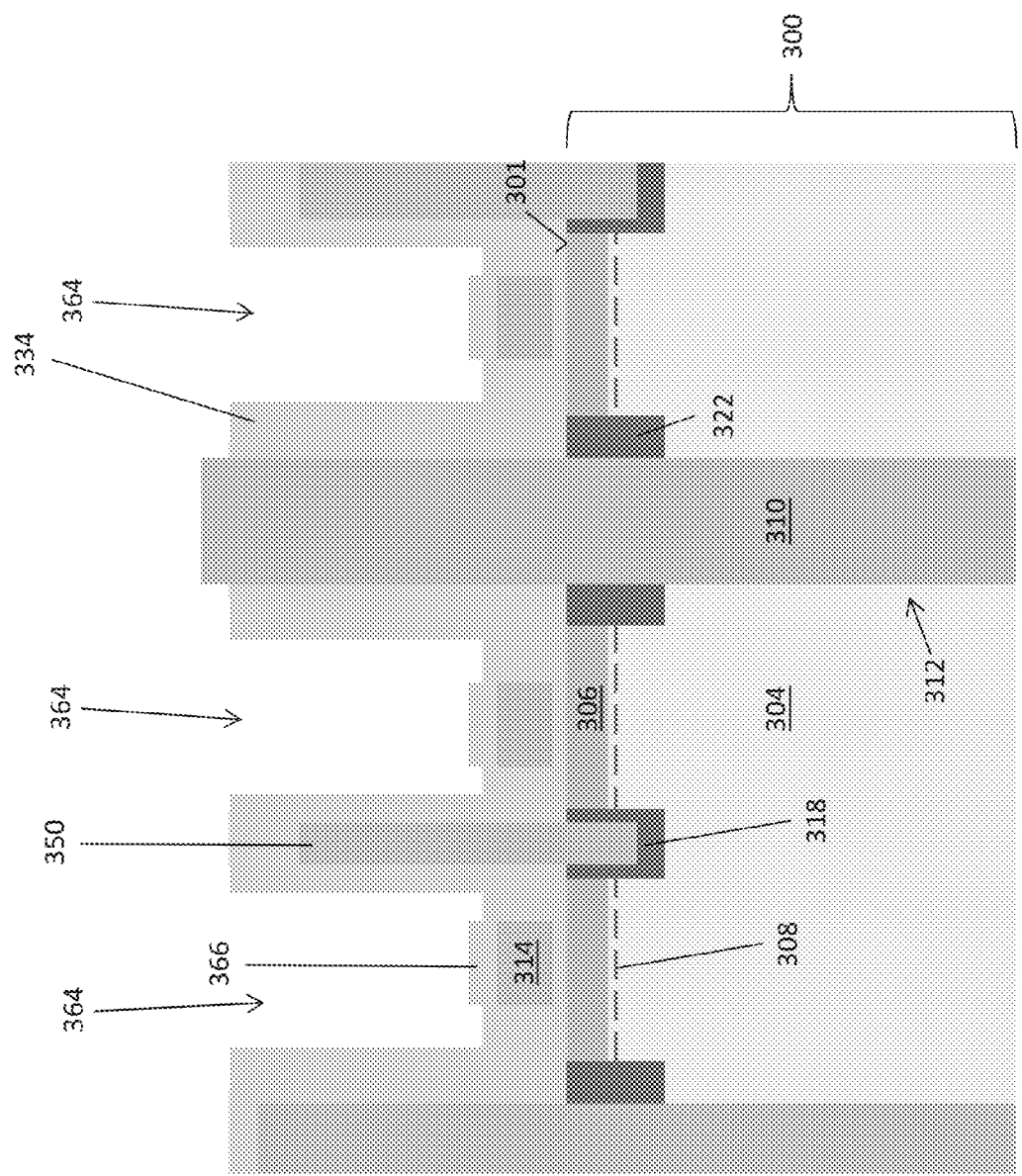
Figure 7V:
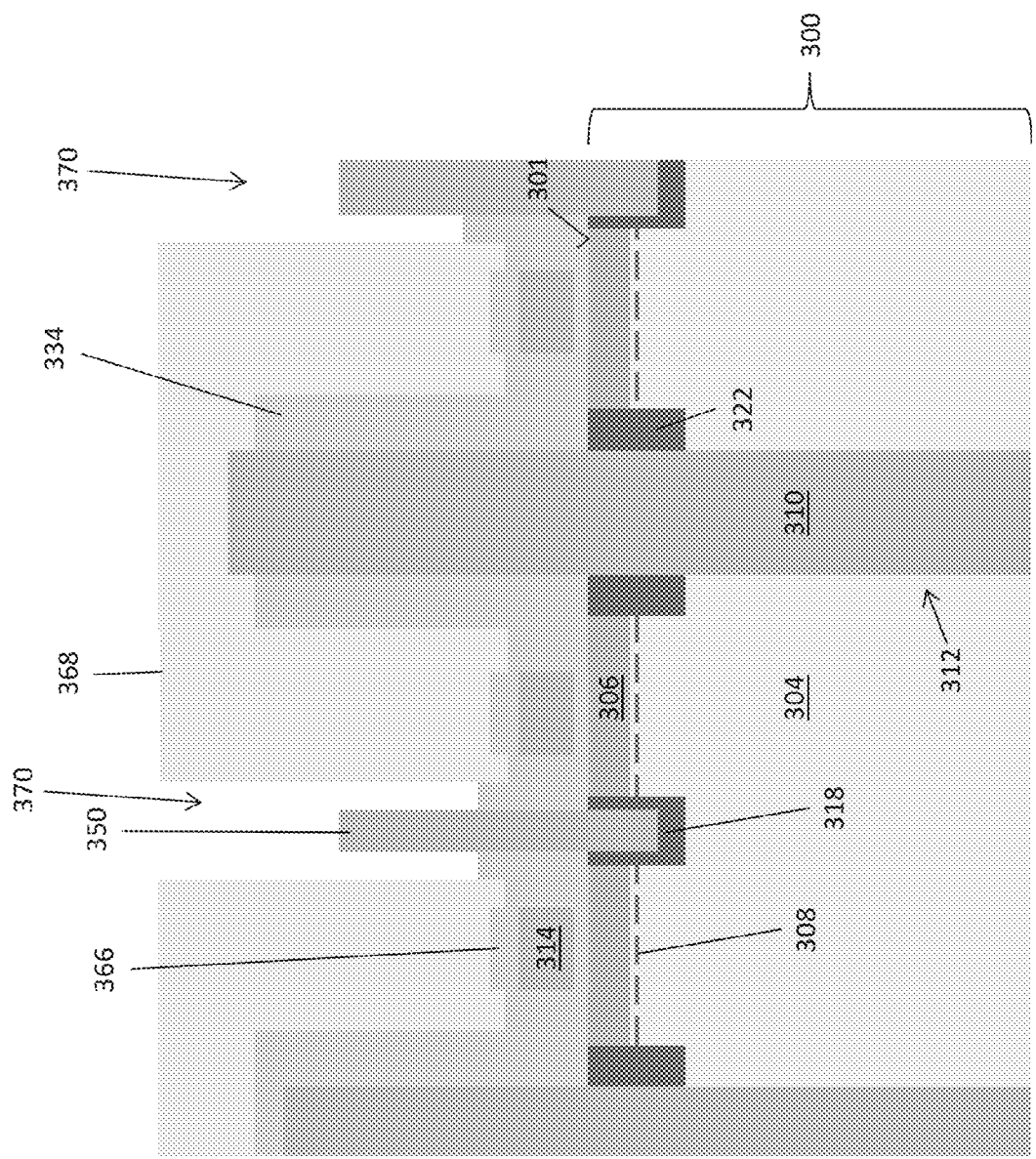

FIGS. 7A through 7V illustrate an embodiment of manufacturing the compound semiconductor device of FIG. 6. Standard semiconductor processing such as etching, depositing, implanting, masking, etc. can be used to perform the steps described next.

FIG. 7A shows the structure after formation of the III-nitride material 300, a hardmask (or lithography) 324 with openings 326 is formed on the first main surface 301 of the III-nitride material 300 and a source/drain contact region 322 is implanted into the exposed parts of the III-nitride material 300. In one embodiment, the III-nitride material 300 includes AlGaN 306 on GaN 304 so that the lateral channel region 308 is formed by a 2DEG near the interface between the AlGaN 306 and GaN 304. The contact region 322 can be formed by implanting Si into the unprotected regions of the AlGaN and GaN 306, 304 to form n-doped contact regions 322.

FIG. 7B shows the structure after a dielectric material 328 such as silicon oxide or silicon nitride is homogenously deposited on the structure. The dielectric material 328 lines the top and sidewalls of the hardmask 324 and covers the exposed contact regions 322 of the device.

FIG. 7C shows the structure after the dielectric material 328 is anisotropically etched so that the dielectric material 328 only remains on the sidewalls of the hardmask 324. The dielectric layer remaining on the sidewalls of the hardmask 324 forms first sacrificial spacers 330 which allow for smaller spacing as compared to lithography.

FIG. 7D shows the structure after the III-nitride material 300 is etched in a region unprotected by the hardmask 324 and the first sacrificial spacers 330, to remove at least some of the contact regions 322 unprotected by the first sacrificial spacers 330. A deep etch can be performed by RIE to form a quasi-vertical device in that the deep trenches 312 can be filled with an electrically conductive material 310 so that the source or drain region 318, 320 can be contacted at one side of the device and the other terminal contacted at the opposite side of the device. For lateral devices in which the source and drain 318, 320 are contacted at the same side of the device, the trench 312 can be much shallower and need not extend completely through the contact regions 322. Also instead of etching a contact implant can be performed.

FIGS. 7A through 7D are optional depending on the contact concept. In another embodiment, the contact regions 322 are not etched at all and the electrically conductive material 310 contacts the contact regions 322 at the main surface 301 of the III-nitride material 300. In yet another embodiment, silicon is blanket implanted into the main surface 301 of the III-nitride material 300 to provide a contact region at the main surface and the electrically conductive material 310 contacts the implanted silicon region at the main surface 101.

FIG. 7E shows the structure after the openings 326 in the hardmask 324 and the trenches 312 are filled with an electrically conductive material 310 such as a metal or metal stack. The electrically conductive material 310 extends above the main surface 301 of the III-nitride material 300.

FIG. 7F shows the structure after the hardmask 324 and the first sacrificial spacers 330 are removed e.g. by wet chemical etching to expose the sides 311 of the electrically conductive material 310 above the first main surface 301 of the III-nitride material 300. The electrically conductive material 300 extends high above the first main surface 301 of the III-nitride material 300 and provides a high topology for subsequent sacrificial spacers.

FIG. 7G shows the structure after a dielectric material 332 such as silicon oxide is homogenously deposited on the structure.

FIG. 7H shows the structure after the dielectric material 332 is anisotropically etched to form second sacrificial spacers 334 adjacent the exposed sides 311 of the electrically conductive material 310. Some of the dielectric material 332 can remain on the first main surface of the III-nitride material as a gate dielectric 336 if desired as shown in FIG. 7H. Alternatively, a gate dielectric or other material for manipulating the band structure can be deposited in a subsequent step if needed.

FIG. 7I shows the structure after a gate electrode material 338 is homogenously deposited on the structure. In one embodiment, the gate electrode material 338 comprises highly conductive silicon.

FIG. 7J shows the structure after anisotropic etching of the gate electrode material 338 so that the gate electrode material 338 remains only along the lateral sides of the second sacrificial spacers 334, forming the gate electrodes 314.

FIG. 7K shows the structure after oxidation or dielectric deposition to form a dielectric spacer material 340 along facing sides 342, 344 of the gate electrodes 314.

FIG. 7L shows the structure after etching of the spacer material 340 so that the spacer material 340 remains only along the facing sides 342, 344 of the gate electrodes 314, forming sacrificial gate spacers 346. The sacrificial gate spacers 346 are used as masks to implant the III-nitride material 300 between the gate electrodes 314 to form the source regions 318 of the compound semiconductor device.

In the case of a 2DEG lateral channel region 308, Si can be implanted to form the source regions 318.

FIG. 7M is optional depending on the type of contact structure employed, and shows the structure after further dielectric deposition and spacer etching, to widen the sacrificial gate spacers 346. The wider sacrificial gate spacers 346 narrow the amount of surface area of the source regions 318 that are exposed.

FIG. 7N is optional depending on the type of contact structure employed, and shows the structure after etching of the exposed part of the source regions 318, to create a recess 348 in the source regions 318.

FIG. 7O shows the structure after an electrically conductive material 350 such as silicon is deposited between adjacent sacrificial gate spacers 346 and in the recess 348 of the source regions 318. The electrically conductive material 350 forms the source electrodes.

FIG. 7P shows the structure after homogenous deposition of a dielectric material 352 on the structure. Alternatively, the dielectric material and be formed by inhomogeneous deposition, oxidation, etc.

FIG. 7Q shows the structure after an optional recess of the dielectric material 352. The optional recess can be omitted, depending on how the electrodes of the device are to be contacted. The remaining process steps described next are optional, and used to form a field plate 302 above the gate electrodes 314 of the compound semiconductor device. These steps can be omitted if a field plate is not desired.

FIG. 7R shows the structure after a lithographic mask 360 with openings 362 is formed on the structure.

FIG. 7S shows the structure after the gate electrodes 314 are recessed through the openings 362 in the lithographic mask 360.

FIG. 7T shows the structure after the lithographic mask 360 is removed and the dielectric material 334 on the III-nitride material 300 is etched to form wider openings 364 in the dielectric material 334.

FIG. 7U shows the structure after a thick dielectric material 366 is formed on the gate electrodes 314 e.g. by oxidation to provide suitable isolation from the field plate 302 to be subsequently formed.

FIG. 7V shows the structure after a lithographic mask 368 is formed on the structure and the dielectric material 334 covering the source electrodes 350 is etched away through openings 370 in the lithographic mask 368 to expose the source electrodes 350.

The lithographic mask 368 is then removed and the field plate 302 is formed connected to the source electrodes 350 as shown in FIG. 6. The field plate 302 is electrically conductive, and can be formed from silicon. The field plate 302 is disposed above and isolated from the recessed gate electrodes 314 by the dielectric material 366 formed on the recessed gate electrodes 314.

In the method of manufacturing the compound semiconductor device, several etching steps are performed on the uppermost AlGaN layer 306. A protective layer can be provided on the AlGaN layer 306 which is later removed, to protect the AlGaN layer 306 during the etching steps.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context dearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of manufacturing a semiconductor device, the method comprising:
    forming a plurality of trenches extending into a semiconductor material from a first main surface of the semiconductor material to form mesas of semiconductor material between the trenches;
    disposing a trench fill material in the trenches, the trench fill material extending above the first main surface of the semiconductor material;
    forming sacrificial spacers on the semiconductor material adjacent opposing sides of the trench fill material;
    forming gate electrodes on the first main surface of the semiconductor material adjacent the sacrificial spacers, the gate electrodes having the same alignment with respect to the trenches, the gate electrodes defining lateral channel regions in the mesas under the gate electrodes;
    removing the sacrificial spacers after formation of the gate electrodes;
    forming source regions in a region of the mesas; and
    forming a drain region spaced apart from the source regions.

2. The method of claim 1, wherein disposing the trench fill material in the trenches comprises:
    filling the trenches with an electrically conductive material; and
    recessing the mesas so that the electrically conductive material in the trenches extends above the first main surface of the semiconductor material.

3. The method of claim 1, wherein forming the sacrificial spacers comprises:
    forming a material on the semiconductor material; and
    anisotropically etching the material to expose the mesas, wherein at least part of the material remaining after anisotropic etching forms the sacrificial spacers.

4. The method of claim 1, wherein the semiconductor material comprises silicon, the method further comprising:
    forming a body region in each of the mesas with the channel region disposed in the body region;
    forming a gate oxide on the body regions for isolating the gate electrodes from the body regions; and
    forming a source electrode which extends into each of the mesas in contact with the body region and the source region.

5. The method of claim 4, wherein the source regions are formed adjacent the trenches, the source electrodes extend between each field electrode and an adjacent one of the gate electrodes into the mesas, and wherein the body region is separated by a section of the semiconductor material between adjacent ones of the gate electrodes disposed on the same mesa, the method further comprising:
    forming a doped region of the same conductivity type as the source region in the section of the semiconductor material that separates the adjacent gate electrodes disposed on the same mesa.

6. The method of claim 4, wherein the source regions are spaced apart from the trenches, the source electrodes extend between adjacent ones of the gate electrodes into the mesas, and wherein the body region is continuous between the adjacent gate electrodes on the same mesa, the method further comprising:
    forming a doped region of the same conductivity type as the source region adjacent the trenches in each of the mesas and spaced apart from the source region by the body region in the same mesa.

7. The method of claim 4, wherein forming the source electrodes comprises:
    forming a dielectric material on the semiconductor material after formation of the gate electrodes;
    forming a mask with openings on the dielectric material;
    etching through the dielectric material and into the mesas through the openings in the mask; and
    depositing a source electrode material after removal of the mask, the source electrode material filling openings in the dielectric material and contacting the body regions and the source regions.

8. The method of claim 7, further comprising:
    forming a further dielectric material on the gate electrodes before deposition of the source electrode material.

9. The method of claim 1, wherein forming the gate electrodes comprises:
    forming an electrically conductive material on the semiconductor material after formation of the sacrificial spacers; and
    anisotropically etching the electrically conductive material to form the gate electrodes, wherein a width of the gate electrodes as measured in a direction along the lateral channel regions corresponds to a maximum thickness of the electrically conductive material prior to etching.

10. The method of claim 1, wherein the semiconductor material comprises silicon, the method further comprising:
    implanting dopants of a first conductivity type through an opening in a mask into the mesas prior to formation of the gate electrodes to form spaced apart implanted body regions; and
    implanting dopants of a second conductivity type opposite the first type into the mesas between the gate electrodes and the trenches to form implanted source regions disposed adjacent the trenches and between the spaced apart implanted body regions.

11. The method of claim 1, wherein the semiconductor material comprises III-nitride material and the channel region is formed by a two-dimensional charge carrier gas, and wherein forming the sacrificial spacers comprises:
    forming a hardmask with openings on the III-nitride material;
    forming contact regions in the III-nitride material through the openings in the hardmask;
    forming a dielectric material along sidewalls of the openings in the hardmask;
    etching the III-nitride material in a region unprotected by the hardmask and the dielectric material along the sidewalls of the openings in the hardmask, to remove at least some of the contact regions unprotected by the dielectric material;
    filling the openings in the hardmask and the etched part of the III-nitride material with an electrically conductive material so that the electrically conductive material extends above the main surface of the III-nitride material;

removing the hardmask and the dielectric material along the sidewalls of the openings in the hardmask to expose sides of the electrically conductive material above the main surface of the III-nitride material; and forming the sacrificial spacers adjacent the exposed sides of the electrically conductive material.

12. The method of claim 1, wherein the semiconductor material comprises III-nitride material and the channel region is formed by a two-dimensional charge carrier gas, and wherein forming the sacrificial spacers comprises:

forming electrodes in contact with the III-nitride material, the electrodes extending above the main surface of the III-nitride material; and forming the sacrificial spacers adjacent exposed sides of the electrodes.

13. The method of claim 12, wherein forming the gate electrodes comprises:

depositing a gate electrode material on the III-nitride material and the sacrificial spacers; and anisotropically etching the gate electrode material so that the gate electrode material remains only along lateral sides of the sacrificial spacers.

14. The method of claim 12, further comprising:

recessing the gate electrodes;

forming a dielectric material on the recessed gate electrodes; and forming a field plate above and isolated from the recessed gate electrodes of each mesa by the dielectric material formed on the recessed gate electrodes.

* * * * *

UNITED STATES PATENT AND TRADEMARK OFFICE
CERTIFICATE OF CORRECTION

PATENT NO.        : 9,525,044 B2                                    Page 1 of 1
APPLICATION NO.   : 15/131795
DATED             : December 20, 2016
INVENTOR(S)       : Vielemeyer It is certified that error appears in the above-identified patent and that said Letters Patent is hereby corrected as shown below:

On the Title Page

Item [73], change "Austin" to -- Austria --

Signed and Sealed this
Seventh Day of March, 2017

Michelle K. Lee
*Director of the United States Patent and Trademark Office*